United States Patent
Park et al.

(10) Patent No.: US 7,133,324 B2
(45) Date of Patent: Nov. 7, 2006

(54) SYNCHRONOUS DYNAMIC RANDOM ACCESS MEMORY DEVICES HAVING DUAL DATA RATE 1 (DDR1) AND DDR2 MODES OF OPERATION AND METHODS OF OPERATING SAME

(75) Inventors: Youn-Sik Park, Gyeonggi-do (KR); Sang-Joon Hwang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 125 days.

(21) Appl. No.: 11/021,889

(22) Filed: Dec. 23, 2004

(65) Prior Publication Data

US 2005/0152210 A1    Jul. 14, 2005

(30) Foreign Application Priority Data

Dec. 24, 2003  (KR) .................. 10-2003-0096402
Aug. 23, 2004  (KR) .................. 10-2004-0066531

(51) Int. Cl.
*G11C 8/00* (2006.01)

(52) U.S. Cl. ............ 365/233; 365/230.08; 365/230.06; 365/185.13; 365/185.05; 365/189.02; 342/103; 375/215; 331/60

(58) Field of Classification Search ............... 365/233, 365/230.08, 230.06, 185.13, 189.05, 189.02; 342/103; 375/215; 331/60
See application file for complete search history.

(56) References Cited

U.S. PATENT DOCUMENTS

| | | | |
|---|---|---|---|
| 5,841,396 A | 11/1998 | Krasner | |
| 6,041,222 A | 3/2000 | Camp et al. | |
| 6,094,375 A * | 7/2000 | Lee | 365/189.04 |
| 6,118,835 A * | 9/2000 | Barakat et al. | 375/372 |
| 6,134,180 A * | 10/2000 | Kim et al. | 365/233 |
| 6,154,419 A * | 11/2000 | Shakkarwar | 365/235 |
| 6,233,199 B1 * | 5/2001 | Ryan | 365/233 |
| 6,327,214 B1 | 12/2001 | Yoon et al. | |
| 6,392,946 B1 | 5/2002 | Wu et al. | |
| 6,621,496 B1 | 9/2003 | Ryan | |
| 6,795,360 B1 * | 9/2004 | Duh et al. | 365/221 |
| 2002/0154565 A1 | 10/2002 | Noh et al. | |
| 2003/0070052 A1 | 4/2003 | Lai | |
| 2004/0013025 A1 | 1/2004 | Hong et al. | |
| 2005/0117433 A1 * | 6/2005 | Fujisawa | 365/226 |
| 2005/0270891 A1 * | 12/2005 | Flach et al. | 365/233 |

FOREIGN PATENT DOCUMENTS

| | | |
|---|---|---|
| KR | 10-2002-0058931 | 7/2002 |
| WO | WO 99/57929 | 11/1999 |
| WO | WO 02/09310 A2 | 1/2002 |

OTHER PUBLICATIONS

International search Report for Application No. PCT/US2001/21653 mailed on Jan. 30, 2002.
Ryan, Kevin "DDR SDRAM Functionality and Controller Read Data Capture" *Design Line* 8(3): 1-24 (1999).

* cited by examiner

*Primary Examiner*—Richard Elms
*Assistant Examiner*—Eric J. Wendler
(74) *Attorney, Agent, or Firm*—Myers Bigel Sibley & Sajovec

(57) ABSTRACT

A dual data rate dynamic random access memory (DDR DRAM) device may operate in dual DDR modes via a mode selection circuit configured to enable a Dual Data Rate (DDR) 1 mode of operation for the DDR DRAM or a DDR2 mode of operation for the DDR DRAM.

15 Claims, 28 Drawing Sheets

FIG. 9A

|        | CA0=0 | CA0=1 |
|--------|-------|-------|
| DID_0  | F0    | S0    |
| DID_1  | S0    | F0    |

FIG. 9B

|        | CA1/0=00 | 01 | 10 | 11 |
|--------|----------|----|----|----|
| DID_0  | F0       | S0 | F1 | S1 |
| DID_1  | S0       | F1 | S1 | F0 |
| DID_2  | F1       | S1 | F0 | S0 |
| DID_3  | S1       | F0 | S0 | F1 |

FIG. 11A
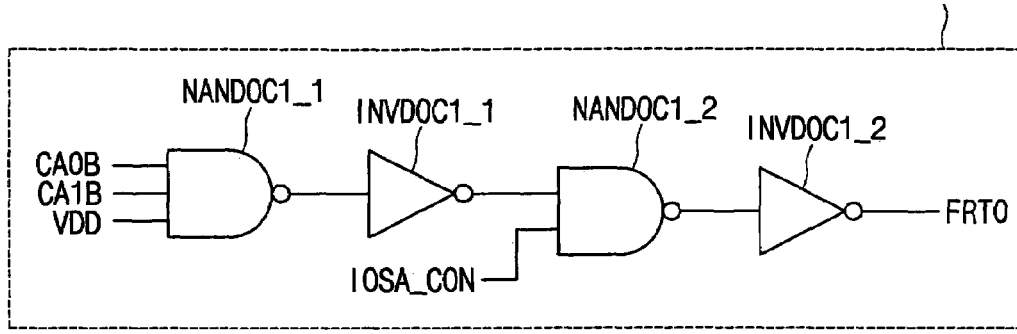
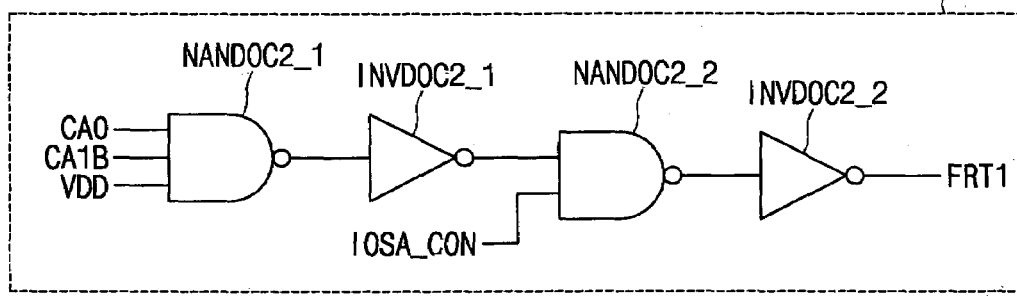
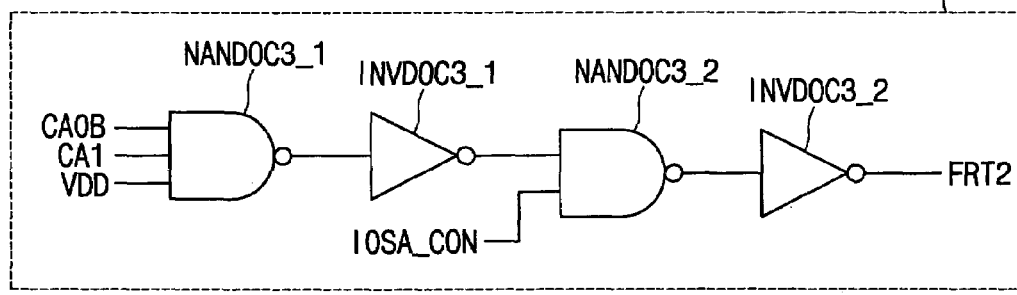
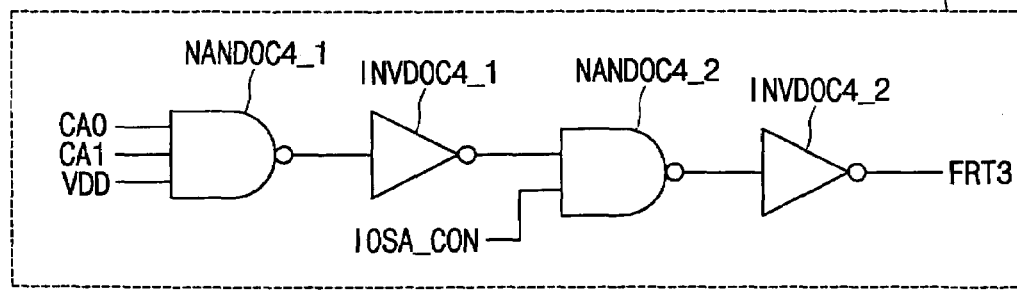

FIG. 11B
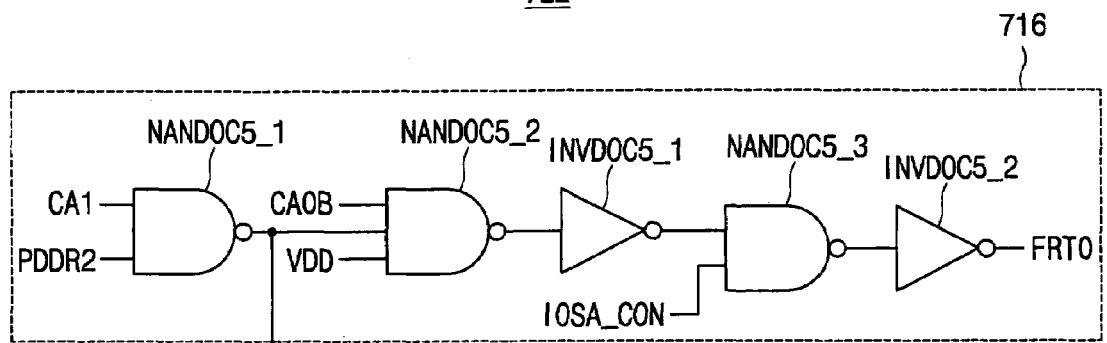
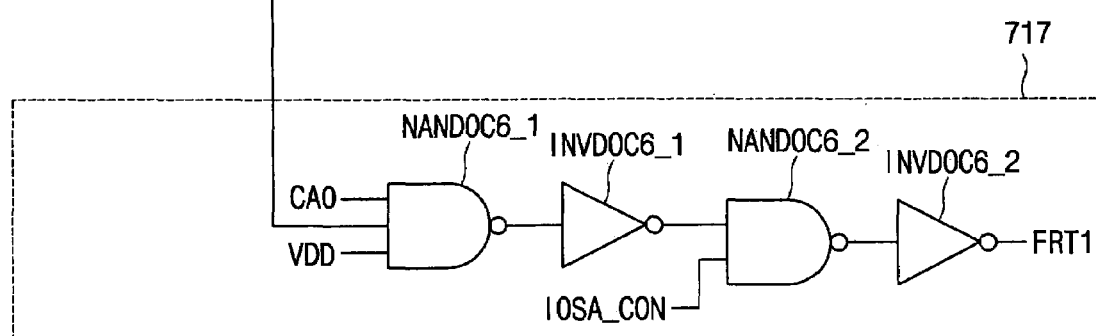
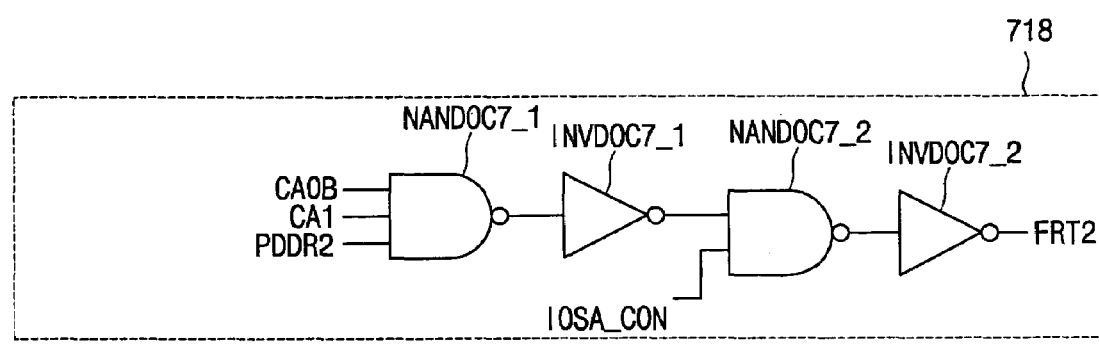
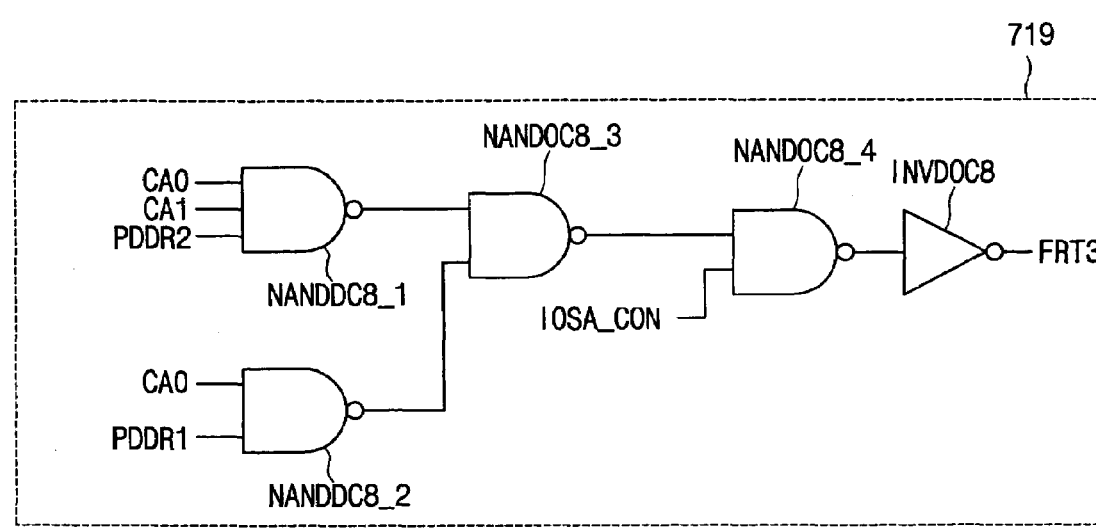

SYNCHRONOUS DYNAMIC RANDOM ACCESS MEMORY DEVICES HAVING DUAL DATA RATE 1 (DDR1) AND DDR2 MODES OF OPERATION AND METHODS OF OPERATING SAME

CROSS-REFERENCE TO RELATED APPLICATION

This application claims priority to Korean Patent Applications No. 2003-96402 filed on Dec. 24, 2003 and No. 2004-66531 filed on Aug. 23, 2004 in the Korean intellectual property Office (KIPO), the entire contents of which are hereby incorporated by reference.

FIELD OF THE INVENTION

The present invention relates to synchronous DRAM (hereinafter, referred to SDRAM) semiconductor devices and methods of operating the same.

BACKGROUND

As the data processing speed of systems has increased, DRAM semiconductor devices may become a "bottleneck" for data flow in the system. Accordingly, DRAM latency may be an importance factor in the data processing speed of the system. An asynchronous DRAM semiconductor device includes a delay time for synchronizing signals with a system clock. Signals of a SDRAM semiconductor device are synchronized with a system bus clock.

The SDRAM semiconductor device represents a DRAM semiconductor device that follows the SDRAM standard decided by JEDEC (Joint Electron Device Engineering Council). The following represents some features of the SDRAM semiconductor device:
1) input circuit/output circuit synchronized with an external clock signal
2) burst access
3) structure of a multi-bank
4) memory access based on commands
5) data path using pipeline method, etc.

Timing parameters of the SDRAM semiconductor device have values corresponding to integer number of clock signals so as to implement the input circuit/output circuit that are synchronized with the external clock. In addition, when a control signal is inputted to the SDRAM semiconductor device, the control signal is maintained and is not changed if an internal register is not updated since the control signal is stored in the internal register. A clock signal and another control signal are changed to change the inputted control signal. An operation status of the SDRAM semiconductor device may be determined by combination of at least one control signal. A command decoder of the SDRAM semiconductor device decodes the at least one control signal so that the SDRAM semiconductor device starts various operations based on the decoding result.

The control signal is referred to as a command since the change of the inputted control signal and the start of the operation of the SDRAM semiconductor device is similar to programming operation. A burst access represents that input or output of data in a memory device is synchronized with a clock signal so that data are successively inputted to or outputted from the memory device. When an activation command and a row address is applied to the memory device at the moment of a rising edge of the clock signal, the memory device has an activated state and a corresponding word line is selected by the row address. When a read command and a column address are inputted to the memory device in response to subsequent clock signal, the burst access begins. In other words, the inputted column address increases by one after subsequent clock signals, and data are successively outputted from the memory device.

A bank represents a memory cell group that may independently operate so as to support high speed operation through interleaving in a memory module. The memory cells in a bank share a data bus, address line and a control signal line, etc., and may independently operate from other banks. Thus, when a read operation is performed in a bank, a refresh operation or a word line selection by the row address may be performed in other bank.

In a pipeline method, flip-flop or latch divides a data path so that a plurality of circuit blocks may operate simultaneously. In other words, at least one flip-flop or at least one latch is disposed on the data path, so that the data path is divided into a plurality of data path respectively including at least one circuit block. Thus, while data read from a circuit block are latched and are outputted to an external source, a new address may be inputted to the memory device via another data path or a pre-charge operation may be performed via another data path.

In a Dual Data Rate (DDR) SDRAM, data or command are synchronized with a rising edge of a clock signal and a falling edge of the clock signal. Thus, double data rate operation of about 200 MHz may be obtained using a 100 MHz clock signal. A duty cycle of the clock signal has 50% so as to obtain the double data rate. DDR SDRAMs may operate in DDR1 mode or DDR2 mode. In a DDR1 SDRAM, 2 bits are pre-fetched during data input/output operation so that a burst length of data is 2. In the DDR2 SDRAM, 4 bits are pre-fetched during data input/output operation so that the burst length of data is 4. Two consecutive data synchronized with a clock signal are successively transferred via an input (or output) terminal when the burst length of data is 2. Four consecutive data synchronized with a clock signal are successively transferred via an input (or output) terminal when the burst length of data is 4.

The operation of a DDR1 compliant SDRAM may not be compatible with the operation of a DDR2 compliant SDRAM since the DDR1 SDRAM is manufactured to have circuit structures different from that of DDR2 SDRAM. Therefore, it may be difficult to implement a system using DDR1 and DDR2 compliant SDRAMs.

SUMMARY

Embodiments according to the invention can provide dual data rate dynamic random access memory (DDR DRAM) devices that may operate in dual DDR modes via a mode selection circuit configured to enable a Dual Data Rate (DDR) 1 mode of operation for the DDR DRAM or a DDR2 mode of operation for the DDR DRAM.

Embodiments according to the invention can further provide a method of operating the dual data rate DRAM device.

In some exemplary embodiments, a synchronous dynamic random access memory device for both DDR1 and DDR2 mode operations includes a mode selection circuit configured to generate a first mode selection signal that activates a DDR1 mode operation and a second mode selection signal that activates a DDR2 mode operation; a row decoder configure to decode a row address; a column decoder configured to select two global data lines for one unit data input/output in response to the first mode selection signal, and configured to select four global data lines for said one unit data input/output in response to the second mode selection signal; a core section configured to receive data from the two global data lines and output the data to the two global data lines in response to the first mode selection signal, and configured to receive the data from the four global data lines and output the data to the four global data lines in response to the second mode selection signal; and an input and output control circuit configured to prefetch two bits data in response to the first mode selection signal to provide the two bits data to the core section, configure to output the two bits data received from the core section in response to the first mode selection signal, configured to prefetch four bits data in response to the second mode selection signal to provide the four bits data to the core section, and configured to output the four bits data received from the core section in response to the second mode selection signal.

In another exemplary embodiments, a column address latch includes an address sampling circuit configured to sample an input column address synchronized with an internal clock based on an internal write command or an internal read command; an address transfer circuit configured to transfer the sampled input column address; and a mode selection circuit configured to determine a transfer path based on the first and second mode selection signals.

In still another exemplary embodiments a column decoder includes: a first column decoding block configured to decode n column addresses to activate at least one first column selection line of at least $2^n$ first column selection lines, the at least one first column selection line corresponding to the column address decoded by the first column decoding block; a second column decoding block configured to decode the n column addresses to activate at least one second column selection line of at least $2^n$ second column selection lines, the at least one second column selection line corresponding to the column address decoded by the second column decoding block; a third column decoding block configured to decode the n column addresses to activate at least one third column selection line of at least $2^n$ third column selection lines, the at least one third column selection line corresponding to the column address decoded by the third column decoding block; and a fourth column decoding block configured to decode the n column addresses to activate at least one fourth column selection line of at least $2^n$ fourth column selection lines, the at least one fourth column selection line corresponding to the column address decoded by the fourth column decoding block.

In still further exemplary embodiments, a core section includes: a plurality of memory cell arrays having a first memory cell array, a second memory cell array, a third memory cell array and a fourth memory cell array; a plurality of local data lines having a first local data line, a second local data line, a third local data line, and a fourth local data line, the first local data line being connected to or disconnected from the first memory cell array in response to a signal of a column selection line, the signal is related to a mode selection signal that represents a DDR1 mode operation or a DDR2 mode operation, the second local data line being connected to or disconnected from the second memory cell array in response to the signal, the third local data line being connected to or disconnected from the third memory cell array in response to the signal, the fourth local data line being connected to or disconnected from the fourth memory cell array in response to the signal; and a plurality of global data lines having a first global data line corresponding to the first local data line, a second global data line corresponding to the second local data line, a third global data line corresponding to the third local data line, and a fourth global data line corresponding to the fourth local data line.

In still further exemplary embodiments, an input latch includes: a first prefetch circuit configured to prefetch at least one input data in response to an internal clock; a second prefetch circuit configured to selectively prefetch an output of the first prefetch circuit in response to the mode selection signal; and a prefetch control signal generator configured to control the second prefetch circuit in response to the mode selection signal.

In still further exemplary embodiments, an input ordering circuit includes: an ordering input generating circuit configured to select output data outputted from an input latch in response to the mode selection signal; a control signal generating circuit configured to generate a control signal based on at least one column address and the mode selection signal; and a data selecting circuit configured to select ordering input data generated from the ordering input generating circuit in response to the control signal to output the selected ordering input data.

In still further exemplary embodiments, an output ordering circuit includes: an output control signal generator configured to activate at least one of first, second, third and fourth control lines (FRT0, FRT1, FRT2 and FRT3) based on a mode selection signal and a least significant column address (CA0) and a most significant column address (CA1), the mode selection signal representing a DDR1 mode operation or a DDR2 mode operation; a data sense amplifier configured to amplify data of a global data line; and an output ordering control circuit configured to selectively output an output of the data sense amplifier to at least one of four output lines based on a control signal of the activated control line.

In still further exemplary embodiments, an output data latch/mux includes: an output data control signal generator configured to control a sampling of data outputted from an output ordering circuit in response to a mode selection signal or an internal clock, the mode selection signal representing a DDR1 mode operation or a DDR2 mode operation; an output line selecting circuit configured to select one of output data lines based on a control signal that activates the output data latch/mux; and a data transfer circuit configured to control a transmission of the data outputted from the output ordering circuit based on an output of the output data control signal generator.

In still further exemplary embodiments, an ODT (On Die Termination) circuit includes: a pad coupled to data pin, an address pin or a command pin; at least one pull-up transistor, coupled between the pad and a first power voltage, configured to be turned on in response to a mode selection signal that represents a DDR1 mode operation or a DDR2 mode operation; and at least one pull-down transistor, coupled between the pad and a second power voltage, configured to be turned on in response to the mode selection signal.

In still further exemplary embodiments, a dual data rate dynamic random access memory (DDR DRAM) device includes a mode selection circuit configured to enable a Dual Data Rate (DDR) 1 mode of operation for the DDR DRAM or a DDR2 mode of operation for the DDR DRAM.

The device may further include a column decoder configured to select two global data lines in the DDR1 mode responsive to a column address applied thereto and configured to select four global data lines in the DDR2 mode responsive to the column address applied thereto.

The device may further include a core section configured to send/receive data to/from the two selected global data lines in DDR1 mode and configured to send/receive data to/from the four selected global data lines in DDR2 mode.

The column decoder may be configured to disregard one column address bit to enable two column select signals therefrom in DDR1 mode and may be configured to disregard two column address bits to enable four column select signals therefrom in DDR2 mode.

The device may further include an input latch configured to prefetch two data bits in DDR1 mode and configured to prefetch four data bits in DDR2 mode.

The input latch may include first and second serially coupled latches, wherein, if the DDR2 mode is active, the input latch receives first, second, third and fourth data, the third and fourth data are latched by the first latch to be provided to an output of the input latch and the first and second data are latched by first and second latch to be provided to the output of the input latch, and wherein, if the DDR1 mode is active, the input latch receives fifth and sixth data, the fifth and sixth data are latched by the first latch to be provided to the output of the input latch.

The input latch may be configured to provide the prefetched two bits to the output of the latch on the same clock edge in DDR1 mode and configured to provide the prefetched four bits to the output of the latch on the same clock edge in DDR2 mode.

The device may further include an input ordering circuit configured to order prefetched two or four bits on outputs of the input ordering circuit based on values of the column address and the DDR1 and DDR2 mode.

The input ordering circuit may be configured to reverse the order of the prefetched two bits in DDR1 mode based on the column address; and wherein the input ordering circuit may be configured to reverse the order of the prefetched four bits in DDR2 mode based on the column address.

The device may further include a connector circuit configured to couple ordered data provided from the input ordering circuit to global data I/O lines based on the DDR mode.

The device may further include an output ordering circuit configured to order prefetched two or four bits output from the core section based on values of the column address and the DDR1 and DDR2 mode.

The output ordering circuit may be configured to reverse the order of the prefetched two bits in DDR1 mode based on the column address; and wherein the input ordering circuit may be configured to reverse the order of the prefetched four bits in DDR2 mode based on the column address.

The DDR1 mode or the DDR2 mode may be selected via metal wiring, an MRS mode bit, and/or a fuse.

In still further exemplary embodiments, a method of operating a dual mode DDR DRAM device includes: operating in a DDR1 mode responsive to a first mode selection signal; and operating in a DDR2 mode of operation responsive to a second mode selection signal.

BRIEF DESCRIPTION OF THE DRAWINGS

FIGS. 9A and 9B are tables illustrating operation of the input ordering circuit of FIG. 8 according to some embodiments of the present invention;

FIGS. 11A, 11B and 11C are circuit diagrams showing an output ordering circuit of FIG. 1 according to some embodiments of the present invention;

DESCRIPTION OF EMBODIMENTS ACCORDING TO THE INVENTION

The invention will now be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, when an element is referred to as being "coupled" to another element, it can be directly coupled to the other element or intervening elements may be present. In contrast, when an element is referred to as being "directly coupled" to another element, there are no intervening elements present. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense expressly so defined herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein the term "and/or" includes any and all combinations of one or more of the associated listed items.

Figure 1:
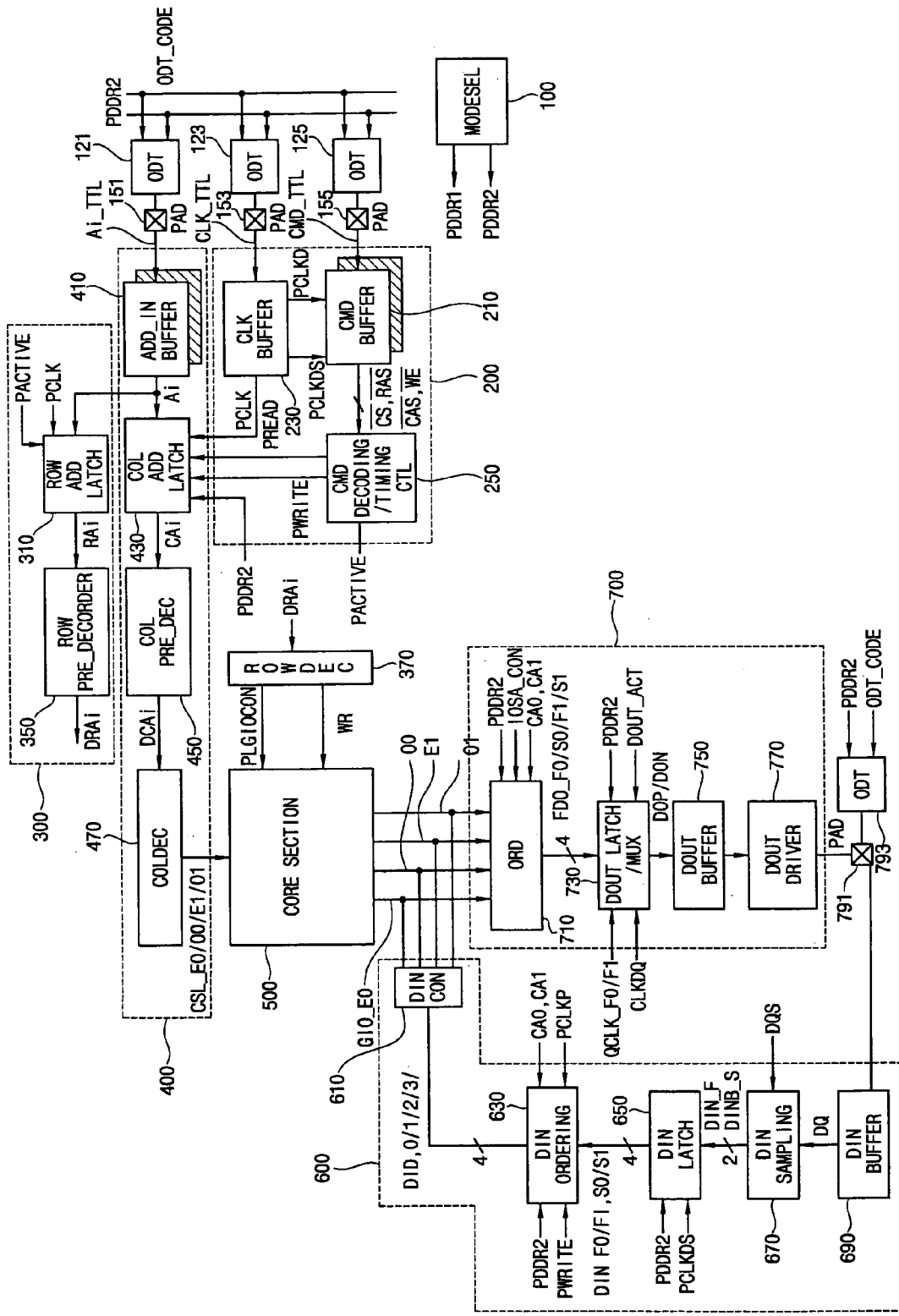
FIG. 1 is a block diagram showing a synchronous DRAM for performing both DDR1 mode and DDR2 mode operations according to some embodiments of the present invention.

FIG. 1 is a block diagram showing a synchronous DRAM for performing both DDR1 mode and DDR2 mode operations according to an exemplary embodiment of the present invention. Referring to FIG. 1, the SDRAM includes a mode selection circuit 100, a command/timing control circuit 200, a row decoder 300, a column decoder 400, a core section 500, and an input and output control circuit 800. The input and output control circuit 800 includes an input control circuit 600 and an output control circuit 700.

The mode selection circuit 100 generates mode selection signals PDDR1 and PDDR2 that activate the DDR1 mode operation or the DDR2 mode operation.

The command/timing control circuit 200 includes a clock buffer 230, a command buffer 210, and a command decoding/timing control circuit 250.

The clock buffer 230 receives an external clock signal CLK_TTL having a TTL level via a clock pad 153 to output internal clock signals having CMOS level such as PCLK, PCLKD and PCLKDS. The clock pad 153 is coupled to an ODT (On Die termination) circuit 123 so that distortion of the external clock signal CLK_TTL may be reduced and transmission efficiency may be increased when the external clock signal CLK_TTL is inputted to the clock buffer 230 via the clock pad 153.

The command buffer 210 receives a command signal CMD_TTL having a TTL level via a command input pad 155 to output /CS (Chip Select) signal, /RAS (Row Address Strobe) signal, /CAS (Column Address Strobe) signal and /WE (Write Enable) signal having a CMOS level. The /CS (Chip Select) signal, /RAS (Row Address Strobe) signal, /CAS (Column Address Strobe) signal and /WE (Write Enable) signal are synchronized with the PCLKD and PCLKDS signals and are inputted to the command decoding/timing control circuit 250.

The command decoding/timing control circuit 250 decodes input signals to generate PREAD signal for controlling read operation, a PWRITE signal for controlling write operation, or a PACTIVE signal for activating the row address latch.

The command input pad 155 is coupled to an ODT circuit 125 so that distortion of the command signal CMD_TTL having the TTL level may be reduced and transmission efficiency may be increased when the command signal CMD_TTL is inputted to the command buffer 210 via the command input pad 155.

The row decoder 300 includes a row address latch 310, a row predecoder 350 and a row decoding circuit 370.

The row address latch 310 receives input address Ai, the internal clock PLCK and the PACTIVE signal to output a row address RAi. The row address latch 310 recognizes the input address Ai as the row address RAi when the PACTIVE signal is detected at a rising edge or a falling edge of the PCLK signal. Each of input address pins is coupled to corresponding row address latch 310, so that a plurality of row address latches is used for a plurality of input address pins. When a plurality of row addresses RAi are outputted from the plurality of row address latches, the plurality of row addresses RAi are divided into pairs of row addresses and the row predecoder 350 predecodes the pairs of row addresses.

The row decoding circuit 370 decodes data output from an output line DRAi of the row predecoder 350 and selects word line of memory cell array based on the decoded data.

The column decoder 400 includes an input address buffer 410, a column address latch 430, a column predecoder 450 and a column decoder 470.

The input address buffer 410 receives an address signal AI_TTL having a TTL level via an address pad 151 to output an address signal Ai having a CMOS level to the row address latch 310 and column address latch 430. The address pad 151 is coupled to an ODT (On Die termination) circuit 121 so that distortion of the address signal Ai_TTL may be reduced and transmission efficiency may be increased when the address signal Ai_TTL is inputted to the input address buffer 410 via the address pad 151.

The column address latch 430 receives the address signal Ai, internal clock PCLK and a mode selection signal PDDR1 or PDDR2. In addition, the column address latch 430 receives a write command PWRITE or a read command PREAD generated from the command decoding/timing control circuit 250.

The column address latch 430 recognizes the input address Ai as the column address CAi when the PWRITE signal or PREAD signal is detected at a rising edge or a falling edge of the internal clock signal PCLK. The column address latch 430 samples the output signal of the input address buffer 410 at a rising edge or a falling edge of the internal clock signal PCLK to output the sampled output signal without internal latency during the read operation. The column address latch 430 varies the internal latency depending upon the mode selection signals during the write operation.

Each of input address pins is coupled to corresponding column address latch 430, so that a plurality of column address latches is used for a plurality of input address pins. When a plurality of column addresses CAi are outputted from the plurality of column address latches, the plurality of column addresses CAi are divided into pairs of column addresses and the column predecoder 450 predecodes the pairs of column addresses.

The column decoder 470 is coupled to an output line DCAi of the column predecoder 450 and decodes the column address CAi. For example, the column decoder 470 includes four decoding blocks, and each of the decoding blocks may include two sub-decoding blocks. Output lines of each of the decoding blocks are coupled to a plurality of column selection lines CSL. The column selection lines are divided into CSL_E0, CSL_O0, CSL_E1 and CSL_O1 respectively corresponding to each of the four decoding blocks. The column decoder 470 disregards the column address output of one or two DCA lines during decoding.

When the mode selection signal requests the DDR1 mode operation, one column address is disregarded, and four decoding blocks comprised of two groups performs decoding. Thus, the column decoder 470 activates two column selection lines.

When the mode selection signal requests the DDR2 mode operation, two predecoded column address are disregarded, four decoding blocks decode input column address, and activate four column selection lines.

Data are transferred between the memory cell array of the core section 500 and local data lines via the activated column selection line. Since above described column decoding procedure is applied to a unit data input/output (1 DQ), the number of activated column selection lines is (the number of input/output pins×the number of above described activated column selection lines) when the number of the input/output pins is more than two.

The core section 500 includes four memory cell arrays, and receives data and output data therefrom. Each of the memory cell arrays is connected to (or disconnected from) corresponding local data line and one of global data lines GIO_E0, GIO_O0, GIO_E1 and GIO_E1. A memory cell array is connected to (or disconnected from) the local data line by the column selection line via which the output signal of the column decoder 470 is transferred. The local data line is connected to (or disconnected from) the global data line. The DDR1 mode operation is divided into DDR1-1 mode operation and DDR1-2 mode operation. In DDR1-1 mode operation, two memory cell arrays are connected to one global data line, receives data and outputs data therefrom. In addition, in DDR1-2 mode operation, one of two memory cell arrays is selected, and the selected memory cell array receives data from corresponding global data line and outputs data to the corresponding global data line. Simultaneously, in DDR1-2 mode operation, the other of two memory cell arrays is selected, and the selected memory cell array receives data from corresponding global data line and outputs data to the corresponding global data line. Therefore, in DDR1 mode operation, two data are simultaneously inputted to the memory cell array and simultaneously outputted from the memory cell array.

When the DDR2 mode operation is requested, all the four memory cell arrays are selected by the column decoder 470, each of the memory cell arrays receives data from corresponding local data line and corresponding global data line and outputs data to corresponding local data line and corresponding global data line. Thus, in DDR2 mode operation, four data are simultaneously inputted to the memory cell array and simultaneously outputted from the memory cell array.

The input control circuit 600 prefetches two data bits to simultaneously input the prefetched two bits data to the core section 500 or prefetches four bits data to simultaneously input the prefetched four bits data to the core section 500 based on the mode selection signal. In addition, based on the mode selection signal, the output control circuit 700 outputs two bits data simultaneously received from the core section 500 to one output pin so that the two bits data have two burst length or outputs four bits data simultaneously received from the core section 500 to one output pin so that the four bits data have four burst length.

The input control circuit 600 includes an input buffer 690, a sampling circuit 670, input latch 650, input ordering circuit 630 and line connector 610.

The input buffer 690 receives an input data having a TTL level to convert the received input data to an internal input data DQ having a CMOS level. The sampling circuit 670 allows the internal input data DQ to be synchronized with an internal clock signal so as to sample the internal input data DQ.

In addition, the input latch 650 receives first sampled internal input data from DIN_F line and second sampled internal input data from DIN_S line to simultaneously output two data to output lines DIN_F0, DIN_F1, DIN_S0 and DIN_S1 or simultaneously output four data to the output lines DIN_F0, DIN_F1, DIN_S0 and DIN_S1. In other words, when the mode selection signal requests the DDR1 mode operation, the input latch 650 performs two bits prefetch, and when the mode selection signal requests the DDR2 mode operation, the input latch 650 performs four bits prefetch. The first sampled internal input data has a phase different from the second sampled internal input data.

The input ordering circuit 630 selects one of the output lines DIN_F0, DIN_F1, DIN_S0 and DIN_S1 of the input latch 650 based on the mode selection signal, the internal write command PWRITE, the column address CA0 and CA2 and internal clock signal PCLKD, and transfers data outputted from the output lines DIN_F0, DIN_F1, DIN_S0 and DIN_S1 to output lines DID_0, DID_1, DID_2 and DID_3. In other words, when the mode selection signal requests the DDR1 mode operation the input ordering circuit 630 transfers the data outputted from selected output lines of the input latch 650 to two DID lines. When the mode selection signal requests the DDR2 mode operation the input ordering circuit 630 transfers the data outputted from selected output lines of the input latch 650 to four DID lines.

The line connector 610 controls the DID lines to be coupled to the global data lines based on the first and second mode selection signals based on the mode selection signal and column address. In other words, when the mode selection signal requests the DDR1 mode operation, the line connector 610 connects the two DID lines to two global data lines. When the mode selection signal requests the DDR2 mode operation, the line connector 610 connects the four DID lines to four global data lines.

The output control circuit 700 includes an output ordering circuit 710, an output data latch/mux 730, an output buffer 750 and an output driver 770.

Four output ordering parts 732, 734, 736 and 738 are used for one unit data input/output (1 DQ). Each of the output ordering parts 732, 734, 736 and 738 receives data of corresponding global data line, and activates one of four output lines FDO_F0, FDO_S0, FDO_F1, FDO_S1 based on combination of two column addresses. When the mode selection signal requests the DDR1 mode operation, one of two output lines of the output ordering circuit 710 is activated. When the mode selection signal requests the DDR2 mode operation, one of four output lines of the output ordering circuit 710 is activated.

The output data latch/mux 730 controls data, which are synchronized with internal clock to be simultaneously inputted thereto, to output data having a burst length of 2 or a burst length of 4 to terminals DOP or DON. When the mode selection signal requests the DDR1 mode operation, the output data latch/mux 730 outputs data having the burst length of 2. When the mode selection signal requests the DDR2 mode operation, the output data latch/mux 730 outputs data having the burst length of 4.

The output buffer 750 converts the level of the output of the output data latch/mux 730 to a TTL level.

In addition, the output driver 770 provides a data input/output pad 791 with the output of the output buffer 750.

The data input/output pad 791 is coupled to an ODT (On Die termination) circuit 793 so that distortion of an input signal may be reduced and transmission efficiency may be increased.

Figure 2:
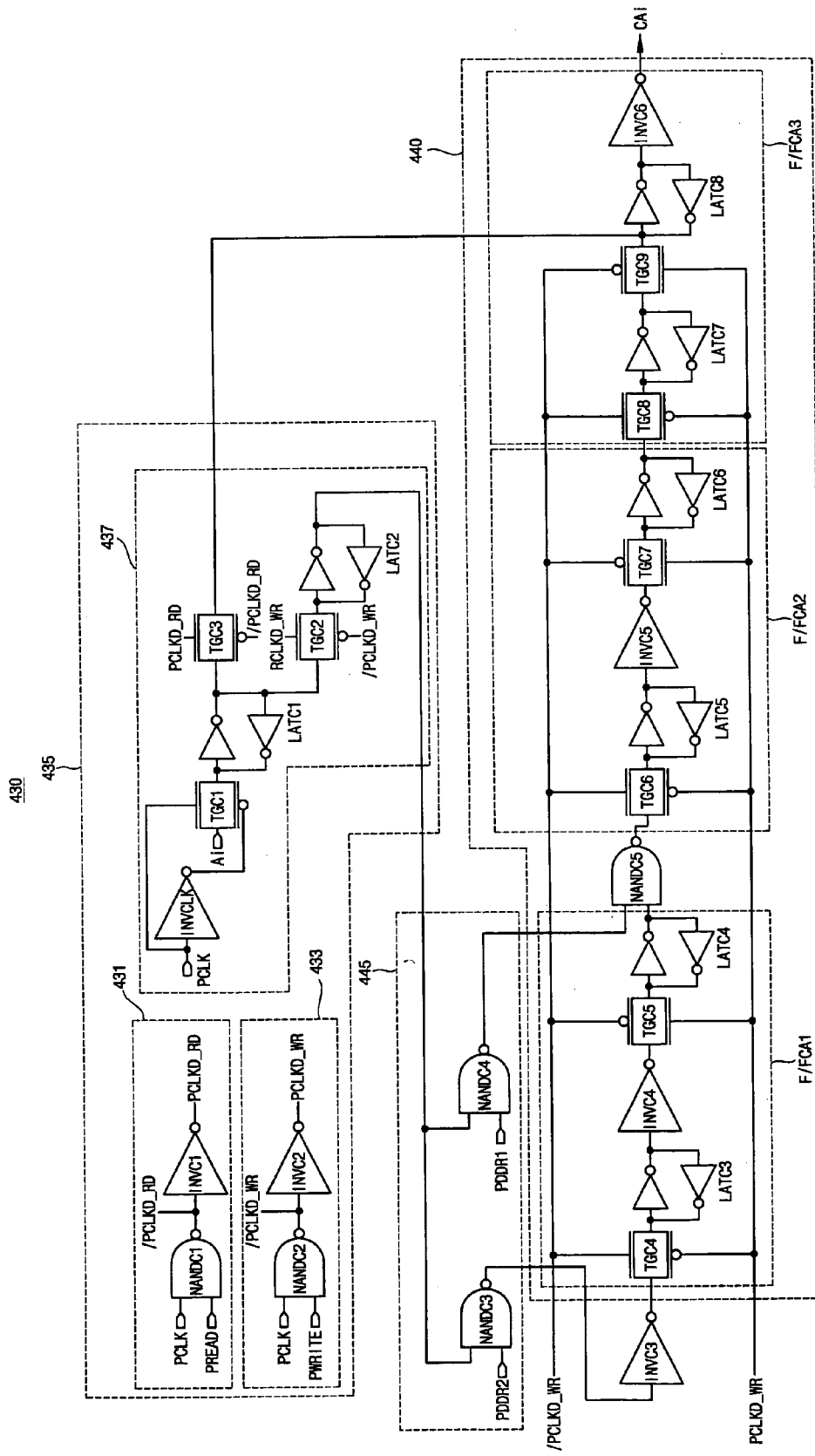
FIG. 2 is a circuit diagram showing a column address latch of FIG. 1 according to some embodiments of the present invention.

FIG. 2 is a circuit diagram showing a column address latch of FIG. 1.

Referring to FIG. 2, the column address latch 430 includes an address sampling circuit 435, an address transfer circuit 440 and a mode selection circuit 445.

The address sampling circuit 435 samples an input address Ai synchronized with an internal clock PCLK based on internal write command PWRITE or internal read command PREAD. The address transfer circuit 440 transfers the sampled Ai, and the mode selection circuit 445 determines a transfer path based on the mode selection signal.

The address sampling circuit 435 samples the input address Ai in response to a rising edge of the internal clock PCLK when the internal write command PWRITE is activated, and latches the sampled input address Ai. The latched input address Ai is inputted to the mode selection circuit 445 via a transmission gate TGC2 and a latch LATC2.

The address sampling circuit 435 samples the input address Ai in response to a rising edge of the internal clock PCLK when the internal read command PREAD is activated, and latches the sampled input address Ai. The latched input address Ai is inputted to the address transfer circuit 440 via a transmission gate TGC3.

The input address Ai inputted to the mode selection circuit 445 is transferred via different transfer path depending upon DDR1 or DDR2 mode operations. In DDR1 mode, the input address Ai is transferred via flip-flops F/FCA2 and F/FCA3. In DDR2 mode, the input address Ai is transferred via flip-flops F/FCA1, F/FCA2 and F/FCA3.

The address sampling circuit 435 includes a PCLKD_RD generating circuit 431, PCLKD_WR generating circuit 433 and an address sampler 437.

The PCLKD_RD generating circuit 431 generates a PCLKD_RD signal synchronized with the clock signal PCLK when the internal read command PREAD is activated. The PCLKD_WR generating circuit 433 generates a PCLKD_WR signal synchronized with the clock signal PCLK when the internal write command PWRITE is activated. The address sampler 437 samples the input address Ai synchronized with the internal clock PCLK based on the PCLKD_RD signal or the PCLKD_WR signal.

The PCLKD_RD generating circuit 431 includes a NAND gate NANDC1 for receiving the PCLK signal and the PREAD signal, and an inverter INVC1 for inverting an output, i.e. /PCLKD_RD, of the NANDC1 to output PCLKD_RD signal.

The PCLKD_WR generating circuit 433 includes a NAND gate NANDC2 for receiving the PCLK signal and the PWRITE signal, and an inverter INVC2 for inverting an output, i.e. /PCLKD_WR, of the NANDC2 to output PCLKD_WR signal.

The address sampler 437 includes a first sampling path and a second sampling path. The first sampling path samples the input address Ai in response to the PREAD command and latches the sampled input address Ai. The first sampling path includes a transmission gates TGC1 and TGC3, and a latch LATC1. The second sampling path samples the input address Ai in response to the PWRITE command and latches the sampled input address Ai. The second sampling path includes a transmission gates TGC1 and TGC2, and latches LATC1 and LATC2.

The address sampler 437 receives the PCLK signal via an inverter INVCLK. The transmission gate TGC1 receives the input address Ai and latches the input address Ai based on the PCLK signal and the output of the inverter INVCLK.

When the internal read command READ is activated, the PCLKD_RD generating circuit 431 outputs PCLKD_RD and /PCLKD_RD synchronized with the PCLK signal. The transmission gate TGC3 samples the input address Ai outputted from the latch LATC1 based on the PCLKD_RD and /PCLKD_RD to output the sampled input address Ai to a latch LATC8. The latch LATC8 outputs the sampled input address Ai to the inverter INVC6, and the inverter INVC6 inverts the input address Ai to generate the CAi signal.

When the internal write command PWRITE is activated, the PCLKD_WR generating circuit 433 outputs PCLKD_WR and /PCLKD_WR synchronized with the PCLK signal. The transmission gate TGC2 samples the input address Ai outputted from the latch LATC1 based on the PCLKD_WR and /PCLKD_WR to output the sampled input address Ai to a latch LATC2. The latch LATC2 outputs the sampled input address Ai to the mode selection circuit 445.

The mode selection circuit 445 includes NAND gates NANDC3 and NANDC4. The NAND gate NANDC3 receives the mode selection signal PDDR2 and the output signal of the latch LATC2 to output the sampled input address Ai to the address transfer circuit 440. The NAND gate NANDC4 receives the mode selection signal PDDR1 and the output signal of the latch LATC2 to output the sampled input address Ai to the address transfer circuit 440.

The address transfer circuit 440 includes flip-flops F/FCA1, F/FCA2 and F/FCA3. The transmission gates of the flip-flops F/FCA1, F/FCA2 and F/FCA3 are controlled by PCLKD_WR and /PCLKD_WR signals. The inverter INVC3 inverts the output of the NAND gate NANDC3 to output the output of the inverter INVC3 to the flip-flop F/FCA1. The output of the NAND gate NANDC4 is inputted to the NAND gate NANDC5, and the output of the NAND gate NANDC5 to the flip-flop F/FCA2.

Figure 3:
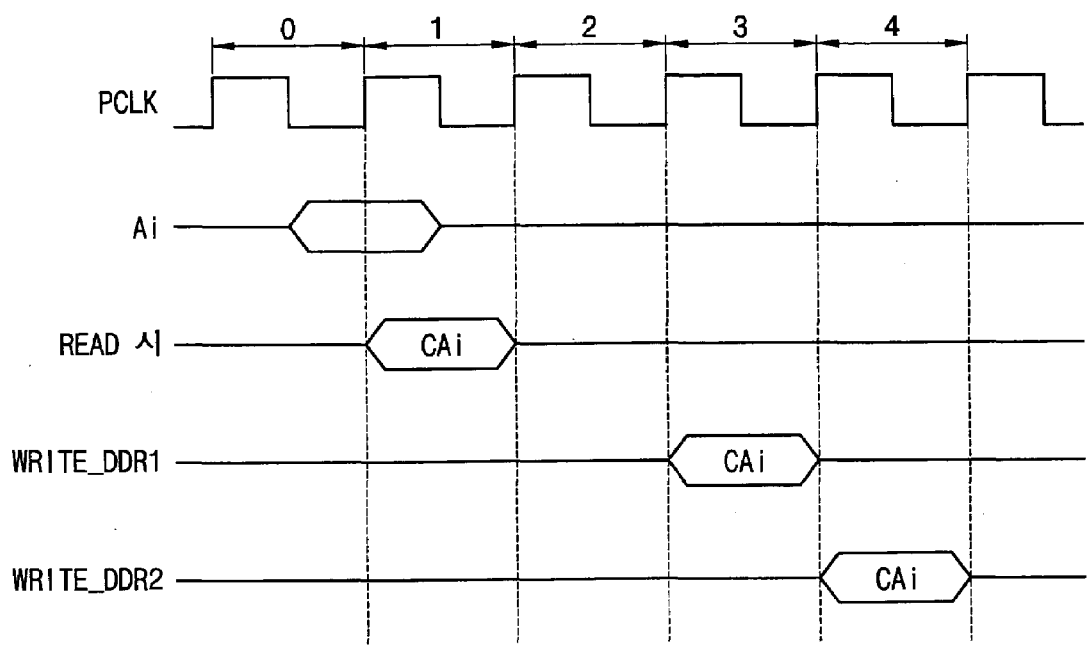
FIG. 3 is a timing diagram showing operation of the column address latch of FIG. 2 according to some embodiments of the present invention.

FIG. 3 is a timing diagram showing operation of the column address latch of FIG. 2. Referring to FIGS. 2 and 3, the transmission gate TGC1 is turned off when the clock '0' of the PCLK signal has a low level. The TGC1 is turned on in response to a rising edge of the clock '1' of the PCLK signal, and samples the input address Ai to transfer the sampled input address Ai to the latch LATC1.

When the internal read command PREAD is activated, the PCLK signal is transferred to transmission gate TGC3 via the NAND gate NANDC1 and inverter INVC1 so as to control the transmission gate TGC3. The transmission gate TGC1 is turned on in response to a rising edge of the clock '1' of the PCLK signal, samples the input address Ai to output the sampled input address Ai to the latch LATC8 of the flip-flop F/FCA3. Then, the sampled input address Ai is outputted via an inverter INVC6 as a CAi signal that is synchronized with the internal clock signal PCLK.

When the internal read command PREAD is activated, the write command PWRITE has a low level, and the output of the NAND gate NANDC2 has a high level regardless of the PCLK signal. Thus, the PCLK_WR signal has a low level, the input address Ai is not sampled since the transmission gate TGC2 of the second transfer path is turned off.

During the read operation, the column address latch 430 samples the input address Ai in response to the rising edge of the internal clock PCLK to output the column address CAi without internal latency.

When the internal write command PWRITE is activated, the PCLK signal is transferred to transmission gate TGC2 via the NAND gate NANDC2 and inverter INVC2 so as to control the transmission gate TGC2. The transmission gate TGC2 samples the input address Ai in response to a rising edge of the clock '1' of the PCLK signal, and the latch LATC1 latches the input address Ai. Then, the input address latched by the latch LATC1 is passed through the transmission gate TGC2, which is turned on in response to the rising edge of the clock '1' of the PCLK signal, and the latch LATC2 latches the input address Ai. The sampled input address Ai is inputted to the mode selection circuit 445.

When the DDR1 mode selection signal PDDR1 has a high level the DDR2 mode selection signal PDDR2 may be a low level. Thus, the sampled input address Ai may not be transferred through the NAND gate NANDC3 since the output of the NAND gate NANDC3 has a low level regardless of the sampled input address Ai. On the other hand, the NAND gate NANDC4 inverts the sampled input address Ai to transfer the sampled input address Ai. Thus, the DDR1 mode operation is performed when the PDDR1 has a high level, and the DDR2 mode operation is performed when the PDDR1 has a low level (or the PDDR2 has a high level).

In DDR1 mode operation, the output of NANDC3 has a high level and the output of the inverter INVC3 has a low level. In addition, the sampled input address Ai is transferred to the NAND gate NANDC5 via NAND gate NANDC4 since the PDDR1 has a high level. The output of the NAND gate NANDC4 is inputted to the transmission gate TGC6 of the flip-flop F/FCA2 via the NANDC5. The input address Ai sampled at the rising edge of the clock '1' of the PCLK is sampled again in response to a falling edge of the clock '1' of the PCLK since the transmission gate TGC6 is turned on when the PCLK signal has a low level. The input address Ai sampled at the falling edge of the clock '1' of the PCLK is latched by the latch LATC5, is inverted by the inverter INVC5, and is inputted to the transmission gate TGC7. The transmission gate TGC7 is turned on when the PCLK signal has a high level. Thus, the transmission gate TGC7 samples the input address Ai since the transmission gate TGC7 is turned off during a low level of the PCLK signal and is turned on during a high level of the PCLK signal. The transmission gate TGC8 is turned off when the clock '2' of the PCLK has a high level, so that the input address Ai sampled at the rising edge of the clock '2' of the PCLK is latched by the latch LATC6 during a high level of the clock '2' of the PCLK. The input address Ai is sampled at a falling edge of the clock '2' and is latched by the latch LATC7 since the transmission gate TGC8 is turned on at a low level of the clock '2' of the PCLK. The input address Ai is latched by the latch LATC7 during the low level of the clock '2' of the PCLK, is sampled by the transmission gate TGC9 that is turned on in response to the rising edge of the clock '3' of the PCLK, is latched by the latch LATC8, is inverted by the inverter INVC6, and the output of the inverter INVC6 is a CAi synchronized with the internal clock PCLK.

Therefore, in a write operation of the DDR1 mode operation, the column address latch 430 samples the input address Ai in response to the rising edge of the internal clock PCLK, provides the flip-flop F/FCA2 and F/FCA3 with the sampled input address Ai, and outputs the column address CAi having an internal latency 2. The column address CAi having the internal latency 2 is delayed by two clocks with respect to the sampling time of the input address Ai.

In DDR2 mode operation, the PDDR2 has a high level and the PDDR1 has a low level. When the write command PWRITE is activated, the PCLK signal is provided to the transmission gate TGC2 via the NAND gate NANDC2 so as to control the transmission gate TGC2. The input address Ai sampled at the rising edge of the clock '1' of the PCLK is inputted to the NAND gate NANDC3. The NAND gate NANDC3 inverts the sampled input address Ai, and the inverted input address Ai is inputted to the inverter INVC3. The inverter INVC3 inverters the output of the NAND gate NANDC3.

The transmission gate TGC4 is turned on when the PCLK signal has a low level, so that the transmission gate is turned off during a high level of the clock '1' of the PCLK and is turned on during a low level of the clock '1' of the PCLK. Thus, the transmission gate TGC4 samples the input address Ai at the falling edge of the clock '1' of the PCLK signal. The signal sampled by the TGC4 is latched by the latch LATC3.

The transmission gate TGC5 is turned off during the low level of the clock '1' of the PCLK so that the signal inputted to the latch LATC3 is latched by the latch LATC3 since the transmission gate TGC5 is turned off during a low level of the PCLK and is turned on during a high level of the PCLK. When the level of the PCLK increases and the clock '2' has a high level, the transmission gate TGC5 is turned on, and the signal latched by the latch LATC3 is inputted to the latch LATC4 via the inverter INVC4. Thus, the transmission gate TGC5 samples the signal latched by the latch LATC3 in response to a rising edge of the clock '2' of the PCLK.

In DDR2 mode operation, the output of the NAND gate NANDC4 has a high level regardless of the sampled input address Ai since the PDDR1 has a low level. The output of the NAND gate NANDC4 is inputted to one of the input terminals of the transmission gate TGC5. The latch LATC4 is able to transfer the latched signal to the transmission gate TGC6 via the NAND gate NANDC5.

The transmission gate TGC6 is turned off during the high level of the clock '2' of the PCLK so that the signal inputted to the latch LATC4 is latched by the latch LATC4 since the transmission gate TGC6 is turned off during a high level of the PCLK and is turned on during a low level of the PCLK. Since the transmission gate TGC6 is turned on during the low level of the clock '2' of the PCLK, the signal latched by the latch LATC4 is inputted to the latch LATC5 via the NAND gate NANDC5 and the transmission gate TGC6. Thus, the transmission gate TGC6 samples the signal latched by the latch LATC4 in response to a falling edge of the clock '2' of the PCLK.

The transmission gate TGC7 is turned off during the low level of the clock '2' of the PCLK so that the signal inputted to the latch LATC5 is latched by the latch LATC5 since the transmission gate TGC7 is turned off during a low level of the PCLK and is turned on during a high level of the PCLK. Since the transmission gate TGC7 is turned on during the high level of a clock '3' of the PCLK, the signal latched by the latch LATC5 is inputted to the latch LATC6 via the inverter INVC5 and the transmission gate TGC7. Thus, the transmission gate TGC7 samples the signal latched by the latch LATC5 in response to a rising edge of the clock '3' of the PCLK.

The transmission gate TGC8 is turned off during the high level of the clock '3' of the PCLK so that the signal inputted to the latch LATC6 is latched by the latch LATC6 since the transmission gate TGC8 is turned off during a high level of the PCLK and is turned on during a low level of the PCLK. Since the transmission gate TGC8 is turned on during the low level of the clock '3' of the PCLK, the signal latched by the latch LATC6 is inputted to the latch LATC7 via the transmission gate TGC8. Thus, the transmission gate TGC8 samples the signal latched by the latch LATC6 in response to a falling edge of the clock '3' of the PCLK.

The transmission gate TGC9 is turned off during the low level of the clock '3' of the PCLK so that the signal inputted to the latch LATC7 is latched by the latch LATC7 since the transmission gate TGC9 is turned off during a low level of the PCLK and is turned on during a high level of the PCLK. Since the transmission gate TGC9 is turned on during the high level of a clock '4' of the PCLK, the signal latched by the latch LATC7 is inputted to the latch LATC8 via the transmission gate TGC9. Thus, the transmission gate TGC9 samples the signal latched by the latch LATC7 in response to a rising edge of the clock '4' of the PCLK. The signal inputted to the latch LATC8 is outputted as the CAi signal synchronized with the internal clock PCLK via the inverter INVC6.

Therefore, in a write operation of the DDR2 mode operation, the column address latch 430 samples the input address Ai in response to the rising edge of the internal clock PCLK, provides the flip-flops F/FCA1, F/FCA2 and F/FCA3 with the sampled input address Ai, and outputs the column address CAi having an internal latency 3. The column address CAi having the internal latency 3 is delayed by three clocks with respect to the sampling time of the input address Ai.

FIGS. 4A, 4B, 4C and 4D are block diagrams showing a column decoder of FIG. 1. The column decoder 470 disregards one or two column addresses in response to the mode selection signal while the column address 470 decodes the column addresses.

Figure 4A:
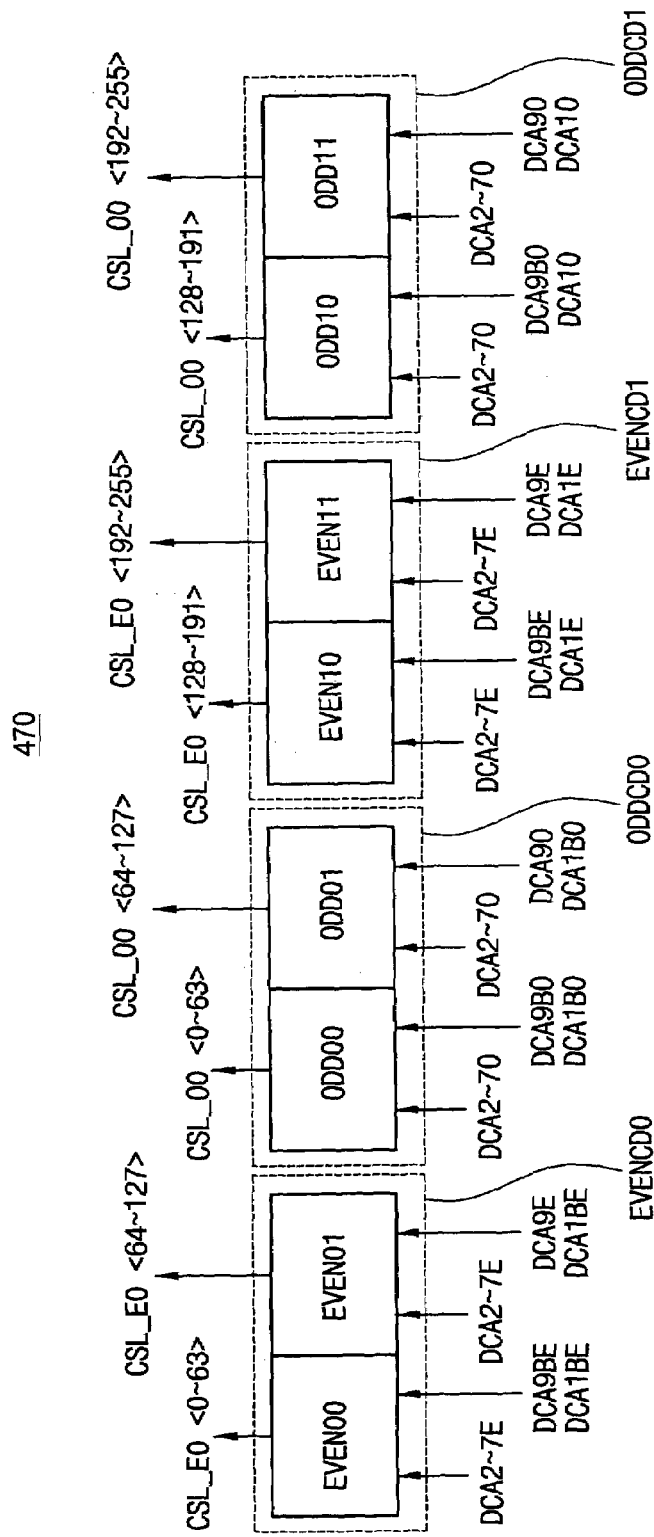
FIGS. 4A, 4B, 4C and 4D are block diagrams showing a column decoder of FIG. 1 according to some embodiments of the present invention.

FIG. 4A shows a column decoder operating in the DDR1-1 mode. In the DDR1 mode, two decoding blocks are selected for decoding operation among four decoding blocks. In the DDR1 mode, one of the odd numbered decoding blocks and one of the even numbered decoding blocks are selected among the four decoding blocks. The column decoder 470 includes four decoding blocks EVENCD0, ODDCD0, EVEVCD1 and ODDCD1. The decoding block EVENCD0 includes sub-decoding blocks EVEN00 and EVEN01, and decoding block ODDCD0 includes sub-decoding blocks ODD00 and ODD01. The decoding block EVENCD1 includes sub-decoding blocks EVEN10 and EVEN11, and decoding block ODDCD1 includes sub-decoding blocks ODD10 and ODD11.

The column decoder includes $2^m$ column selection lines corresponding to m column addresses. Each of the sub-decoding blocks includes $2^n$ column selection lines corresponding to n column addresses. The sub-decoding blocks of each of the decoding blocks are selected complementarily based on a column address.

In the DDR1-1 mode, the sub-decoding blocks of EVEN00 and EVEN11 are a decoding unit, and the sub-decoding blocks ODD00 and ODD11 are another decoding unit. The decoding block EVENCD0 or EVENCD1 are selected complementarily based on a pre-decoded column address, and simultaneously decoding block ODDCD0 or ODDCD1 are selected complementarily. Two decoding blocks are selected among four decoding blocks, and a sub-decoding block is selected among each of the selected decoding blocks using another column address. In other words, two sub-decoding blocks are selected among eight sub-decoding blocks. N addresses inputted to each of the selected sub-decoding blocks are decoded to activate one of the $2^n$ column selection lines. Thus, in the DDR1 mode, two column selection lines are activated for 1DQ, and the column selection signal controls a column selection gate to connect the bit line BL and /BL to local data line LIO and /LIO, respectively.

Referring to FIG. 4A, each of the sub-decoding blocks may decode the column address of the output lines DCA2 through DCA7 of the column predecoder 450. In addition, a sub-decoding block is selected among one decoding block based on a most significant address, for example DCA9, of the pre-decoded addresses.

In addition, a decoding block is selected based on the column address CA1 regardless of least significant address CA0 of the column addresses. When the CA1 of the line DCA1E and DCA10 has a low level, EVENCD0 is selected among EVENCD0 and EVENCD1 and ODDCD0 is selected among ODDCD0 and ODDCD1 since lines DCA1BE and DCA1B0 are activated. In addition, when the CA9 of the line DCA9E has a low level, the sub-decoding block EVEN00 of the selected EVENCD0 since lines DCA9BE is activated. When the CA9 of the line DCA9O has a low level, the sub-decoding block ODD00 of the selected ODDCD0 since lines DCA9BO is activated. The selected sub-decoding blocks EVEN00 and ODD00 decode addresses CA2 through CA7 to activate one of the lines CSL_E0<0~63> and one of lines CSL_O0<0~63>. Thus, one of the column selection lines is activated by the EVEV00, and one of the column selection lines is activated by the ODD00. When CA9 has a high level, the sub-decoding block EVEN01 of the selected decoding block EVENCD0 is selected and the sub-decoding block ODD01 of the selected decoding block ODDCD0 is selected. The selected sub-decoding blocks EVEN01 and ODD01 decode addresses CA2 through CA7 to activate one of the lines CSL_E0<64~127> and one of lines CSL_O0<64__127>. Thus, one of the column selection lines is activated by the EVEV01, and one of the column selection lines is activated by the ODD01.

When CA1 has a high level, EVENCD1 is selected among EVENCD0 and EVENCD1 and ODDCD1 is selected among ODDCD0 and ODDCD1. In addition, when CA9 has a low level, the sub-decoding block EVEN10 of the selected decoding block EVENCD1 is selected and the sub-decoding block ODD10 of the selected decoding block ODDCD1 is selected. The selected sub-decoding blocks EVEN10 and ODD10 decode addresses CA2 through CA7 to activate one of the lines CSL_E0<128~191> and one of lines CSL_O0<128__191>. Thus, one of the column selection lines is activated by the EVEV10, and one of the column selection lines is activated by the ODD10. When CA9 has a high level, the sub-decoding block EVEN11 of the selected decoding block EVENCD1 is selected and the sub-decoding block ODD11 of the selected decoding block ODDCD1 is selected. The selected sub-decoding blocks EVEN11 and ODD11 decode addresses CA2 through CA7 to activate one of the lines CSL_E0<192~255> and one of lines CSL_O0<192__255>. Thus, one of the column selection lines is activated by the EVEV11, and one of the column selection lines is activated by the ODD11.

Thus, when the CA1 has a low level, EVEN00 and EVEN01 are selected, and one of the sub-decoding blocks EVEN00 and EVEN01 are selected based on a level of the CA9. When the CA1 has a high level, EVEN10 and EVEN11 are selected, and one of the sub-decoding blocks EVEN10 and EVEN11 are selected based on a level of the CA9. In addition, when the CA1 has a low level, ODD00 and ODD01 are selected, and one of the sub-decoding blocks ODD00 and ODD01 are selected based on a level of the CA9. When the CA1 has a high level, ODD10 and ODD11 are selected, and one of the sub-decoding blocks ODD10 and ODD11 are selected based on a level of the CA9.

In the DDR1-1 mode, a feature of the column decoder 470 is that the decoding blocks EVENCD and ODDCD access two column selection lines at the same time for a CAi which accesses two data for a unit data input/output (1 DQ). In addition, the column decoder 470 has a feature that decoding blocks EVENCD and ODDCD are disposed alternately.

Figure 4B:
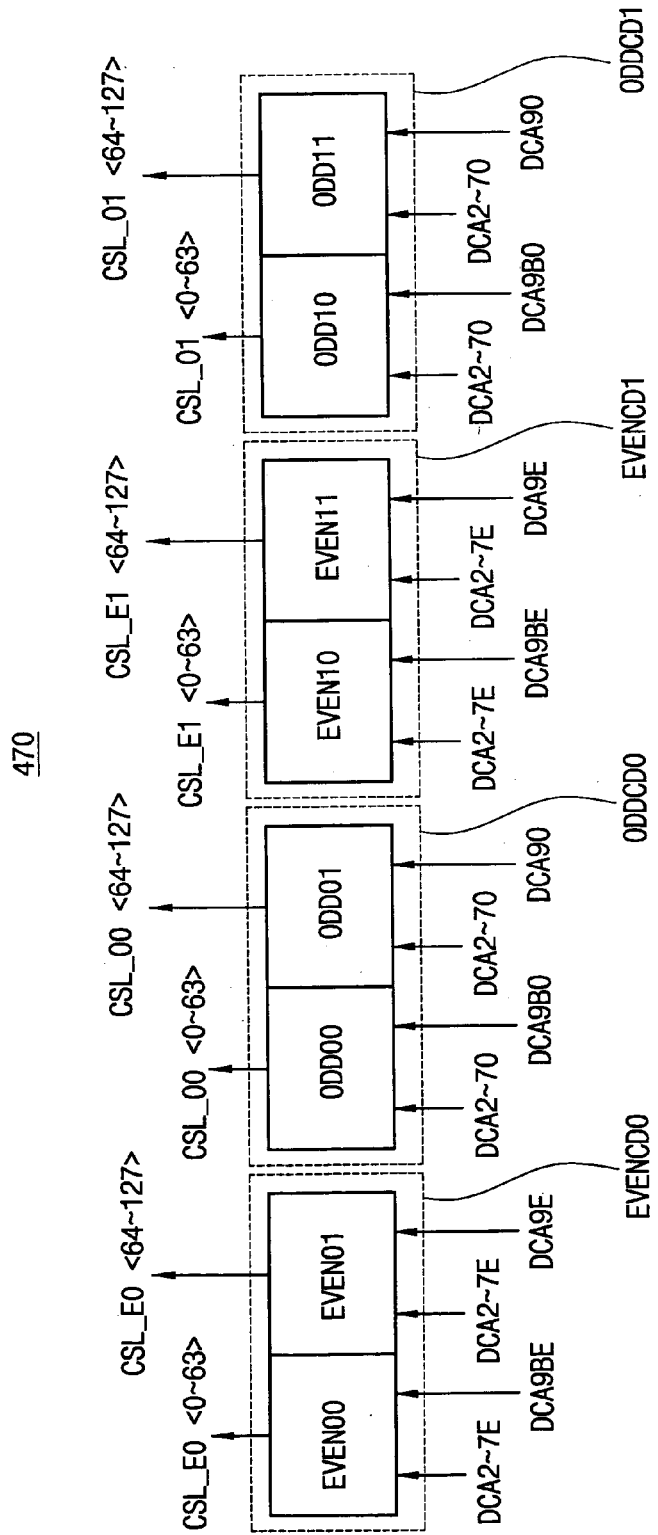

FIG. 4B shows a column decoder capable of operating in the DDR1 and DDR2 modes.

Referring to FIG. 4B, each of the decoding blocks EVENCD and ODDCD has the same structure as that of FIG. 4A. However, in DDR2 mode, the CA1, which selects EVENCD0, EVENCD1, ODDCD0 or ODDCD1, is disregarded. Thus, two decoding blocks EVENCD0 and EVENCD1 may simultaneously access column selection lines, and two decoding blocks ODDCD0 and ODDCD1 may simultaneously access column selection lines. Thus, all of the decoding blocks EVENCD0, ODDCD0, EVENCD1 and ODDCD1 are selected based on column addresses to activate corresponding column selection lines. The DCA9 selects a sub-decoding block of a decoding block, however CA0 and CA1 are not used when the decoding blocks are selected.

For example, four decoding blocks EVENCD0, ODDCD0, EVENCD1 and ODDCD1 respectively access one of 128 column selection lines based on logic level of the CA2 through CA7 and CA9. When CA9 has a low level, the sub-decoding blocks of EVEN00, ODD00, EVEN10 and ODD10 are selected, and one of 64 column selection lines are selected based on the logic level of the CA2 through CA7 that are provided through the lines DCA2~7E or DCA2~7O. When CA9 has a high level, the sub-decoding blocks of EVEN01, ODD01, EVEN11 and ODD11 are selected, and one of 64 column selection lines are selected based on the logic level of the CA2 through CA7.

The column decoder of FIG. 4B operates in the DDR2 mode and has a feature that four decoding blocks simultaneously access column selection lines, so that four data may be accessed for a unit data input/output (1DQ). In addition, the column decoder of FIG. 4B has the same structure as that of FIG. 4A, so that the column decoder of FIG. 4B may operate in the DDR2 mode when two column addresses of CAi are disregarded and may operate in the DDR1-1 mode when one column address of CAi is disregarded.

Figure 4C:
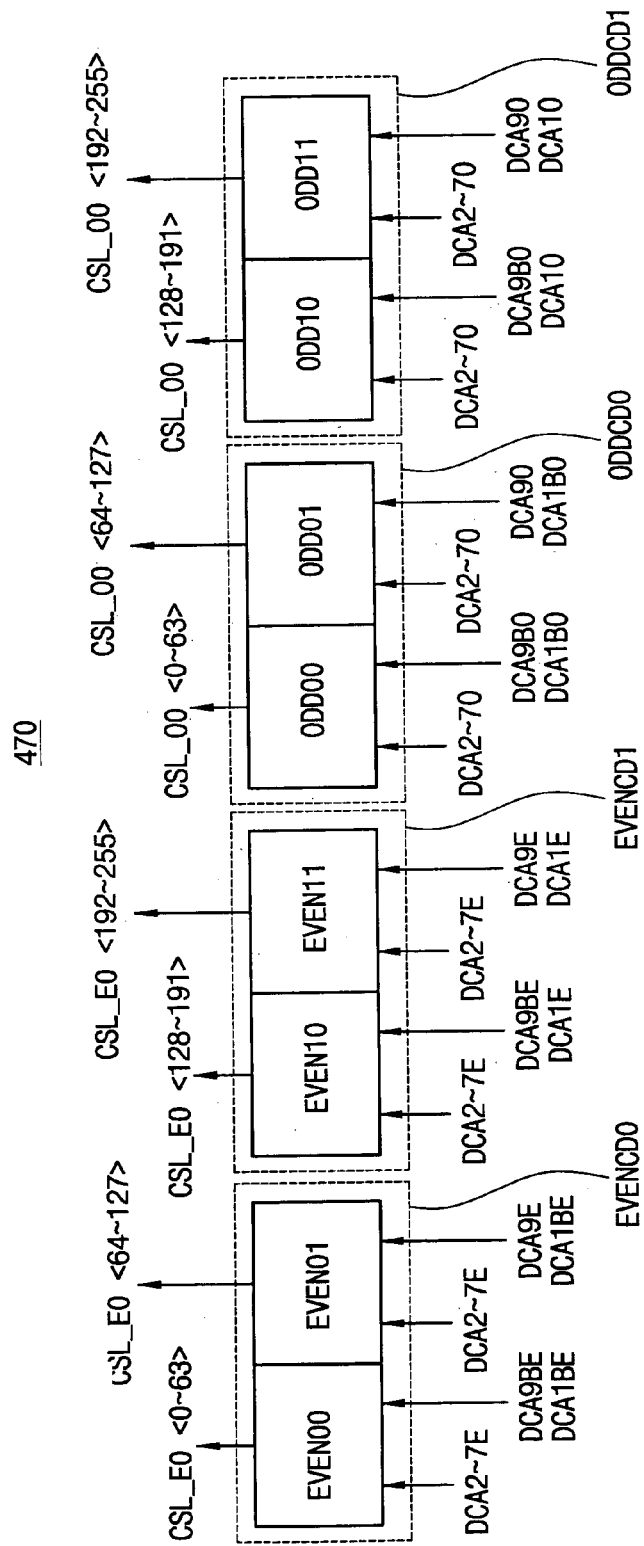

FIG. 4C shows a column decoder operating in the DDR1-2 mode.

In the DDR1-2 mode, one of the first and second decoding blocks among the four decoding blocks are selected, and at the same time one of the third and fourth decoding blocks are selected among the four decoding blocks.

Referring to FIG. 4C, two decoding blocks EVEND0 and EVENCD1 are consecutively disposed, and two decoding blocks ODDCD0 and ODDCD1 are consecutively disposed. In the DDR1-2 mode, the decoding block EVENCD accesses one column selection line and simultaneously the ODDCD accesses another column selection line in the same way as that of FIG. 4A. When both CA1 of the line DCA1E and CA9 of the line DCA9E have low level, the sub-decoding block EVEN00 is selected and one of 64 column selection lines CSL_E<0~63> is selected based on the CA2 through CA7 of the lines DCA2~7E. When CA1 has a low level and CA9 has a high level, the sub-decoding block EVEN01 is selected and one of 64 column selection lines CSL_E<64~127> is selected based on the CA2 through CA7. When CA1 has a high level and CA9 has a low level, the sub-decoding block EVEN10 is selected and one of 64 column selection lines CSL_E<128~191> is selected based on the CA2 through CA7. When both CA1 and CA9 have high level, the sub-decoding block EVEN11 is selected and one of 64 column selection lines CSL_E<192~255> is selected based on the CA2 through CA7.

Thus, when CA1 has a low level, EVEN00 and EVEN01 are selected, and sub-decoding block EVEN00 or EVEN01 is selected depending on the level of CA9.

Above described principle may be applied to decoding blocks ODDCD0 and ODDCD1.

The column decoder in the DDR1 mode has a feature that two column selection lines are simultaneously accessed for a unit data input/output (1DQ). In addition, two decoding blocks EVEND0 and EVENCD1 are adjacently disposed, and two decoding blocks ODDCD0 and ODDCD1 are adjacently disposed.

Figure 4D:
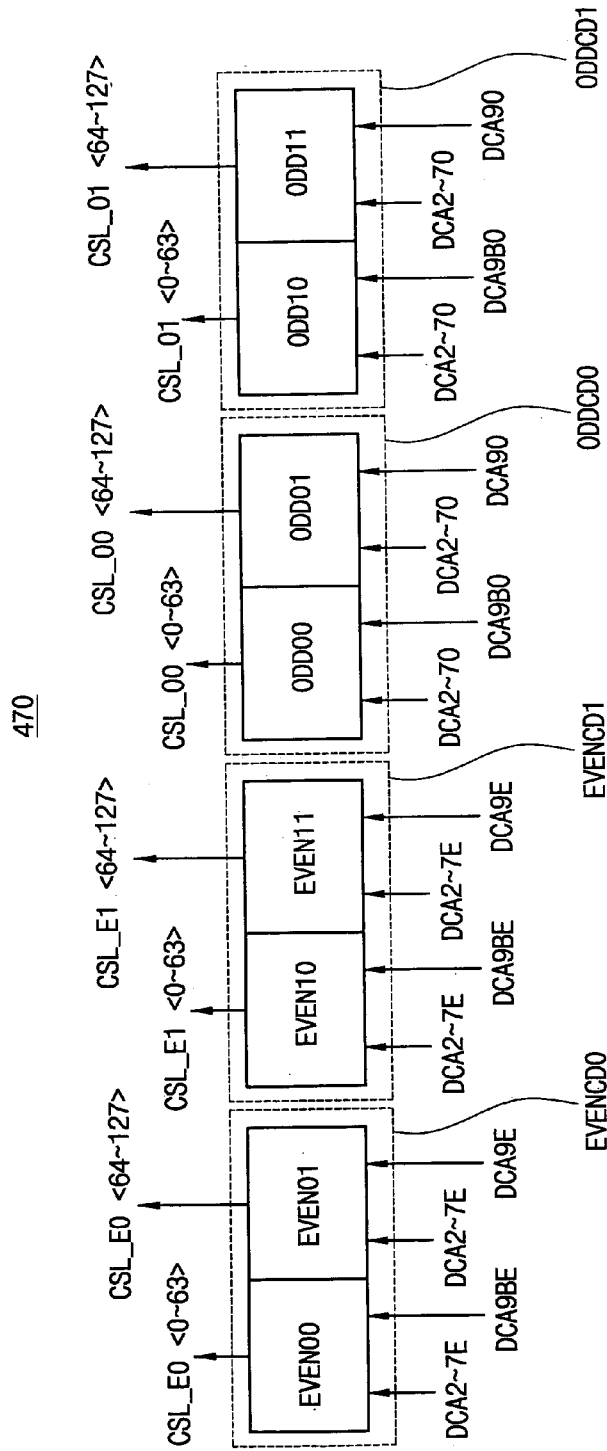

FIG. 4D shows a column decoder operating in the DDR1-2 mode and DDR2 mode.

Referring to FIG. 4D, each of decoding blocks EVENCD and ODDCD has a structure as that of FIG. 4C. However, in the DDR2 mode, the data of the column address CA1 that selects EVENCD0 or EVENCD1 are disregarded. Thus, two decoding blocks EVENCD0 and EVENCD1 may simultaneously access column selection lines. In addition, CA1 selects ODDCD0 or ODDCD1 in the DDR1 mode, however, CA1 is disregarded in the DDR2 mode. Thus, each of two decoding blocks ODDCD0 and ODDCD1 may simultaneously access column selection lines. CA9 selects a sub-decoding block of a decoding block.

For example, each of the four decoding blocks selects one of 128 column selection lines based on the level of CA2 through Ca7 and CA. When CA9 has a high level, the sub-decoding blocks EVEN01, EVEN11, ODD01 and ODD11 are selected, and one of 64 column selection lines is selected based on the level of the CA2~7.

Thus, the column decoder of FIG. 4D operates in the DDR2 mode and has a feature that four decoding blocks simultaneously access column selection lines, so that four data may be accessed for a unit data input/output (1DQ). In addition, the column decoder of FIG. 4D has the same structure as that of FIG. 4C, so that the column decoder of FIG. 4D may operate in the DDR2 mode when two column addresses of CAi are disregarded and may operate in the DDR1 mode when one column address of CAi is disregarded.

Figure 5A:
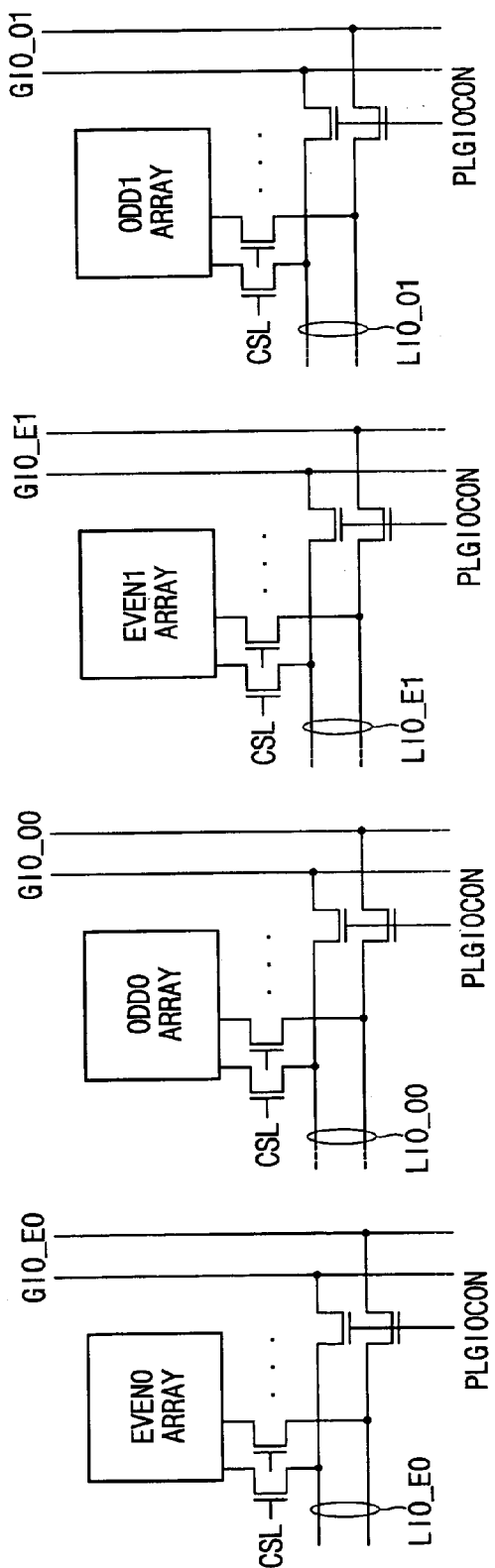
FIGS. 5A and 5B are block diagrams showing a cell array structure of a core section of FIG. according to some embodiments of the present invention 1.
Figure 5B:
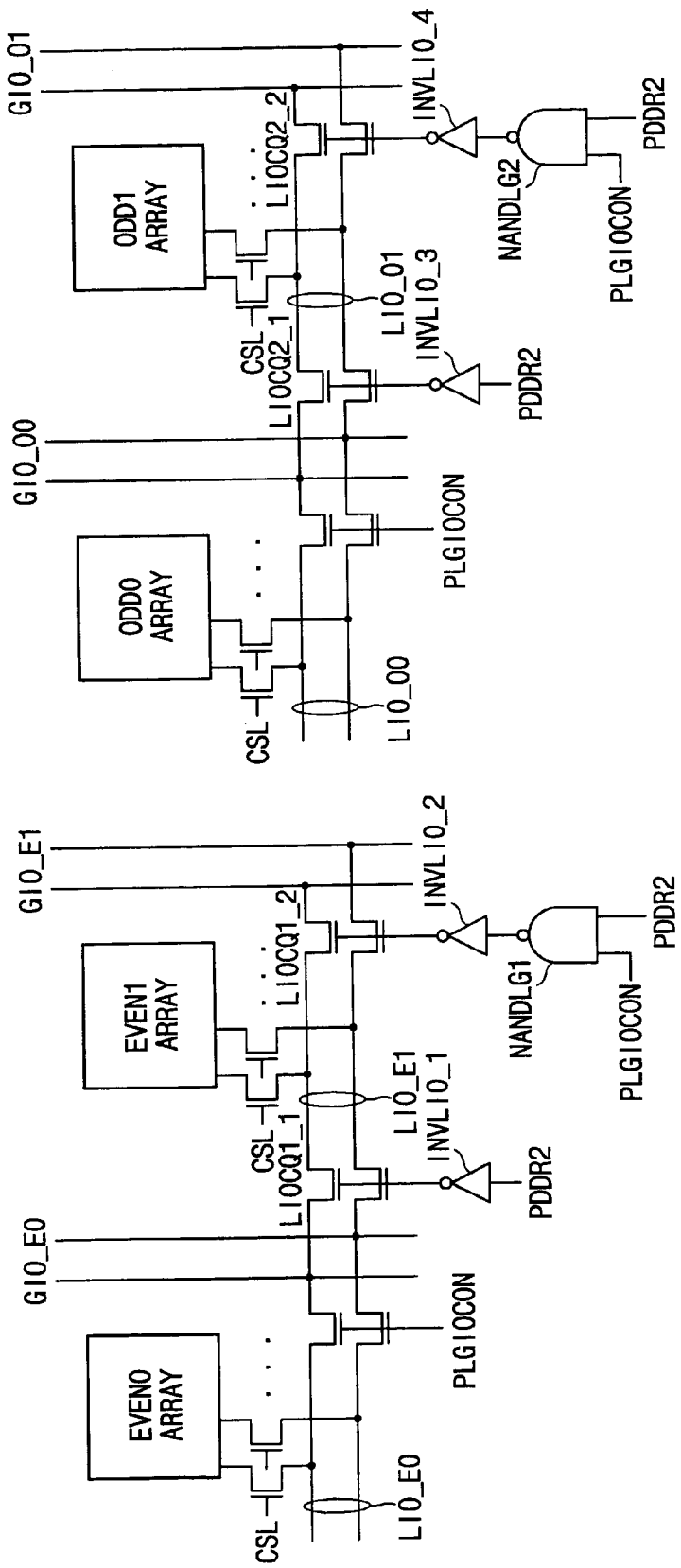

FIGS. 5A and 5B are block diagrams showing a cell array structure of a core section of FIG. 1. Referring to FIG. 5A, EVEN0 array, ODD0 array, EVEN1 array and ODD1 array are consecutively arranged. Each of the arrays has a local data line LIO. The EVEN0 array is connected to a local data line LIO_E0 via a plurality of column selection gates. The local data line LIO_E0 is connected to a global data line GIO_E0 via a first global data selection gate. The first global data selection gate is controlled by a signal PLGIOCON that is a connection signal between the local data line and the global data line.

The ODD0 array is connected to a local data line LIO_O0 via a plurality of column selection gates. The local data line LIO_O0 is connected to a global data line GIO_O0 via a second global data selection gate. The second global data selection gate is controlled by the signal PLGIOCON.

The EVEN1 array is connected to a local data line LIO_E1 via a plurality of column selection gates. The local data line LIO_E1 is connected to a global data line GIO_E1 via a third global data selection gate. The third global data selection gate is controlled by the signal PLGIOCON.

The ODD1 array is connected to a local data line LIO_O1 via a plurality of column selection gates. The local data line LIO_O1 is connected to a global data line GIO_O1 via a fourth global data selection gate. The fourth global data selection gate is controlled by the signal PLGIOCON.

In the DDR1-1 operation mode, the memory cell arrays of FIG. 5A correspond to the column decoder of FIG. 4A. The 128 column selection lines selectively decoded by the EVEN00 and EVEN01 of FIG. 4A correspond to a plurality of bit lines BL and /BL of the memory cell EVEN0 of FIG. 5A. When one of the 128 column selection signals is activated and corresponding column selection gate is turned on in response to one of the 128 column selection signals, data on the bit line BL and /BL connected the column selection gate are transferred to the local data line LIO_E0, and are transferred to the global data line GIO_E0 via the global data selection gate that is turned on by the signal PLGIOCON.

The 128 column selection lines selectively decoded by the EVEN10 and EVEN11 of FIG. 4A correspond to a plurality of bit lines BL and /BL of the memory cell EVEN1 of FIG. 5A. When one of the 128 column selection signals is activated and corresponding column selection gate is turned on in response to one of the 128 column selection signals, data on the bit line BL and /BL connected the column selection gate are transferred to the local data line LIO_E1, and are transferred to the global data line GIO_E1 via the global data selection gate that is turned on by the signal PLGIOCON.

In the DDR1-1 operation mode, since only one sub-decoding block of the sub-decoding blocks EVEN00, EVEN01, EVEN10 and EVEN11 is selected, one memory cell array corresponding to the selected sub-decoding block is selected among the memory cell arrays EVEN0 and EVEN1, and data of the selected memory cell array are transferred to corresponding global data line.

The memory cell array ODD0 of FIG. 5A corresponds to the sub-decoding blocks ODD00 and ODD01 of FIG. 4A. The 128 column selection lines decoded by the EVEN00 and EVEN01 of FIG. 4A correspond to a plurality of bit lines BL and /BL of the memory cell ODD0 of FIG. 5A. When one of the 128 column selection signals is activated and corresponding column selection gate is turned on in response to one of the 128 column selection signals, data on the bit line BL and /BL connected the column selection gate are transferred to the local data line LIO_00, and are transferred to the global data line GIO_E0 via the global data selection gate that is turned on by the signal PLGIOCON.

The memory cell array ODD1 of FIG. 5A corresponds to the sub-decoding blocks ODD10 and ODD11 of FIG. 4A. The 128 column selection lines selectively decoded by the ODD10 and ODD11 of FIG. 4A correspond to a plurality of bit lines BL and /BL of the memory cell ODD1 of FIG. 5A. When one of the 128 column selection signals is activated and corresponding column selection gate is turned on in response to one of the 128 column selection signals, data on the bit line BL and /BL connected the column selection gate are transferred to the local data line LIO_O1, and are transferred to the global data line GIO_01 via the global data selection gate that is turned on by the signal PLGIOCON.

In the DDR1-1 operation mode, since only one sub-decoding block of the sub-decoding blocks ODD00, ODD01, ODD10 and ODD11 is selected, one memory cell array corresponding to the selected sub-decoding block is selected among the memory cell arrays ODD0 and ODD1, and data of the selected memory cell array are transferred to corresponding global data line.

In addition, in the DDR1-1 operation mode, since two column selection lines are simultaneously activated based on the level of the column address CAi, one of GIO_E0 and GIO_E1 and one of GIO_O0 and GIO_O1 are simultaneously activated, and the data of the cell array are transferred to the activated global data lines.

Although a read operation is described above with reference to FIG. 5A, in a write operation, the data is transferred in a reverse order compared with the read operation. In other words, data input to global data line, are transferred to a local data line, and are transferred to memory cell via a bit line.

In the DDR2 operation mode, The EVEN0 array corresponds to the sub-decoding block EVEN00 and EVEN01 of FIG. 4A, and EVEN1 array corresponds to the sub-decoding block EVEN10 and EVEN11 of FIG. 4A. The ODD0 array corresponds to the sub-decoding block ODD00 and ODD01 of FIG. 4A, and ODD1 array corresponds to the sub-decoding block ODD10 and ODD11 of FIG. 4A. The operation between memory cell arrays and corresponding sub-decoding blocks of the column decoder is the same as that of the DDR1-1 operation mode. However, as shown by FIG. 4B, in the DDR2 operation mode, the memory cell array simultaneously transfers four data to the global data line because four column selection signals are activated per unit data input/output (1 DQ) in the DDR2 operation mode. In other words, data to/from memory cell arrays is transferred to global data lines GIO_E0, GIO_E1, GIO_O1 and GIO_O1.

When the column decoder 470 disregards one column address so as to perform the DDR1-1 operation, the memory cell arrays transfer data to two global data lines in response to the column selection signal. When the column decoder 470 disregards two column addresses so as to perform the DDR2 operation, the memory cell arrays transfer data to four global data lines.

FIG. 5B is a block diagram showing memory cell arrays that selectively perform the DDR1-2 mode operation shown in FIG. 4C and the DDR2 mode operation shown in FIG. 4D. Referring to FIG. 5B, EVEN0 array, ODD0 array, EVEN1 array and ODD1 array are consecutively arranged. Each of the arrays has a local data line LIO. The EVEN0 array is connected to a local data line LIO_E0 via a plurality of column selection gates. The local data line LIO_E0 is connected to a global data line GIO_E0 via a first global data selection gate. The EVEN1 array is connected to a local data line LIO_E1 via a plurality of column selection gates. An end of the local data line LIO_E1 is connected to a global data line GIO_E0 via a transistor LIOCQ1_1 that is controlled by an output signal of an inverter INVLIO_1 to which PDDR2 signal is inputted. Another end of the local data line LIO_E1 is connected to a global data line GIO_E1 via a transistor LIOCQ1_2. A gate of the transistor LIOCQ1_2 is connected to an output of an inverter INVLIO_2 that inverts an output of a NAND gate NANDLG1. The NAND gate NANDLG1 receives the signal PLGIOCON and the mode selection signal PDDR2.

The ODD0 array is connected to a local data line LIO_O0 via a plurality of column selection gates. The local data line LIO_O0 is connected to a global data line GIO_O0 via a global data selection gate. The ODD1 array is connected to a local data line LIO_O1 via a plurality of column selection gates. An end of the local data line LIO_O1 is connected to a global data line GIO_O0 via a transistor LIOCQ2_1 that is controlled by an output signal of an inverter INVLIO_3 to which a mode selection signal PDDR2 signal is inputted. Another end of the local data line LIO_O1 is connected to a global data line GIO_O1 via a transistor LIOCQ2_2. A gate of the transistor LIOCQ2_2 is connected to an output of an inverter INVLIO_4 that inverts an output of a NAND gate NANDLG2. The NAND gate NANDLG2 receives the signal PLGIOCON and the mode selection signal PDDR2.

In the DDR1-2 operation mode, since the mode selection signal PDDR2 has a low level, the input signal of the transistors LIOCQ1_1 and LIOCQ2_1 have a high level, so that the transistors LIOCQ1_1 and LIOCQ2_1 are turned on.

Since the transistors LIOCQ1_1 and LIOCQ2_1 are turned on, the local data line LIO_E0 and LIO_E1 shares the global data line GIO_E0. In addition, since the PDDR2 has a low level, the outputs of the NAND gates NANDG1 and NANDG2 have a high level, a low level VSS is applied to the gates of the transistors LIOCQ1_2 and LIOCQ2_2, and transistor LIOCQ1_2 is turned off. Thus, the local data line LIO_E1 is not connected to the global data line GIO_E1. In the same way, the transistor LIOCQ2_2 is turned off, and thus the local data line LIO_O1 is not connected to the global data line GIO_O1.

In the DDR1-2 operation mode, the memory cell arrays of FIG. 5B correspond to the column decoder of FIG. 4C. The 128 column selection lines decoded by the EVEN00 and EVEN01 of FIG. 4C correspond to a plurality of bit lines BL and /BL of the memory cell EVEN0 of FIG. 5B. In addition, the 128 column selection lines decoded by the EVEN10 and EVEN11 of FIG. 4C correspond to a plurality of bit lines BL and /BL of the memory cell EVEN1 of FIG. 5B. When one of the memory cell arrays EVEN0 and EVEN1 is selected and one of the 128 column selection signals corresponding to the selected memory cell array is activated, corresponding column selection gate is turned on in response to one of the 128 column selection signals. When the memory cell array EVEN0 is selected, data on the bit line BL and /BL connected the column selection gate are transferred to the local data line LIO_E0, and are transferred to the global data line GIO_E0 via the global data selection gate that is turned on by the signal PLGIOCON. When the memory cell array EVEN1 is selected, data on the bit line BL and /BL connected the column selection gate are transferred to the local data line LIO_E1, and are transferred to the global data line GIO_E0 via the global data selection gate LIOCQ.

In addition, one of the memory cell arrays ODD0 and ODD1 is selected, and the data of the selected one of the memory cell arrays ODD0 and ODD1 are transferred to the global data line GIO_O0.

Although read operation is described above with reference to FIG. 5B, in a write operation, the data are transferred in a reverse order compared with the read operation. In other words, data are inputted to global data line, are transferred to a local data line, and are transferred to memory cell via a bit line.

In the DDR1-2 operation mode, since the mode selection signal PDDR2 has a high level, the input signal of the transistors LIOCQ1_1 and LIOCQ2_1 have a low level, so that the transistors LIOCQ1_1 and LIOCQ2_1 are turned off. Since the transistors LIOCQ1_1 and LIOCQ2_1 are turned off, the local data line LIO_E0 is connected to the global data line GIO_E0, and the local data line LIO_E1 is connected to the global data line GIO_E1. In addition, the local data line LIO_O0 is connected to the global data line GIO_O0, and the local data line LIO_O1 is connected to the global data line GIO_O1. Since the PDDR2 has a high level, the PLGIOCON signal is applied to the gate of the transistor LIOCQ1_2 via the NAND gate NANDLG1 and the inverter INVLIO_2.

In the DDR2 operation mode, The EVEN0 array corresponds to the sub-decoding block EVEN00 and EVEN01 of FIG. 4D, and EVEN1 array corresponds to the sub-decoding block EVEN10 and EVEN11 of FIG. 4D. The ODD0 array corresponds to the sub-decoding block ODD00 and ODD01 of FIG. 4D, and ODD1 array corresponds to the sub-decoding block ODD10 and ODD11 of FIG. 4D. The operation between memory cell arrays and corresponding sub-decoding blocks of the column decoder is the same as that of the DDR1-1 operation mode. However, as shown in FIG. 4D, in the DDR2 operation mode, the memory cell array simultaneously transfers four data to the global data line because four column selection signals are activated per a unit data input/output (1DQ) in the DDR2 operation mode. In other words, data of memory cell arrays are transferred to global data lines GIO_E0, GIO_E1, GIO_O1 and GIO_O1.

When the column decoder 470 disregards arbitrarily one column address so as to perform the DDR1 operation, the memory cell arrays transfer data to two global data lines in response to the column selection signal. In the DDR1-1 operation mode of FIG. 5A, one of the global data lines GIO_E0 and GIO_E1 is selectively activated and simultaneously one of the global data lines GIO_O0 and GIO_O1 is selectively activated. However, in the DDR1-2 operation mode of FIG. 5B, only the global data lines GIO_E0 and GIO_O0 are activated regardless of the memory cell array. When the column decoder 470 disregards arbitrarily two column addresses so as to perform the DDR2 operation, all of the memory cell arrays are selected and transfer data to four global data lines.

Figure 6:
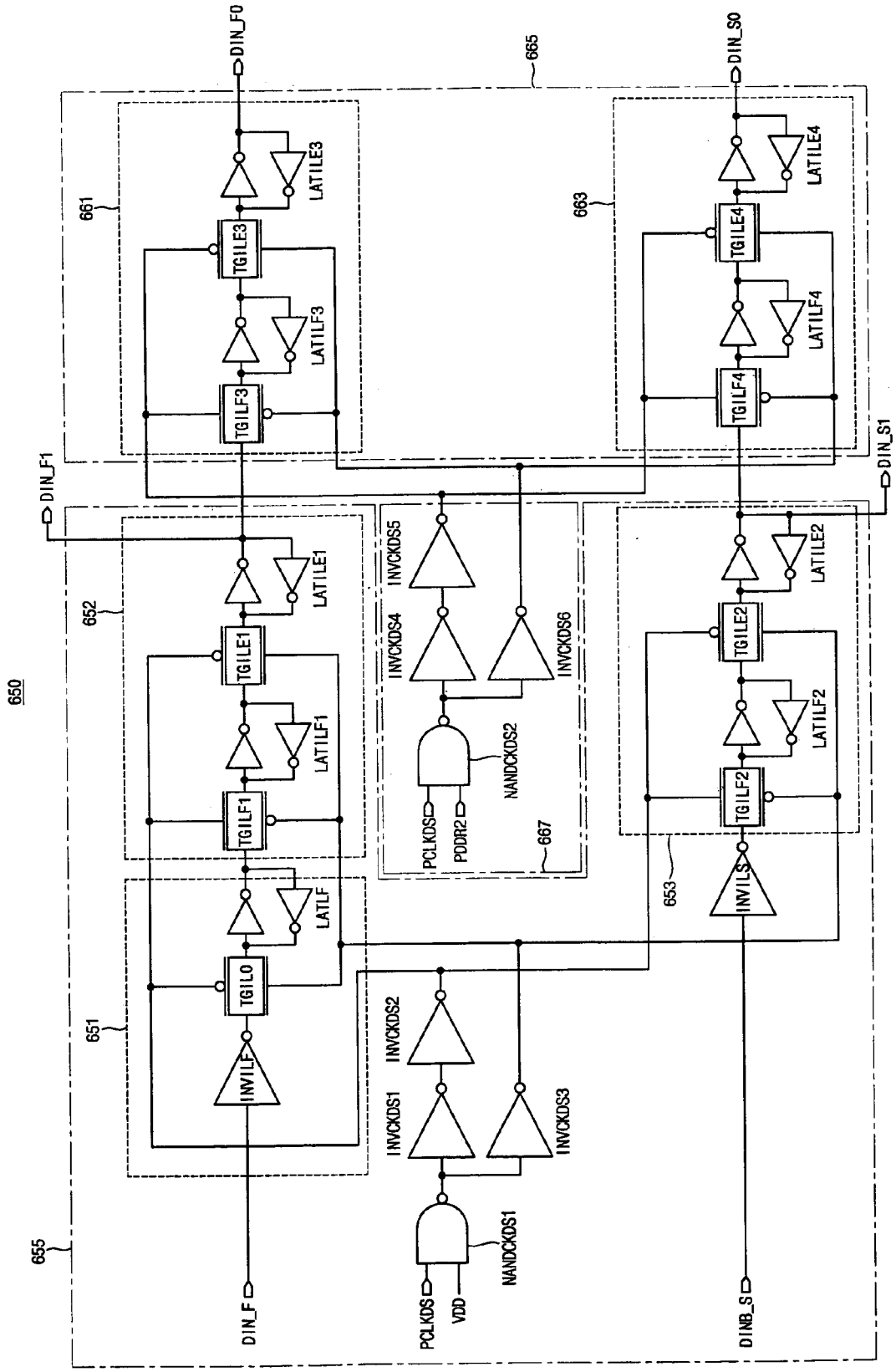
FIG. 6 is a circuit diagram showing an input latch of FIG. 1 according to some embodiments of the present invention.

FIG. 6 is a circuit diagram showing an input latch of FIG. 1. Referring to FIG. 6, the input latch 650 includes a first prefetch circuit 655, a second prefetch circuit 665 and a prefetch control signal generator 667. The first prefetch circuit 655 prefetches two data in response to an internal clock PCLKDS. The second prefetch circuit 665 selectively prefetches an output of the first prefetch circuit 655 in response to a mode selection signal. The prefetch control signal generator 667 controls the second prefetch circuit 665 in response to a mode selection signal.

The data F0, F1, S0 and S1 sampled by the sampling circuit 670 are synchronized with the internal clock PCKLDS and are inputted to terminals DIN_F and DINB_S. The input latch 650 synchronizes the data F0 and S0, which are consecutively inputted thereto, with the clock PCLKDS to simultaneously output the data F0 and S0 in the DDR1 operation mode. The input latch 650 synchronizes the data F0, S0, F1 and S1, which are consecutively inputted thereto, with the clock PCLKDS to simultaneously output the data F0, S0, F1 and S1 in the DDR2 operation mode.

The first prefetch circuit 655 includes a delay circuit 651, a first flip flop 652 and a second flip flop 652. The delay circuit 651 delays data F0 and/or F1 that is inputted to input terminal DIN_F. The first flip flop 652 receives data F0 and/or F1 passed through the delay circuit 651 to prefetch the data F0 and/or F1. The second flip flop 652 receives data S0 and/or S1 that are inputted to input terminal DINB_S, and prefetches the data S0 and/or S1.

The second prefetch circuit 665 includes a third flip flop 661 and a fourth flip flop 663. The third flip flop 661 perfetches an output of the first flip flop 652 in response to a mode selection signal. The fourth flip flop 663 perfetches an output of the second flip flop 653 in response to a mode selection signal.

The prefetch control signal generator 667 disables the third and fourth flip flops 661 and 663 when the mode selection signal designates the DDR1 operation. In addition, the prefetch control signal generator 667 allows the third flip flop 661 to prefetch an output of the first flip flop 652 and allows the fourth flip flop 663 to prefetch an output of the second flip flop 653 when the mode selection signal designates the DDR2 operation.

Figure 7A:
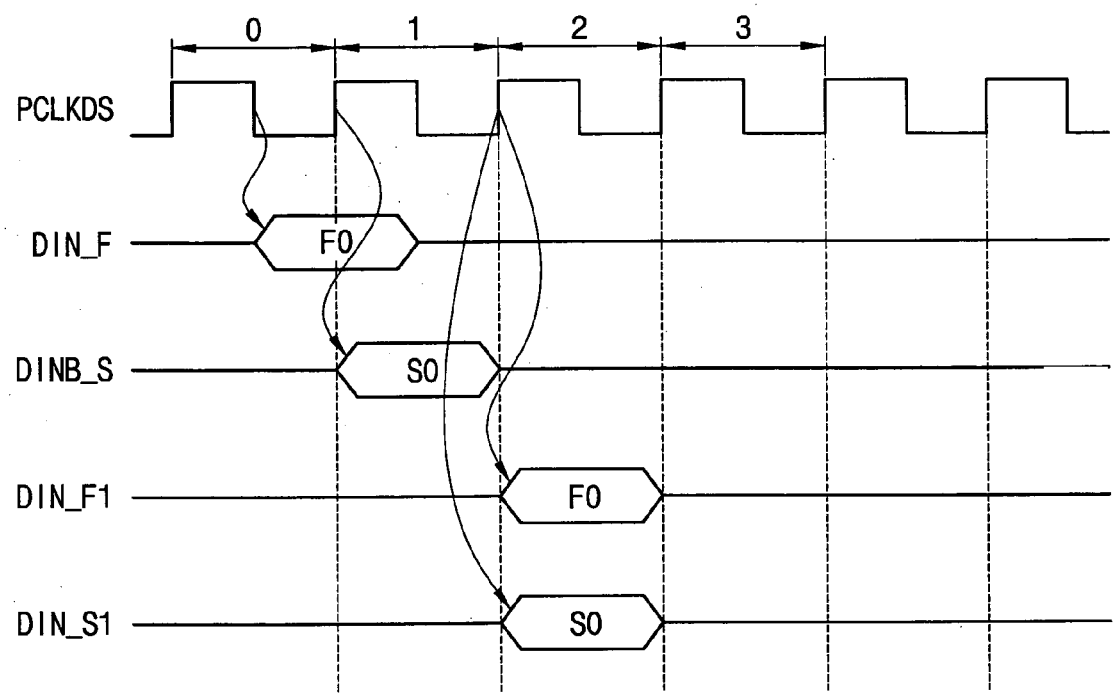
FIGS. 7A and 7B are timing diagrams showing operation of the input latch of FIG. 2 that operates in DDR 1 mode or DDR2 mode according to some embodiments of the present invention.
Figure 7B:
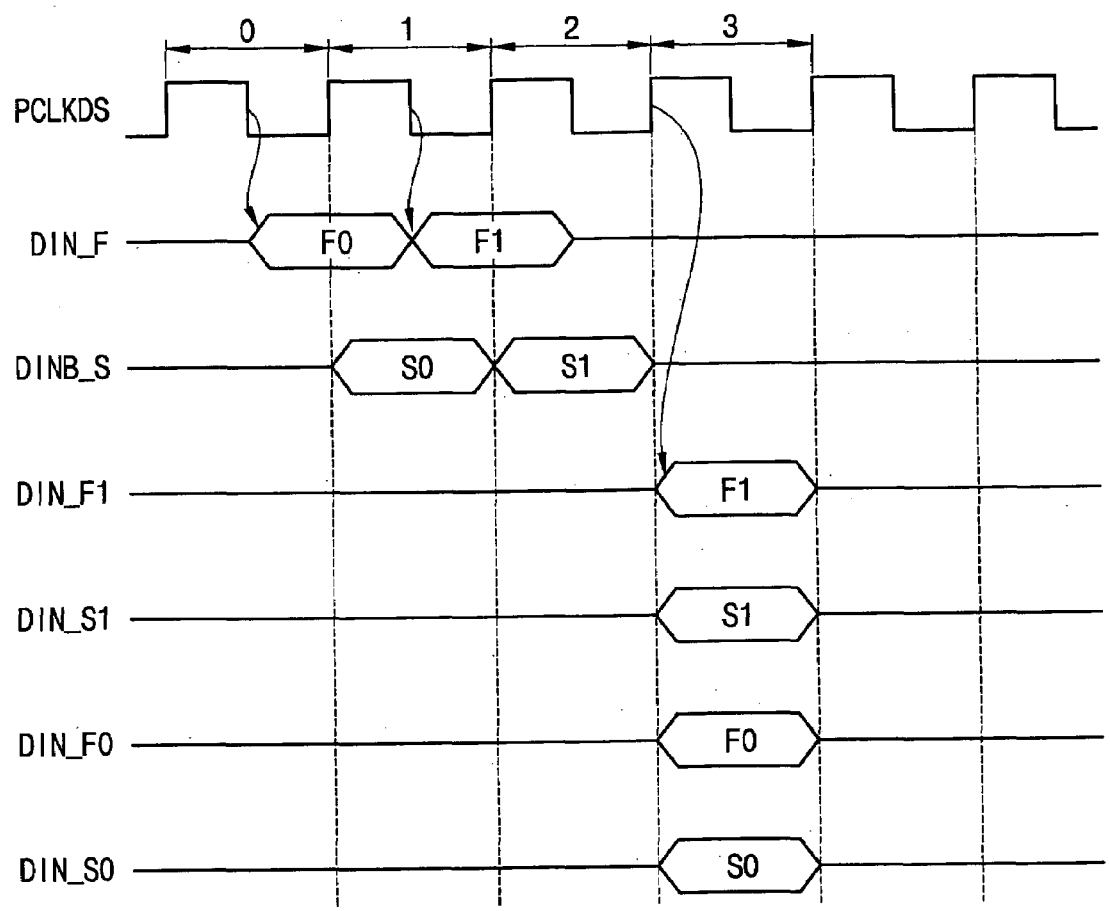

FIGS. 7A and 7B are timing diagrams showing operation of the input latch of FIG. 2 that operates in DDR 1 mode or DDR2 mode. Hereinafter, the DDR1 mode operation of the input latch 650 is described with reference to FIGS. 6 and 7A.

In the DDR1 operation mode, two bursts of data for 1DQ are sampled by the sampling circuit 670, data F0 are inputted to the terminal DIN_F, and data S0 are inputted to the terminal DINB_S. Since the clock PCLKDS is inputted to an input terminal of a NAND gate NANDCKDS1 and a high level signal such as VDD is inputted to another input terminal of the NAND gate NANDCKDS1, an output signal that pass through inverters INVCKDS1 and INVCKDS2 corresponds to an inverted clock /PCLKDS. In addition, an output signal of an inverter INVCKDS3 is a clock having the same phase as the clock PCLKDS when the delays of the NAND gate NANDCKDS1 and the inverter INVCKDS3 are disregarded.

The data F0 are synchronized with a falling edge of the clock PCLKDS in a period '0' to be inputted to the terminal DIN_F, and are inputted to a transmission gate TGIL0 via an inverter INVILF. The transmission gate TGIL0 is turned on in response to a high level of the clock PCLKDS and is turned off in response to a low level of the clock PCLKDS, so that the transmission gate TGIL0 samples the data F0 at a rising edge of the clock PCLKDS in a period '1' and a latch LATLF latches the data F0. The transmission gate TGILF1 is turned on in response to a low level of the clock PCLKDS and is turned off in response to a high level of the clock PCLKDS, so that the transmission gate TGILF1 samples the data F0 latched at the latch LATLF at a falling edge of the clock PCLKDS in a period '1'. A latch LATILF1 latches the data F0 sampled by the transmission gate TGILF1. The transmission gate TGILE1 is turned on in response to a high level of the clock PCLKDS and is turned off in response to a low level of the clock PCLKDS, so that the transmission gate TGILE1 samples the data F0 at a rising edge of the clock PCLKDS in a period '2', a latch LATILKE latches the data F0, and the latched data F0 are outputted to an output terminal DIN_F1. Thus, the data F0 are synchronized with a rising edge of the clock PCLKDS in the period '2' to be outputted.

In addition, in the DDR1 operation mode, since the mode selection signal PDDR2 has a low level, the clock PCLKDS does not transferred through the NAND gate NANDCKDS2 of the prefetch control signal generator 667. The data S0 are synchronized with a rising edge of the clock PCLKDS in the period '1' to be inputted the terminal DINB_S, and are inputted to the transmission gate TGILF2 via an inverter INVILS. The transmission gate TGILF2 is turned on in response to a low level of the clock PCLKDS and is turned off in response to a high level of the clock PCLKDS, so that the transmission gate TGILF2 samples the data S0 at a falling edge of the clock PCLKDS in a period '1' and a latch LATILF2 latches the data S0 sampled by the transmission gate TGILF2. The transmission gate TGILE2 is turned on in response to a high level of the clock PCLKDS and is turned off in response to a low level of the clock PCLKDS, so that the transmission gate TGILE2 samples the data S0 latched at the latch LATILF2 at a rising edge of the clock PCLKDS in a period '2'. A latch LATILE2 latches the data S0 sampled by the transmission gate TGILE2, and the latched data S0 are outputted to an output terminal DIN_S1. Thus, the data S0 are synchronized with a rising edge of the clock PCLKDS in the period '2' to be outputted.

Hereinafter, the DDR2 mode operation of the input latch 650 is described with reference to FIGS. 6 and 7B. In the DDR2 operation mode, four burst of data for 1DQ are sampled by the sampling circuit 670, data F0 and F1 are consecutively inputted to the terminal DIN_F, and data S0 and S1 are consecutively inputted to the terminal DINB_S.

In the DDR2 operation mode, the data F0 and F1 are synchronized with the clock PCLKDS to be consecutively inputted to the terminal DIN_F, and are outputted to the terminals DIN_F0 and DIN_F1, respectively. The data F0 are outputted to the terminal DIN_F0 via the first and third flip flops 652 and 661, and data F1 are outputted to the terminal DIN_F1 via the first flip flops 652. In other words, in the DDR2 operation mode, the third and fourth flip flops 661 and 663 samples data and holds the data in response to the clock PCLKDS.

In the DDR2 operation mode, the data F0 and F1 inputted to the terminal DIN_F are transferred via the flip flop 652 in the same way as data F0 in the DDR1 operation mode. However, in the DDR2 operation mode, since the mode selection signal PDDR2 has a high level, the NAND gate NANDCKDS2 of the prefetch control signal generator 667 transfers the clock PCLKDS, the NAND gate NAND-CKDS2 and the inverter INVCKDS4 and INVCKDS5 inverts the clock PCLKDS, the inverted clock /PCLKDS is inputted to the third and fourth flip flops 661 and 663. In addition, the clock signal that is passed through the NAND gate NANDCKDS2 and the inverter INVCKDS6 has the same phase as the clock PCLKDS, and the clock PCLKDS is inputted to the third and fourth flip flops 661 and 663.

The data F0, which are synchronized with the falling edge of the clock PCLKDS in the period '0' to be inputted to terminal DIN_F, are transferred to the inverter INVILF, the transmission gate TGILO, the latch LATIF and the first flip flop 652, are sampled by the transmission gate TGILE1 of the first flip flop 652 at the rising edge of the clock PCLKDS in the period '1', and are latched by the latch LATILE1.

The data F1, which are delayed by one clock cycle with respect to the data F0, are inputted to terminal DIN_F at the falling edge of the clock PCLKDS in the period '1'. The data F1 are sampled by the transmission gate TGIL0 at the rising edge of the clock PCLKDS in the period '2'. The data F1 sampled by the transmission gate TGIL0 are latched by the latch LATILF during a high level of the clock PCLKDS in the period '2'.

The data F0 latched by the latch LATILE1 are sampled by The transmission gate TGILF3 at the falling edge of the clock PCLKDS in the period '2', and are latched by the latch LATIF3 during a low level of the clock PCLKDS in the period '2'. The data F1 latched by the latch LATIF during a high level of the clock PCLKDS in the period '2' are sampled by the transmission gate TGILF1, and are latched by the latch LATILF1 during a low level of the clock PCLKDS in the period '2'.

The data F0 latched by the latch LATILF3 are sampled by the transmission gate TGILE3 at the rising edge of the clock PCLKDS in the period '3', and are outputted to terminal DIN_F0 via the latch LATILE3. The data F1 latched by the latch LATILF1 are sampled at the rising edge of the clock PCLKDS in the period '3', and are outputted to terminal DIN_F1 via the latch LATILE1.

In the DDR2 operation mode, the data S0 and S1 are synchronized with the clock PCLKDS to be consecutively inputted to the terminal DINB_S, and are outputted to the terminals DIN_S0 and DIN_S1, respectively. The data S0 are outputted to the terminal DIN_S0 via the second and fourth flip flops 653 and 663, and data S1 are outputted to the terminal DIN_S1 via the second flip flops 653. In other words, in the DDR2 operation mode, the second and fourth flip flops 653 and 663 samples data and holds the data in response to the clock PCLKDS.

The data S0, which are synchronized with the rising edge of the clock PCLKDS in the period '1' to be inputted to terminal DINB_S, are transferred to the inverter INVILS and the second flip flop 653, are sampled by a transmission gate TGILE2 of the second flip flop 653 at the falling edge of the clock PCLKDS in the period '1', and are latched by the latch LATILE2.

The data S1, which are delayed by one clock cycle with respect to the data S0 to be inputted to the terminal DINB_S, are inputted to terminal DIN_S at the rising edge of the clock PCLKDS in the period '2'. The data S1 are sampled by the transmission gate TGILF2 at the falling edge of the clock PCLKDS in the period '2'. The data S1 sampled by the transmission gate TGILF2 are latched by the latch LATILF2 during a low level of the clock PCLKDS in the period '2'. The data S0 latched by the latch LATILE2 are sampled by the transmission gate TGILF4 at the falling edge of the clock PCLKDS in the period '2', and are latched by the latch LATILF4 during the low level of the clock PCLKDS in the period '4'.

The data S1 latched by the latch LATILF2 during the low level of the clock PCLKDS in the period '2' are sampled by the transmission gate TGILE2 at the rising edge of the clock PCLKDS in the period '3', and are latched by the latch LATILE2 to be outputted to the terminal DIN_S1. The data S0 latched by the latch LATILF4 are sampled by the transmission gate TGILE4 at the rising edge of the clock PCLKDS in the period '3', and are latched by the latch LATILE4 to be outputted to the terminal DIN_S0.

As described above, in the DDR1 operation mode, the data F0 synchronized with the clock PCLKDS are inputted to the terminal DIN_F during a time period, and the data S0 are delayed by a ½ clock cycle to be inputted to the terminal DINB_S. The data F0 are delayed by 3/2 clock cycles at the input latch 650 to be outputted to the terminal DIN_F1, and the data S0 are delayed by one clock cycle at the input latch 650 to be outputted to the terminal DIN_S1. Thus, the data F0 and S0 are synchronized with the clock PCLKDS to be simultaneously outputted, so that the sampling circuit 670 prefetches two bits in the DDR1 operation mode.

In the DDR2 operation mode, the data F0 synchronized with the clock PCLKDS and the data F1 delayed by one clock cycle with respect to the data F0 are inputted to the terminal DIN_F, and the data S0 and the data S1 delayed by one clock cycle with respect to the data S0 are inputted to the terminal DINB_S. The data S0 are delayed by ½ clock cycle with respect to the data F0 to be inputted to the terminal DINB_S, the data S1 are delayed by ½ clock cycle with respect to the data F1 to be inputted to the terminal DIN_F. The data F0 are delayed by 5/2 clock cycles at the input latch 650 to be outputted to the terminal DIN_F0, the data F1 are delayed by 3/2 clock cycles at the input latch 650 to be outputted to the terminal DIN_F1. The data S0 are delayed by 2 clock cycles at the input latch 650 to be outputted to the terminal DIN_S0, and the data S1 are delayed by one clock cycle at the input latch 650 to be outputted to the terminal DIN_S1. Thus, the data F0, F1, S0 and S1 are synchronized with the clock PCLKDS to be simultaneously outputted, so that the sampling circuit 670 prefetches four bits in the DDR2 operation mode.

Figure 8:
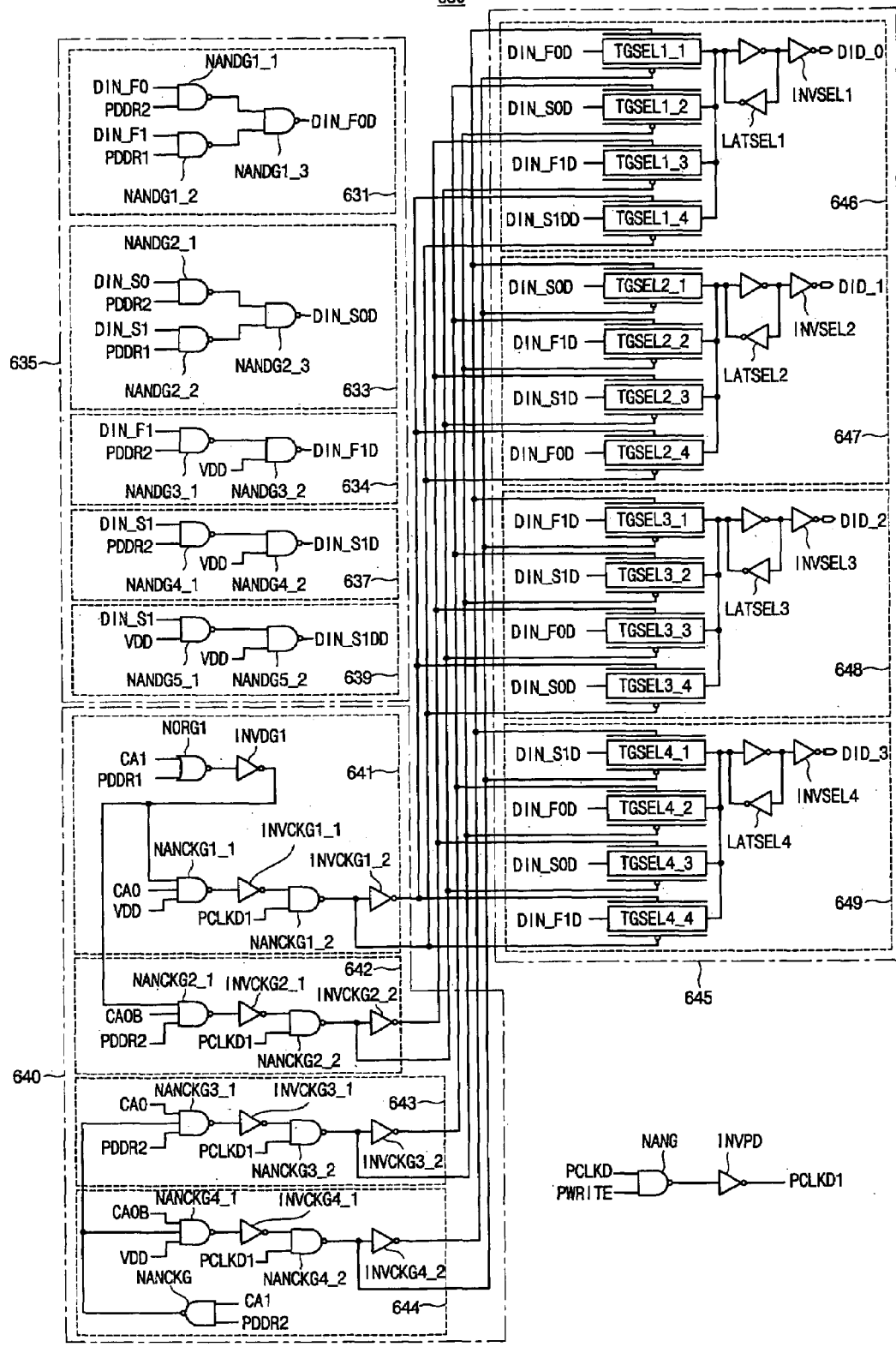
FIG. 8 is a circuit diagram showing an input ordering circuit of FIG. 1 according to some embodiments of the present invention.

FIG. 8 is a circuit diagram showing an input ordering circuit of FIG. 1. Referring to FIG. 8, the input ordering circuit 630 includes ordering input generating circuit 635, a control signal generating circuit 640 and a data selecting circuit 645. The control signal generating circuit 640 generates a control signal for controlling a transmission gate of the data selecting circuit 645 based on the column address CAi.

The data selecting circuit 645 selects ordering input data generated from the ordering input generating circuit 635 in response to the control signal generated from the control signal generating circuit 640, and outputs the selected ordering input data via the lines DID_0, DID_1, DID_2, and DID_3.

The ordering input generating circuit 635 includes a first input generating circuit 631, a second input generating circuit 633, a third input generating circuit 634, a fourth input generating circuit 637, and a fifth input generating circuit 639.

The first input generating circuit 631 selects data that are firstly inputted to the input latch 650 in response to the mode selection signals PDDR1 or PDDR2. The second input generating circuit 633 selects data that are secondly inputted to the input latch 650 in response to the mode selection signals PDDR1 or PDDR2. The third input generating circuit 634 selects data that are thirdly inputted to the input latch 650 in response to the mode selection signals PDDR1 or PDDR2, or data selection is prevented depending upon the mode selection signals PDDR1 or PDDR2. In addition, the fourth input generating circuit 637 selects data that are fourthly inputted to the input latch 650 in response to the mode selection signals PDDR1 or PDDR2, or data selection is prevented depending upon the mode selection signals PDDR1 or PDDR2. The fifth input generating circuit 639 selects data that is lastly inputted to the input latch 650 regardless of the mode selection signals PDDR1 or PDDR2.

The first input generating circuit 631 includes NAND gates NANDG1_1, NANDG1_2, and NANDG1_3. The NANDG1_1 receives data of DIN_F0 (one of the output terminals of the input latch 650) and the mode selection signal PDDR2. The NANDG1_2 receives data of DIN_F1 (one of the output terminals of the input latch 650) and the mode selection signal PDDR1. The NANDG1_3 receives the outputs of the NANDG1_1 and the NANDG1_2. In DDR1 operation mode, the first input generating circuit 631 selects the data of the DIN_F1 to output the selected data to a line DIN_F0D. In addition, in DDR2 operation mode, the first input generating circuit 631 selects the data of the DIN_F0 to output the selected data to a line DIN_F0D.

The second input generating circuit 633 includes NAND gates NANDG2_1, NANDG2_2, and NANDG2_3. The NANDG2_1 receives data of DIN_S0 (one of the output terminals of the input latch 650) and the mode selection signal PDDR2. The NANDG2_2 receives data of DIN_S1 (one of the output terminals of the input latch 650) and the mode selection signal PDDR1. The NANDG2_3 receives the outputs of the NANDG2_1 and the NANDG2_2. In DDR1 operation mode, the second input generating circuit 633 selects the data of the DIN_S1 to output the selected data to a line DIN_S0D. In addition, in DDR2 operation mode, the second input generating circuit 633 selects the data of the DIN_S0 to output the selected data to a line DIN_S0D.

The third input generating circuit 634 includes NAND gates NANDG3_1 and NANDG3_2. The NANDG3_1 receives data of DIN_F0 (one of the output terminals of the input latch 650) and the mode selection signal PDDR2. The NANDG3_2 receives the output of the NANDG3_1 and VDD (or a high level voltage). In DDR2 operation mode, the third input generating circuit 634 selects the data of the DIN_F1 to output the selected data to a line DIN_F1D. In addition, in DDR1 operation mode, the third input generating circuit 634 outputs a low level signal to the line DIN_F1D since the third input generating circuit 634 does not select the data of the DIN_F1.

The fourth input generating circuit 637 includes NAND gates NANDG4_1 and NANDG4_2. The NANDG4_1 receives data of DIN_S1 (one of the output terminals of the input latch 650) and the mode selection signal PDDR2. The NANDG4_2 receives the output of the NANDG4_1 and VDD (or a high level voltage). In DDR2 operation mode, the fourth input generating circuit 637 selects the data of the DIN_S1 to output the selected data to a line DIN_S1D. In addition, in DDR1 operation mode, the fourth input generating circuit 637 outputs a low level signal to the line DIN_S1D since the fourth input generating circuit 637 does not select the data of the DIN_S1.

The fifth input generating circuit 639 includes NAND gates NANDG5_1 and NANDG5_2. The NANDG5_1 receives data of DIN_S1 (one of the output terminals of the input latch 650) and VDD. The NANDG5_2 receives the output of the NANDG5_1 and VDD (or a high level voltage). The fifth input generating circuit 639 selects the data of the DIN_S1 to output the selected data to a line DIN_S1DD regardless of DDR1 or DDR2 operation mode.

The control signal generating circuit 640 includes a first control signal generating circuit 641, a second control signal generating circuit 642, a third control signal generating circuit 643 and a fourth control signal generating circuit 644.

The first control signal generating circuit 641 includes a NOR gate NORG1, an inverter INVDG1, a NAND gate NANCKG1_1, an inverter INVCKG1_1, a NAND gate NANCKG1_2 and an inverter INVCKG1_2.

The NOR gate NORG1 receives the column address CA1 output from the column predecoder 450 and the mode selection signal PDDR1. The inverter INVDG1 receives an output of the NOR gate NORG1. The NAND gate NANCKG1_1 receives the column address CA0 output from the column predecoder 450, an output of the inverter INVDG1 and VDD (or an high level voltage). An output of the NAND gate NANCKG1_1 is provided to the NAND gate NANCKG1_2 via the inverter INVCKG1_1. The NAND gate NANCKG1_2 receives a signal PCLKD1 as an another input signal. An output of a NAND gate NANG, to which the internal clock signal PCLKD and the write command PWRITE are inputted, is inverted by an inverter INVPD so that the PCLKD1 is generated. An output of the NAND gate NANCKG1_2 is inputted to the data selecting circuit 645. An output of the inverter INVCKG1_2 is also provided to the data selecting circuit 645. The NAND gate NANG inverts the PCLKD signal when the write command PWRITE is inputted thereto, transfers the inverted PCLKD signal to the inverter INVPD, and transfers the PCLKD1 signal to the NAND gate NANCKG1_2.

The second control signal generating circuit 642 includes the NOR gate NORG1, the inverter INVDG1, a NAND gate NANCKG2_1, an inverter INVCKG2_1, a NAND gate NANCKG2_2 and an inverter INVCKG2_2. The second control signal generating circuit 642 may share the NOR gate NORG1 and the inverter INVDG1 with the first control signal generating circuit 641. Alternately, the second control signal generating circuit 642 may have the NOR gate NORG1 and the inverter INVDG1 independently of the first control signal generating circuit 641.

The NOR gate NORG1 receives the column address CA1 output from the column predecoder 450 and the mode selection signal PDDR1. The inverter INVDG1 receives the output of the NOR gate NORG1. The NAND gate NANCKG2_1 receives a CA0B that is generated by inverting the column address CA0 output from the column predecoder 450, the output of the inverter INVDG1 and the mode selection signal PDDR2. An output of the NAND gate NANCKG2_1 is provided to the NAND gate NANCKG2_2 via the inverter INVCKG2_1. The NAND gate NANCKG2_2 receives the signal PCLKD1 as an another input signal. An output of the NAND gate NANCKG2_2 is inputted to the data selecting circuit 645. An output of the inverter INVCKG2_2 is also provided to the data selecting circuit 645. The NAND gate NANG inverts the PCLKD signal when the write command PWRITE is inputted thereto, transfers the inverted PCLKD signal to the inverter INVPD, and transfers the PCLKD1 signal to the NAND gate NANCKG2_2.

The third control signal generating circuit 643 includes a NAND gate NANCKG, a NAND gate NANCKG3_1, an inverter INVCKG3_1, a NAND gate NANCKG3_2 and an inverter INVCKG3_2. The NAND gate NANCKG receives the column address CA1 output from the column predecoder 450 and the mode selection signal PDDR2. The NAND gate NANCKG3_1 receives an output of the NAND gate NANCKG, the column address CA0 output from the column predecoder 450, and the mode selection signal PDDR2. An output of the NAND gate NANCKG3_1 is provided to the NAND gate NANCKG3_2 via the inverter INVCKG3_1. The NAND gate NANCKG3_2 receives the signal PCLKD1 as an another input signal. An output of the NAND gate NANCKG3_2 is inputted to the data selecting circuit 645. An output of the inverter INVCKG3_2 is also provided to the data selecting circuit 645. The NAND gate NANG inverts the PCLKD signal when the write command PWRITE is inputted thereto, transfers the inverted PCLKD signal to the inverter INVPD, and transfers the PCLKD1 signal to the NAND gate NANCKG3_2.

The fourth control signal generating circuit 644 includes the NAND gate NANCKG, a NAND gate NANCKG4_1, an inverter INVCKG4_1, a NAND gate NANCKG4_2 and an inverter INVCKG2_2. The fourth control signal generating circuit 644 may share the NAND gate NANCKG with the third control signal generating circuit 643. Alternately, the fourth control signal generating circuit 644 may have the NAND gate NANCKG independently of the third control signal generating circuit 643.

The NAND gate NANCKG receives the column address CA1 output from the column predecoder 450 and the mode selection signal PDDR2. The NAND gate NANCKG4_1 receives an output of the NAND gate NANCKG, the CA0B that is generated by inverting the column address CA0 output from the column predecoder 450, and VDD (or a high level voltage). An output of the NAND gate NANCKG4_1 is provided to the NAND gate NANCKG4_2 via the inverter INVCKG4_1. The NAND gate NANCKG4_2 receives the signal PCLKD1 as an another input signal. An output of the NAND gate NANCKG4_2 is inputted to the data selecting circuit 645. An output of the inverter INVCKG4_2 is also provided to the data selecting circuit 645. The NAND gate NANG inverts the PCLKD signal when the write command PWRITE is inputted thereto, transfers the inverted PCLKD signal to the inverter INVPD, and transfers the PCLKD1 signal to the NAND gate NANCKG4_2.

The data selecting circuit 645 includes a first data selecting circuit 646, a second data selecting circuit 647, a third data selecting circuit 648, and a fourth data selecting circuit 649. The first data selecting circuit 646 includes transmission gates TGSEL1_1, TGSEL1_2, TGSEL1_3, TGSEL1_4, a latch LATSEL1 and an inverter INVSEL1. The transmission gate TGSEL1_1 receives a control signal from the fourth control signal generating circuit 644. The transmission gate TGSEL1_2 receives a control signal from the third control signal generating circuit 643. The transmission gate TGSEL1_3 receives a control signal from the second control signal generating circuit 644. The transmission gate TGSEL1_4 receives a control signal from the first control signal generating circuit 641. The latch LATSEL1 is commonly coupled to the transmission gates TGSEL1_1, TGSEL1_2, TGSEL1_3, and TGSEL1_4. The inverter INVSEL1 inverts an output of the latch LATSEL1.

A line DIN_FOD of the first input generating circuit 631 is coupled to the transmission gate TGSEL1_1, and a line DIN_SOD of the second input generating circuit 633 is coupled to the transmission gate TGSEL1_2. A line DIN_FID of the third input generating circuit 634 is coupled to the transmission gate TGSEL1_3, and the line DIN_SIDD of the fifth input generating circuit 637 is coupled to the transmission gate TGSEL1_4.

The second data selecting circuit 647 includes transmission gates TGSEL2_1, TGSEL2_2, TGSEL2_3, TGSEL2_4, a latch LATSEL2 and an inverter INVSEL2. The transmission gate TGSEL2_1 receives a control signal from the fourth control signal generating circuit 644. The transmission gate TGSEL2_2 receives a control signal from the third control signal generating circuit 643. The transmission gate TGSEL2_3 receives a control signal from the second control signal generating circuit 644. The transmission gate TGSEL2_4 receives a control signal from the first control signal generating circuit 641. The latch LATSEL2 is commonly coupled to the transmission gates TGSEL2_1, TGSEL2_2, TGSEL2_3, and TGSEL2_4. The inverter INVSEL2 inverts an output of the latch LATSEL2.

The line DIN_SOD of the second input generating circuit 633 is coupled to the transmission gate TGSEL2_1, and the line DIN_FID of the third input generating circuit 634 is coupled to the transmission gate TGSEL2_2. The line DIN_SID of the fourth input generating circuit 637 is coupled to the transmission gate TGSEL2_3, and the line DIN_FOD of the first input generating circuit 631 is coupled to the transmission gate TGSEL2_4.

The third data selecting circuit 648 includes transmission gates TGSEL3_1, TGSEL3_2, TGSEL3_3, TGSEL3_4, a latch LATSEL3 and an inverter INVSEL3. The transmission gate TGSEL3_1 receives the control signal from the fourth control signal generating circuit 644. The transmission gate TGSEL3_2 receives the control signal from the third control signal generating circuit 643. The transmission gate TGSEL3_3 receives the control signal from the second control signal generating circuit 644. The transmission gate TGSEL3_4 receives the control signal from the first control signal generating circuit 641. The latch LATSEL3 is commonly coupled to the transmission gates TGSEL3_1, TGSEL3_2, TGSEL3_3, and TGSEL3_4. The inverter INVSEL3 inverts an output of the latch LATSEL3.

The line DIN_FID of the third input generating circuit 634 is coupled to the transmission gate TGSEL3_1, and the line DIN_SID of the fourth input generating circuit 637 is coupled to the transmission gate TGSEL3_2. The line DIN_FOD of the first input generating circuit 631 is coupled to the transmission gate TGSEL3_3, and the line DIN_SOD of the second input generating circuit 633 is coupled to the transmission gate TGSEL3_4.

The fourth data selecting circuit 649 includes transmission gates TGSEL4_1, TGSEL4_2, TGSEL4_3, TGSEL4_4, a latch LATSEL4 and an inverter INVSEL4. The transmission gate TGSEL4_1 receives the control signal from the fourth control signal generating circuit 644. The transmission gate TGSEL4_2 receives the control signal from the third control signal generating circuit 643. The transmission gate TGSEL4_3 receives the control signal from the second control signal generating circuit 644. The transmission gate TGSEL4_4 receives the control signal from the first control signal generating circuit 641. The latch LATSEL4 is commonly coupled to the transmission gates TGSEL4_1, TGSEL4_2, TGSEL4_3, and TGSEL4_4. The inverter INVSEL4 inverts an output of the latch LATSEL4.

The line DIN_SID of the fourth input generating circuit 637 is coupled to the transmission gate TGSEL4_1, and the line DIN_FOD of the first input generating circuit 631 is coupled to the transmission gate TGSEL4_2. The line DIN_SOD of the second input generating circuit 633 is coupled to the transmission gate TGSEL4_3, and the line DIN_FID of the third input generating circuit 634 is coupled to the transmission gate TGSEL4_4.

FIGS. 9A and 9B are tables illustrating operation of the input ordering circuit of FIG. 8. Hereinafter, the operation of the input ordering circuit 630 is explained with reference to FIGS. 8 and 9A. In the DDR1 operation mode, the mode selection signal PDDR1 has a high level, and the mode selection signal PDDR2 has a low level. Since the mode selection signal PDDR1 has a low level, the second and third control signal generating circuits 642 and 643 do not transfer input signals that are inputted thereto. Namely, the outputs of the NAND gates NANCKG2_1 and NANCKG3_1 have a high level regardless of the input signals, and the transmission gates of the data selecting circuit 645 are turned off because the outputs of the second and third control signal generating circuits 642 and 643 are inputted to the control electrode of The transmission gates of the data selecting circuit 645.

When the PWRITE is activated, the NAND gate NANG transfers the internal clock PCLKD to the input terminals of the NAND gates NANCKG1_2, NANCKG2_2, NANCKG3_2 and NANCKG4_2 of the control signal generating circuit 640 via the inverter INVPD. Since the second and third control signal generating circuits 642 and 643 do not control the transmission gates of the data selecting circuit 645, the NAND gates NANCKG1_2 and NANCKG4_2 operate in response to the PCKLD1.

Since the PDDR1 having a high level is inputted to the NOR gate NORG1 of the first and second control signal generating circuits 641 and 642, the NOR gates NORG1 does not transfer the output CA1 of the column predecoder 450, and provides a high level to the NAND gates NANCKG1_1 and NANCKG2_1. In the DDR1 operation mode, since the output of the NAND gate NANCKG2_1 has a high level, the NOR gate NORG1 does not affect the NAND gate NANCKG2_1.

In addition, since the PDDR2, which is inputted to the NAND gates NANCKG3_1 and 4_1 of the third and fourth control signal generating circuits 643 and 644, has a low level in the DDR1 operation mode, the NAND gates NANCKG3_1 and 4_1 has a high level regardless of the CA1 signal. The high level of the outputs of the NAND gates NANCKG3_1 and 4_1 is inputted to the NAND gate NANCKG3_1 of the third control signal generating circuit 643 via the inverters INVCKG3_1 and INVCKG4_1, respectively and also is inputted to the NAND gate NANCKG4_1 of the fourth control signal generating circuit 644. In the DDR1 operation mode, since the third control signal generating circuit 643 does not control the transmission gates of the data selecting circuit 645, the operation of the NAND gate NANCKG3_1 is meaningless in the DDR1 operation mode.

When the CA0 has a low level in the DDR1 operation mode, the output of the NAND gate NANCKG4_1 of the fourth control signal generating circuit 644 has a low level, and is inputted to the NAND gate NANCKG4_2 via the inverter INVCKG4_1. The CA0 having the low level is transferred to the inverter INVCKG4_2 during the high level period of the PCLKD1 that is inputted to the NAND gate NANCKG4_2, and the transmission gate TGSEL1_1 of the first data selecting circuit 646, the transmission gate TGSEL2_1 of the second data selecting circuit 647, the transmission gate TGSEL3_1 of the third data selecting circuit 648, the transmission gate TGSEL4_1 of the fourth data selecting circuit 649 are turned on.

In the DDR1 operation mode, the first input generating circuit 631 selects the line DIN_F1. Namely, since the PDDR2 has a low level, the output of the NAND gate NANDG1_1 has a high level regardless of other input signal that are inputted thereto. In addition, since the PDDR1 has a high level, the output of NAND gate NANDG1_2 has an inverted value of the data of the line DIN_F1. Since one of the input signals of the NAND gate NANDG3_1 corresponds to the high level output of the NAND gate NANDG1_1, the NAND gate NANDG1_3 transfers the data of the line DIN_F1 to the line DIN_F0D.

The second input generating circuit 633 selects the line DIN_S1. Namely, since the PDDR2 has a low level, the output of the NAND gate NANDG2_1 has a high level regardless of other input signal that are inputted thereto. In addition, since the PDDR1 has a high level, the output of NAND gate NANDG2_2 has an inverted value of the data of the line DIN_S1. Since one of the input signals of the NAND gate NANDG2_3 corresponds to the high level output of the NAND gate NANDG2_1, the NAND gate NANDG2_3 transfers the data of the line DIN_S1 to the line DIN_S0D.

The third input generating circuit 634 does not select any of the output lines of the input latch 650 since the third input generating circuit 634 outputs a low level to the line DIN_F1D regardless of the data of the line DIN_F1 due to the low level of the PDDR2.

The fourth input generating circuit 637 does not select any of the output lines of the input latch 650 since the fourth input generating circuit 637 outputs a low level to the line DIN_S1D regardless of the data of the line DIN_S1 due to the low level of the PDDR2.

The fifth input generating circuit 639 selects the line DIN_S1. Namely, the NAND gate NANDG5_1 receives the data of the line DIN_S1 and VDD, and the NAND gate NANDG5_2 receives the output of the NAND gate NANDG5_1 and VDD. The fifth input generating circuit 639 transfers the data of the line DIN_S1 to the line DIN_S1DD.

As described above, when the CA0 has the low level in the DDR1 operation mode, the transmission gate TGSEL1_1 of the first data selecting circuit 646, the transmission gate TGSEL2_1 of the second data selecting circuit 647, the transmission gate TGSEL3_1 of the third data selecting circuit 648, and the transmission gate TGSEL4_1 of the fourth data selecting circuit 649 are turned on.

Thus, the data, which corresponds to the data of the line DIN_F0D, of the line DIN_F1 of the input latch 650 are transferred to the output line DID_0 of the first data selecting circuit 646. Since the data F0, as shown in FIG. 7, is transferred to the line DIN_F1, the data F0 is transferred to the line DID_0 when the CA0 has a low level.

In addition, the data, which corresponds to the data of the line DIN_S0D, of the line DIN_S1 of the input latch 650 are transferred to the output line DID_1 of the second data selecting circuit 647. Since the data S0, as shown in FIG. 7, is transferred to the line DIN_S1, the data S0 is transferred to the line DID_1 when the CA0 has a low level.

Data are not outputted to the output line DID_3 of the third data selecting circuit 648 and the output line DID_4 of the fourth data selecting circuit 649 since data are not transferred to the lines DIN_S1D and DIN_F1D and the lines DIN_S1D and DIN_F1D have low levels.

When the CA0 has a high level in the DDR1 operation mode, the output of the NAND gate NANCKG1_1 of the first control signal generating circuit 641 has a low level, and is inputted to the NAND gate NANCKG1_2 via the inverter INVCKG1_1. The CA0 having the high level is transferred to the inverter INVCKG1_2 during the high level period of the PCLKD1 that is inputted to the NAND gate NANCKG1_2, and the transmission gate TGSEL1_4 of the first data selecting circuit 646, the transmission gate TGSEL2_4 of the second data selecting circuit 647, the transmission gate TGSEL3_4 of the third data selecting circuit 648, the transmission gate TGSEL4_4 of the fourth data selecting circuit 649 are turned on.

A terminal of the transmission gate TGSEL1_4 of the first data selecting circuit 646 is connected to the line DIN_S1DD, and the line DIN_S1DD is connected to the line DIN_S1 of the fifth input generating circuit 639. Since the data S0 are transferred to the line DIN_S1 in the DDR1 operation mode, the data S0 are outputted to the line DID_0 when the CA0 has a high level.

A terminal of the transmission gate TGSEL2_4 of the second data selecting circuit 647 is connected to the line DIN_F0D, and the line DIN_F0D is connected to the line DIN_F1 of the first input generating circuit 631. Since the data F0 are transferred to the line DIN_F1 in the DDR1 operation mode, the data F0 are outputted to the line DID_1 when the CA0 has a high level.

Data are not outputted to the output line DID_3 of the third data selecting circuit 648 and the output line DID_4 of the fourth data selecting circuit 649 since data are not transferred to the lines DIN_S0D and DIN_F1D and the lines DIN_S0D and DIN_F1D have low levels.

FIG. 9B is a table illustrating DDR2 operation of the input ordering circuit of FIG. 8. Hereinafter, the DDR2 operation of the input ordering circuit 630 is explained with reference to FIGS. 8 and 9B. In the DDR2 operation mode, the transmission gates of the data selecting circuit 645 are controlled based on the CAi that is disregarded during a column decoding operation. The transmission gates of the data selecting circuit 645 are turned on or turned off based on the logical combination the CA0 and CA1 that are disregarded during the column decoding operation.

In the DDR2 operation mode, since the PDDR2 has a high level, the first input generating circuit 631 of the ordering input generating circuit 635 selects the line DIN_F0 of the input latch 650. Thus, the line DIN_F1 is connected to the DIN_F0D. Since the second input generating circuit 633 selects the line DIN_S0 of the input latch 650, the line DIN_S0 is connected to the DIN_S0D. Since the third input generating circuit 634 selects the line DIN_F1 of the input latch 650, the line DIN_F1 is connected to the DIN_F1D. Since the fourth input generating circuit 637 selects the line DIN_S1 of the input latch 650, the line DIN_S1 is connected to the DIN_S1D. Since the fifth input generating circuit 639 selects the line DIN_S1 of the input latch 650, the line DIN_S1 is connected to the DIN_S1DD.

When the CA0 and CA1 have a low level in the DDR2 operation mode, the output of the NAND gate NANCKG4_1 of the fourth control signal generating circuit 644 has a low level, controls the NMOS of the corresponding transmission gate through the inverter INVCKG4_1, the NAND gate NANCKG4_2 and the inverter INVCKG4_2, and controls the PMOS of the corresponding transmission gate through the inverter INVCKG4_1, the NAND gate NANCKG4_1 and the NAND gate NANCKG4_2. Thus, the transmission gate TGSEL1_4 of the first data selecting circuit 646, the transmission gate TGSEL2_4 of the second data selecting circuit 647, the transmission gate TGSEL3_4 of the third data selecting circuit 648, and the transmission gate TGSEL4_4 of the fourth data selecting circuit 649 are turned on.

A terminal of the transmission gate TGSEL1_1 of the first data selecting circuit 646 is connected to the line DIN_F0D, and the line DIN_F0D is connected to the line DIN_F0 of the first input generating circuit 631. Since the data F0 are transferred to the line DIN_F0 in the DDR2 operation mode, the data F0 are outputted to the line DID_0 when the CA0 and the CA1 have a low level.

A terminal of the transmission gate TGSEL2_1 of the second data selecting circuit 647 is connected to the line DIN_S0D, and the line DIN_S0D is connected to the line DIN_S0 of the second input generating circuit 633. Since the data S0 are transferred to the line DIN_S0 in the DDR2 operation mode, the data S0 are outputted to the line DID_1 when the CA0 and the CA1 have a low level.

A terminal of the transmission gate TGSEL3_1 of the third data selecting circuit 648 is connected to the line DIN_F1D, and the line DIN_F1D is connected to the line DIN_F1 of the third input generating circuit 634. Since the data F1 are transferred to the line DIN_F1 in the DDR2 operation mode, the data F1 are outputted to the line DID_2 when the CA0 and the CA1 have a low level.

A terminal of the transmission gate TGSEL4_1 of the fourth data selecting circuit 649 is connected to the line DIN_S1D, and the line DIN_S1D is connected to the line DIN_S1 of the fourth input generating circuit 637. Since the data S1 are transferred to the line DIN_S1 in the DDR2 operation mode, the data S1 are outputted to the line DID_3 when the CA0 and the CA1 have a low level.

When the CA0 and CA1 have a low level in the DDR2 operation mode, the output of the NAND gate NANCKG3_1 of the third control signal generating circuit 643 has a low level, controls the NMOS of the corresponding transmission gate through the inverter INVCKG3_1, the NAND gate NANCKG3_2 and the inverter INVCKG3_2, and controls the PMOS of the corresponding transmission gate through the inverter INVCKG3_1, the NAND gate NANCKG3_1 and the NAND gate NANCKG3_2. Thus, the transmission gate TGSEL1_2 of the first data selecting circuit 646, the transmission gate TGSEL2_2 of the second data selecting circuit 647, the transmission gate TGSEL3_2 of the third data selecting circuit 648, and the transmission gate TGSEL4_2 of the fourth data selecting circuit 649 are turned on.

A terminal of the transmission gate TGSEL1_2 of the first data selecting circuit 646 is connected to the line DIN_S0D, and the line DIN_S0D is connected to the line DIN_S0 of the second input generating circuit 633. Since the data S0 are transferred to the line DIN_S0 in the DDR2 operation mode, the data S0 are outputted to the line DID_0 when the CA0 and the CA1 have a low level.

A terminal of the transmission gate TGSEL2_2 of the second data selecting circuit 647 is connected to the line DIN_F1D, and the line DIN_F1D is connected to the line DIN_F1 of the third input generating circuit 634. Since the data F1 are transferred to the line DIN_F1 in the DDR2 operation mode, the data F1 are outputted to the line DID_1 when the CA0 and the CA1 have a low level.

A terminal of the transmission gate TGSEL3_2 of the third data selecting circuit 648 is connected to the line DIN_S1D, and the line DIN_S1D is connected to the line DIN_S1 of the fourth input generating circuit 637. Since the data S1 are transferred to the line DIN_S1 in the DDR2 operation mode, the data S1 are outputted to the line DID_2 when the CA0 and the CA1 have a low level.

A terminal of the transmission gate TGSEL4_2 of the fourth data selecting circuit 649 is connected to the line DIN_F0D, and the line DIN_F0D is connected to the line DIN_F0 of the first input generating circuit 631. Since the data F0 are transferred to the line DIN_F0 in the DDR2 operation mode, the data F0 are outputted to the line DID_3 when the CA0 and the CA1 have a low level.

When the CA0 and CA1 have a low level in the DDR2 operation mode, the output of the NAND gate NANCKG2_1 of the second control signal generating circuit 642 has a low level, controls the NMOS of the corresponding transmission gate through the inverter INVCKG2_1, the NAND gate NANCKG2_2 and the inverter INVCKG2_2, and controls the PMOS of the corresponding transmission gate through the inverter INVCKG2_1, the NAND gate NANCKG2_1 and the NAND gate NANCKG2_2. Thus, the transmission gate TGSEL1_3 of the first data selecting circuit 646, the transmission gate TGSEL2_3 of the second data selecting circuit 647, the transmission gate TGSEL3_3 of the third data selecting circuit 648, and the transmission gate TGSEL4_3 of the fourth data selecting circuit 649 are turned on.

A terminal of the transmission gate TGSEL1_3 of the first data selecting circuit 646 is connected to the line DIN_F1D, and the line DIN_F1D is connected to the line DIN_F1 of the third input generating circuit 634. Since the data F1 are transferred to the line DIN_F1 in the DDR2 operation mode, the data F1 are outputted to the line DID_0 when the CA0 and the CA1 have a low level.

A terminal of the transmission gate TGSEL2_3 of the second data selecting circuit 647 is connected to the line DIN_S1D, and the line DIN_S1D is connected to the line DIN_S1 of the fourth input generating circuit 637. Since the data S1 are transferred to the line DIN_S1 in the DDR2 operation mode, the data S1 are outputted to the line DID_1 when the CA0 and the CA1 have a low level.

A terminal of the transmission gate TGSEL3_3 of the third data selecting circuit 648 is connected to the line DIN_F0D, and the line DIN_F0D is connected to the line DIN_F0 of the first input generating circuit 631. Since the data F0 are transferred to the line DIN_F0 in the DDR2 operation mode, the data F0 are outputted to the line DID_2 when the CA0 and the CA1 have a low level.

A terminal of the transmission gate TGSEL4_3 of the fourth data selecting circuit 649 is connected to the line DIN_S0D, and the line DIN_S0D is connected to the line DIN_S0 of the first input generating circuit 631. Since the data S0 are transferred to the line DIN_S0 in the DDR2 operation mode, the data S0 are outputted to the line DID_3 when the CA0 and the CA1 have a low level.

When the CA0 and CA1 have a low level in the DDR2 operation mode, the output of the NAND gate NANCKG1_1 of the second control signal generating circuit 642 has a low level, controls the NMOS of the corresponding transmission gate through the inverter INVCKG1_1, the NAND gate NANCKG1_2 and the inverter INVCKG1_2, and controls the PMOS of the corresponding transmission gate through the inverter INVCKG1_1, the NAND gate NANCKG1_1 and the NAND gate NANCKG1_2. Thus, the transmission gate TGSEL1_4 of the first data selecting circuit 646, the transmission gate TGSEL2_4 of the second data selecting circuit 647, the transmission gate TGSEL3_4 of the third data selecting circuit 648, and the transmission gate TGSEL4_4 of the fourth data selecting circuit 649 are turned on.

A terminal of the transmission gate TGSEL1_4 of the first data selecting circuit 646 is connected to the line DIN_S1DD, and the line DIN_S1DD is connected to the line DIN_S1 of the fifth input generating circuit 639. Since the data S1 are transferred to the line DIN_S1 in the DDR2 operation mode, the data S1 are outputted to the line DID_0 when the CA0 and the CA1 have a low level.

A terminal of the transmission gate TGSEL2_4 of the second data selecting circuit 647 is connected to the line DIN_F0D, and the line DIN_F0D is connected to the line DIN_F0 of the first input generating circuit 631. Since the data F0 are transferred to the line DIN_F0 in the DDR2 operation mode, the data F0 are outputted to the line DID_1 when the CA0 and the CA1 have a low level.

A terminal of the transmission gate TGSEL3_4 of the third data selecting circuit 648 is connected to the line DIN_S0D, and the line DIN_S0D is connected to the line DIN_S0 of the second input generating circuit 633. Since the data S0 are transferred to the line DIN_S0 in the DDR2 operation mode, the data S0 are outputted to the line DID_2 when the CA0 and the CA1 have a low level.

A terminal of the transmission gate TGSEL4_4 of the fourth data selecting circuit 649 is connected to the line DIN_F1D, and the line DIN_F1D is connected to the line DIN_F1 of the third input generating circuit 634. Since the data F1 are transferred to the line DIN_F1 in the DDR2 operation mode, the data F1 are outputted to the line DID_3 when the CA0 and the CA1 have a low level.

Figure 10A:
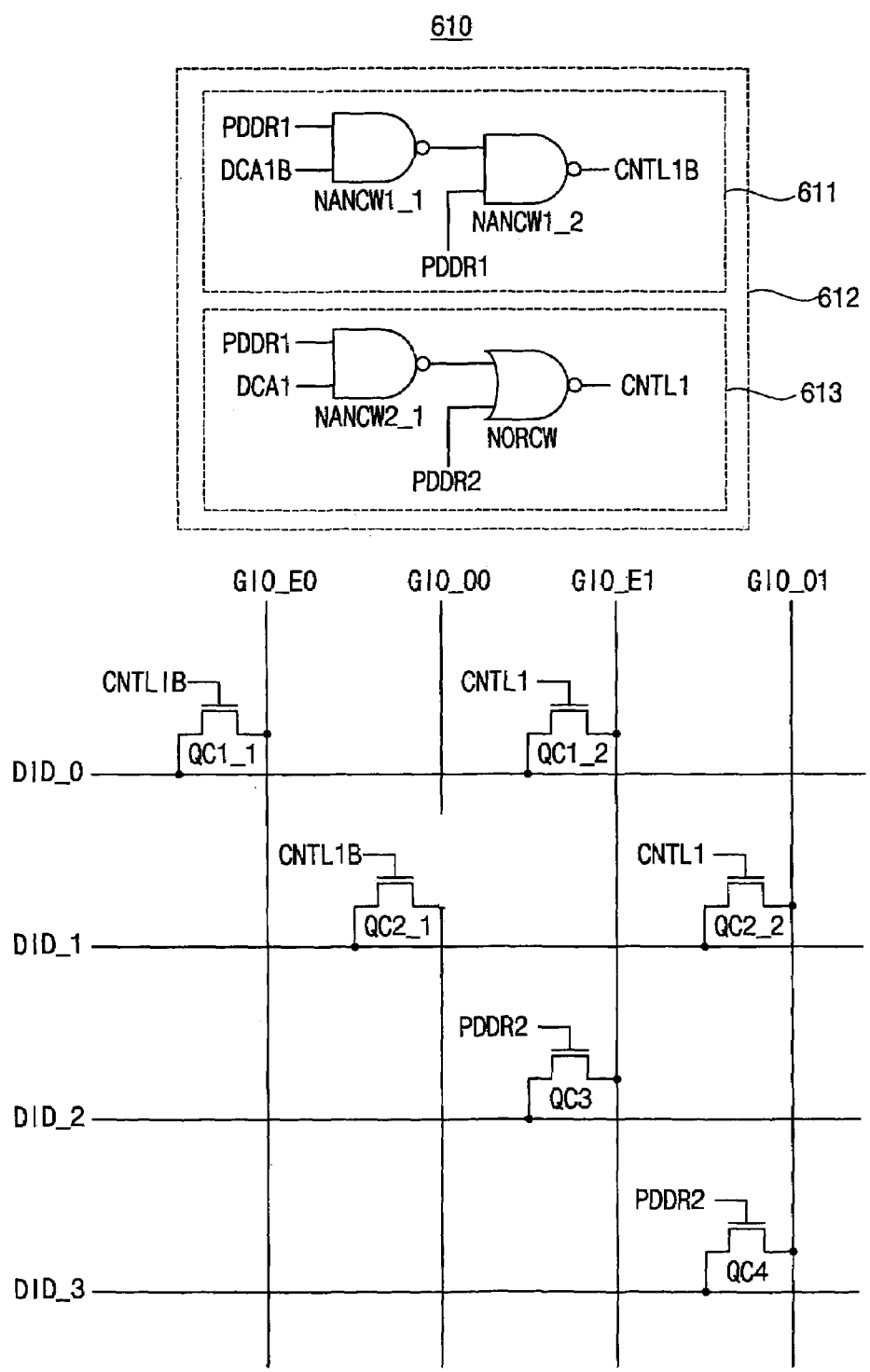
FIGS. 10A and 10B are circuit diagrams showing a line connector of FIG. 1 according to some embodiments of the present invention.
Figure 10B:
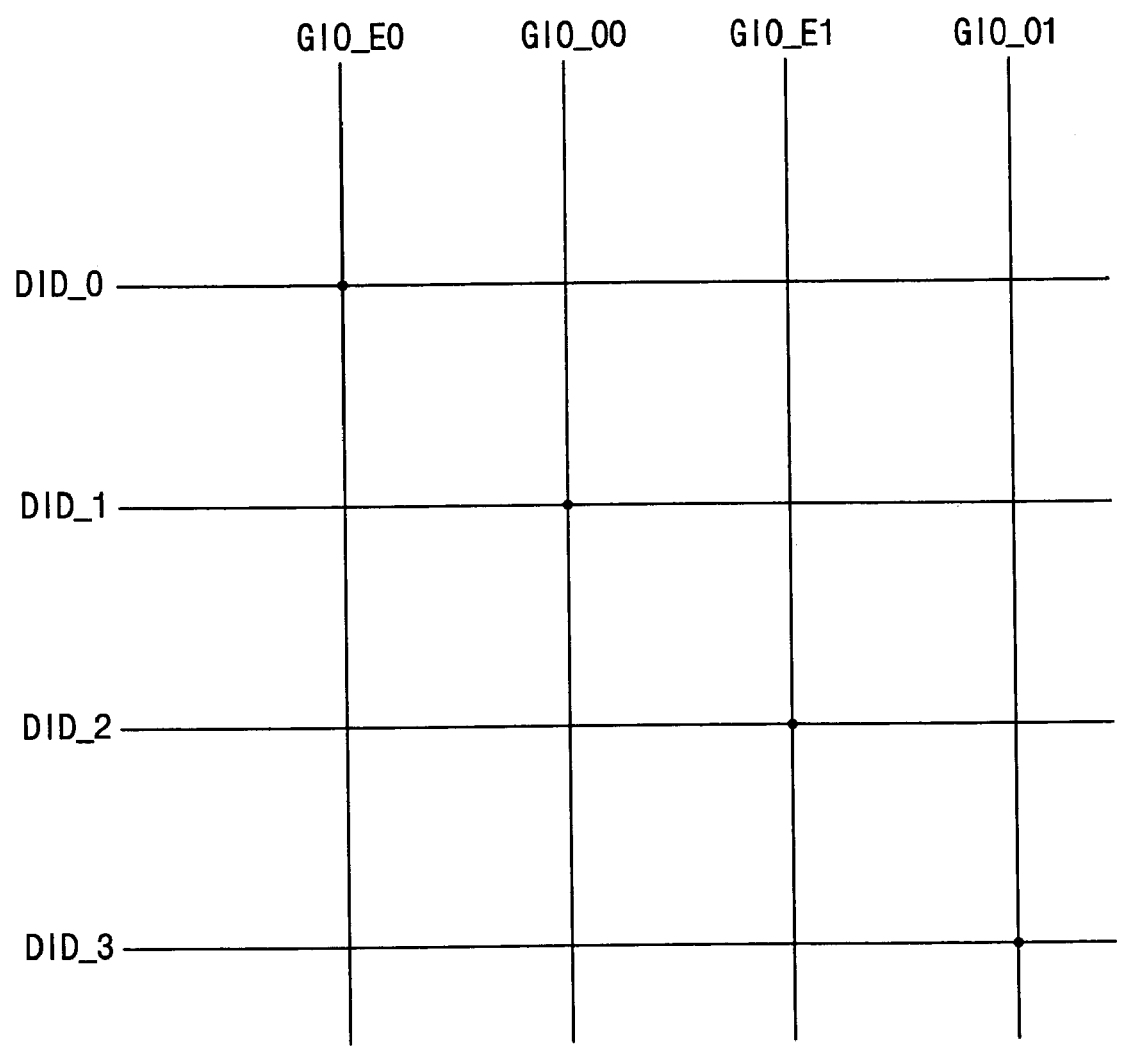

FIGS. 10A and 10B are circuit diagrams showing a line connector of FIG. 1. The line connector 610 connects between the DID lines and the global data lines.

FIG. 10A shows a line connector 610 that selectively performs the DDR1-1 mode operation or the DDR2 mode operation. Referring to FIG. 10A, the line connector 610 includes a line connecting signal generator 612, a plurality of global data lines GIO_E0, GIO_O0, GIO_E1 and GIO_O1, a plurality of DID lines DID_0, DID_1, DID_2 and DID_3, and a plurality of transistors QC1_1, QC1_2, QC2_1, QC2_2, QC3 and QC4. The global data lines GIO_E0, GIO_O0, GIO_E1 and GIO_O1 are arranged along a first direction substantially in parallel one another. The DID lines DID_0, DID_1, DID_2 and DID_3 are arranged along a second direction that is substantially in parallel with respect to the first direction. The transistors QC1_1, QC1_2, QC2_1, QC2_2, QC3 and QC4 electrically connect the global data lines GIO_E0, GIO_O0, GIO_E1 and GIO_O1 to the DID lines DID_0, DID_1, DID_2 and DID_3.

The line connecting signal generator 612 includes a first line connecting signal generator 611 and a second line connecting signal generator 613. The first line connecting signal generator 611 includes a NAND gate NANCW1_1 and a NAND gate NANCW1_2, and the second line connecting signal generator 613 includes a NAND gate NANCW2_1 and a NOR gate NORCW.

The NAND gate NANCW1_1 receives the mode selection signal PDDR1 and the DCA1B signal that is used for selecting the decoding blocks of FIG. 4A during the DDR1-1 mode operation. The NOR gate NORCW receives an output of the NAND gate NANCW2_1 and the mode selection signal PDDR2.

For example, the transistors QC1_1, QC1_2, QC2_1, QC2_2, QC3 and QC4 may be NMOS transistors. The transistor QC1_1 is connected between the DID_0 line and GIO_E0 line, and a gate electrode of the transistor QC1_1 is coupled to a line CNTL1B that is connected to an output of the NAND gate NANCW1_2. The transistor QC1_2 is connected between the DID_0 line and GIO_E1 line, and a gate electrode of the transistor QC1_2 is coupled to a line CNTL1 that is connected to an output of the NOR gate NORCW. The transistor QC2_1 is connected between the DID_1 line and GIO_O0 line, and a gate electrode of the transistor QC2_1 is coupled to the line CNTL1B. The transistor QC2_2 is connected between the DID_1 line and GIO_O1 line, and a gate electrode of the transistor QC2_2 is coupled to the line CNTL1. The transistor QC3 is connected between the DID_2 line and GIO_E1 line, and a gate electrode of the transistor QC3 is coupled to the mode selection signal PDDR2. The transistor QC4 is connected between the DID_3 line and GIO_O1 line, and a gate electrode of the transistor QC4 is coupled to the mode selection signal PDDR2.

In the DDR1-1 operation mode, the mode selection signal PDDR1 has the high level, and the first line connecting signal generator 611 transfers the CA1B signal (the inverted CA1 signal) to the CNTL1B line via the NAND gates NANCW1_1 and NANCW1_2. Thus, when the CA1 signal has a low level, the CA1b has a high level, and the CA1B having the high level is transferred through the line CNTL1B. The transistors QC1-1 and QC2_1 coupled to the CNTL1B line are turned on, the DID_0 line is electrically connected to the global data line GIO_E0, and the DID_1 line is electrically connected to the global data line GIO_O0. As shown in FIGS. 8 and 9A, the F0 data of the DID_0 line are transferred to the global data line GIO_E0, and the S0 data of the DID_1 line are transferred to the global data line GIO_O0. The data F0 that are transferred to the global data line GIO_E0 and the data S0 that are transferred to the global data line GIO_O0 are transferred to the local data line LIO, are transferred to corresponding bit line via the column line selected by the column decoder470, are amplified by a bit line sense amplifier, and are stored in corresponding memory cell.

In the DDR1-1 operation mode, when the CA1 signal has a high level, the second line connecting signal generator 613 transfers the CA1 signal having the high level to the CNTL1 line. Since the PDDR1 and CA1 signals have high levels, the NAND gate NANCW2_1 outputs a low level signal. Since the PDDR2 has a low level and the output of the NAND gate NANCW2_1 has the low level, the NOR gate NORCW transfers a high level signal to the line CNTL1. The transistors QC1-2 and QC2_2 are turned on in response to the output of the NOR gate NORCW that is transferred through the CNTL1 line are turned on, the DID_0 line is electrically connected to the global data line GIO_E1, and the DID_1 line is electrically connected to the global data line GIO_O1. As shown in FIGS. 8 and 9A, the S0 data of the DID_0 line are transferred to the global data line GIO_E1, and the F0 data of the DID_1 line are transferred to the global data line GIO_O1. The data S0 that are transferred to the global data line GIO_E1 and the data F0 that are transferred to the global data line GIO_O1 are transferred to the local data line LIO, are transferred to corresponding bit line via the column line selected by the column decoder 470, are amplified by a bit line sense amplifier, and are stored in corresponding memory cell.

In the DDR2 operation mode, since the mode selection signal PDDR2 has the high level, the first line connecting signal generator 611 transfers a high level signal to the CNTL1B line. Thus, the transistors QC1_1, QC2_1, QC3 and QC4 are turned on. The DID_0 line is electrically connected to the global data line GIO_E0, and the DID_1 line is electrically connected to the global data line GIO_O0 due to the turned on transistors QC1_1, QC2_1, QC3 and QC4. In addition, the DID_2 line is electrically connected to the global data line GIO_E1 due to the transistors QC3 and QC4 that are turned on in response to the PDDR2 signal. In addition, as shown in FIGS. 8 and 9A, the data are transferred to the global data lines via the DID lines according to the CA1 and CA0.

FIG. 10B shows a line connector 610 that selectively performs the DDR1-2 mode operation or the DDR2 mode operation. Referring to FIG. 10B, the line connector 610 includes a plurality of global data lines GIO_E0, GIO_O0, GIO_E1 and GIO_O1, and a plurality of DID lines DID_0, DID_1, DID_2 and DID_3. The global data lines GIO_E0, GIO_O0, GIO_E1 and GIO_O1 are arranged along a first direction substantially in parallel one another. The DID lines DID_0, DID_1, DID_2 and DID_3 are arranged along a second direction that is substantially in parallel with respect to the first direction. The DID_0 line is electrically connected to the global data line GIO_E0, and the DID_1 is electrically connected to the global data line GIO_O0. The DID_2 line is electrically connected to the global data line GIO_E1, and the DID_3 is electrically connected to the global data line GIO_O1. As shown in FIGS. 8 and 9A, since data are not transferred through the DID_2 and DID_3 lines in the DDR2 mode operation, data are not transferred through global data lines GIO_E1 and GIO_O1 in the DDR2 mode operation. In addition, the output data of the input generating circuit 630 are transferred to the global data lines according to the CA1 and CA0.

Figure 11C:
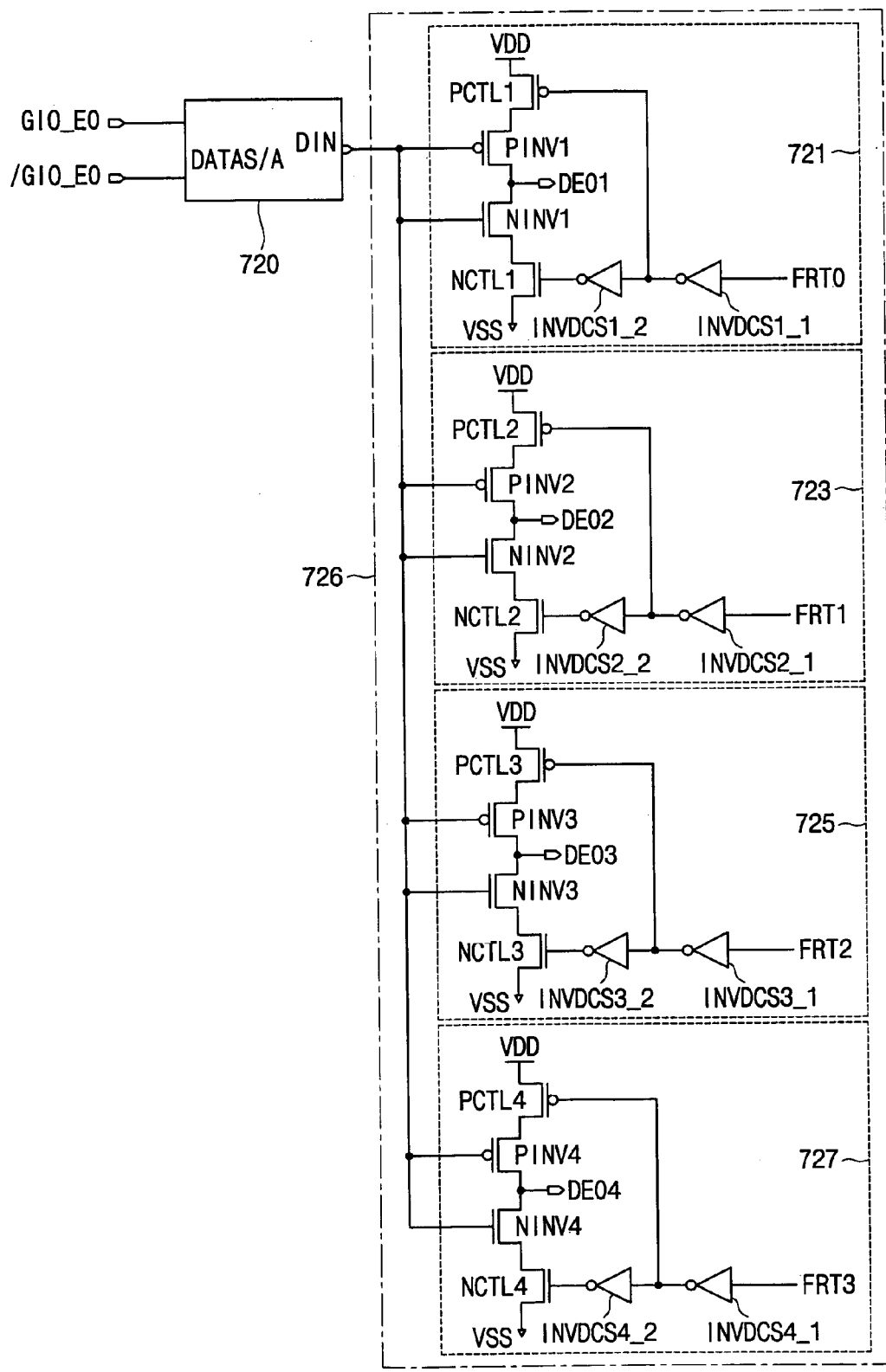

FIGS. 11A, 11B and 11C are circuit diagrams showing an output ordering circuit of FIG. 1. The output ordering circuit 710 includes an output control signal generator 712 and 722, a data sense amplifier 720 and an output ordering control circuit 726.

FIG. 11A is a circuit diagram showing an output control signal generator 712 that selectively performs the DDR1-1 mode operation and the DDR2 mode operation. Referring to FIG. 11A, the output control signal generator 712 includes a first output ordering control signal generator 711, a second output ordering control signal generator 713, a third output ordering control signal generator 714, a fourth output ordering control signal generator 715.

The first output ordering control signal generator 711 includes a NAND gate NANDOC1_1, an inverter INVDOC1_1, a NAND gate NANDOC1_2 and an inverter INVDOC1_2. The NAND gate NANDOC1_1 receives a CA0B that corresponds to an inverted CA0, a CA1B that corresponds to an inverted CA1, and VDD (or a high level signal). The inverter INVDOC1_1 inverts an output of the NAND gate NANDOC1_1. The NAND gate NANDOC1_2 receives an output of the inverter INVDOC1_1 and a control signal IOSA_CON that controls the data sense amplifier 720. The inverter INVDOC1_2 inverts an output of the NAND gate NANDOC1_2 to transfer the inverted output of the NAND gate NANDOC1_2 to a line FRT0. The first output ordering control signal generator 711 outputs a high level signal to the line FRT0 to control the output ordering control circuit 726 when the CA0 has a low level and the CA1 has a low level.

The second output ordering control signal generator 713 includes a NAND gate NANDOC2_1, an inverter INVDOC2_1, a NAND gate NANDOC2_2 and an inverter INVDOC2_2. The NAND gate NANDOC2_1 receives a CA0, a CA1B that corresponds to an inverted CA1, and VDD (or a high level signal). The inverter INVDOC2_1 inverts an output of the NAND gate NANDOC2_1. The NAND gate NANDOC2_2 receives an output of the inverter INVDOC2_1 and the control signal IOSA_CON. The inverter INVDOC2_2 inverts an output of the NAND gate NANDOC2_2 to transfer the inverted output of the NAND gate NANDOC2_2 to a line FRT1. The second output ordering control signal generator 713 outputs a high level signal to the line FRT1 to control the output ordering control circuit 726 when the CA0 has a high level and the CA1 has a low level.

The third output ordering control signal generator 714 includes a NAND gate NANDOC3_1, an inverter INVDOC3_1, a NAND gate NANDOC3_2 and an inverter INVDOC3_2. The NAND gate NANDOC3_1 receives the CA0B, the CA1 and VDD (or a high level signal). The inverter INVDOC3_1 inverts an output of the NAND gate NANDOC3_1. The NAND gate NANDOC3_2 receives an output of the inverter INVDOC3_1 and the control signal IOSA_CON. The inverter INVDOC3_2 inverts an output of the NAND gate NANDOC3_2 to transfer the inverted output of the NAND gate NANDOC3_2 to a line FRT2. The third output ordering control signal generator 714 outputs a high level signal to the line FRT2 to control the output ordering control circuit 726 when the CA0 has a low level and the CA1 has a high level.

The fourth output ordering control signal generator 715 includes a NAND gate NANDOC4_1, an inverter INVDOC4_1, a NAND gate NANDOC4_2 and an inverter INVDOC4_2. The NAND gate NANDOC4_1 receives the CA0, the CA1 and VDD (or a high level signal). The inverter INVDOC4_1 inverts an output of the NAND gate NANDOC4_1. The NAND gate NANDOC4_2 receives an output of the inverter INVDOC4_1 and the control signal IOSA_CON. The inverter INVDOC4_2 inverts an output of the NAND gate NANDOC4_2 to transfer the inverted output of the NAND gate NANDOC4_2 to a line FRT3. The fourth output ordering control signal generator 715 outputs a high level signal to the line FRT3 to control the output ordering control circuit 726 when the CA0 has a high level and the CA1 has a high level.

FIG. 11B is a circuit diagram showing an output control signal generator 722 that selectively performs the DDR1-2 mode operation and the DDR2 mode operation. Referring to FIG. 11B, the output control signal generator 722 includes a fifth output ordering control signal generator 716, a sixth output ordering control signal generator 717, a seventh output ordering control signal generator 718, an eighth output ordering control signal generator 719.

The fifth output ordering control signal generator 716 includes a NAND gate NANDOC5_1, a NAND gate NANDOC5_2, an inverter INVDOC5_1, a NAND gate NANDOC5_3 and an inverter INVDOC5_2. The NAND gate NANDOC5_1 receives the CA1 and the mode selection signal PDDR2. The NAND gate NANDOC5_2 receives the CA0B, an output of the NAND gate NANDOC5_1, and VDD (or a high level signal). The inverter INVDOC5_1 inverts an output of the NAND gate NANDOC5_2. The NAND gate NANDOC5_3 receives an output of the inverter INVDOC5_1 and the control signal IOSA_CON that controls the data sense amplifier 720. The inverter INVDOC5_2 inverts an output of the NAND gate NANDOC5_3 to transfer the inverted output of the NAND gate NANDOC5_3 to the line FRT0.

In the DDR1-2 mode operation, since the mode selection signal PDDR2 has a low level, the output of the NAND gate NANDOC5_1 has a high level, and the fifth output ordering control signal generator 716 outputs a control signal to the line FRT0 depending the level of the CA0 regardless of the CA1. In other words, when the CA0 has a low level, the fifth output ordering control signal generator 716 outputs a high level of control signal to the FRT0 line to control the output ordering control circuit 726. In the DDR2 mode operation, since the mode selection signal PDDR2 has the high level, the NAND gate NANDOC5_1 is able to transfer the CA1 signal to the FRT0 line. Namely, when the CA0 and the CA1 have low levels in the DDR2 mode operation, the fifth output ordering control signal generator 716 outputs the high level of control signal to the FRT0 line to control the output ordering control circuit 726.

The sixth output ordering control signal generator 717 includes a NAND gate NANDOC6_1, an inverter INVDOC6_1, a NAND gate NANDOC6_2 and an inverter INVDOC6_2. The NAND gate NANDOC6_1 receives the CA0B, an output of the NAND gate NANDOC5_1, and VDD (or a high level signal). The inverter INVDOC6_1 inverts an output of the NAND gate NANDOC6_1. The NAND gate NANDOC6_2 receives an output of the inverter INVDOC6_1 and the control signal IOSA_CON that controls the data sense amplifier 720. The inverter INVDOC6_2 inverts an output of the NAND gate NANDOC6_2 to transfer the inverted output of the NAND gate NANDOC6_2 to the line FRT1.

In the DDR1-2 mode operation, since the mode selection signal PDDR2 has a low level, the output of the NAND gate NANDOC5_1 has a high level, and the sixth output ordering control signal generator 717 outputs a control signal to the line FRT1 depending the level of the CA0 regardless of the CA1. In other words, when the CA0 has a high level, the sixth output ordering control signal generator 717 outputs a high level of control signal to the FRT1 line to control the output ordering control circuit 726. In the DDR2 mode operation, since the mode selection signal PDDR2 has the high level, the NAND gate NANDOC5_1 is able to transfer the CA1 signal to the FRT1 line. Namely, when the CA0 has a high level and the CA1 have a low level in the DDR2 mode operation, the sixth output ordering control signal generator 717 outputs the high level of control signal to the FRT1 line to control the output ordering control circuit 726.

The seventh output ordering control signal generator 718 includes a NAND gate NANDOC7_1, an inverter INVDOC7_1, a NAND gate NANDOC7_2 and an inverter INVDOC7_2. The NAND gate NANDOC7_1 receives the CA0B, the CA1 and VDD (or a high level signal). The inverter INVDOC7_1 inverts an output of the NAND gate NANDOC7_1. The NAND gate NANDOC7_2 receives an output of the inverter INVDOC7_1 and the control signal IOSA_CON. The inverter INVDOC7_2 inverts an output of the NAND gate NANDOC7_2 to transfer the inverted output of the NAND gate NANDOC7_2 to the line FRT2.

In the DDR1-2 mode operation, since the mode selection signal PDDR2 has a low level, the seventh output ordering control signal generator 718 outputs a low level of control signal to the line FRT2 regardless of the CA1 and CA0. The low level of control signal of the FRT2 line prevents an output of the data sense amplifier 720 from being transferred to one of the lines DE01~DE04. Thus, in the DDR1-2 mode operation, the seventh output ordering control signal generator 718 does not output an effective control signal to the line FRT2. In the DDR2 mode operation, since the mode selection signal PDDR2 has the high level, the seventh output ordering control signal generator 718 outputs the high level of control signal to the FRT2 line to control the output ordering control circuit 726 when the CA0 has a low level and the CA1 have a high level in the DDR2 mode operation.

The eighth output ordering control signal generator 719 includes a NAND gate NANDOC8_1, a NAND gate NANDOC8_2, a NAND gate NANDOC8_3, a NAND gate NANDOC8_4 and an inverter INVDOC8. The NAND gate NANDOC8_1 receives the CA0, the CA1, and the mode selection signal PDDR2. The NAND gate NANDOC8_2 receives the CA0 and the mode selection signal PDDR1. The NAND gate NANDOC8_3 receives an output of the NAND gate NANDOC8_1, and an output of the NAND gate NANDOC8_2. The NAND gate NANDOC8_4 receives an output of the NAND gate NANDOC8_3 and the control signal IOSA_CON. The inverter INVDOC8 inverts an output of the NAND gate NANDOC8_4 to transfer the inverted output of the NAND gate NANDOC8_4 to the line FRT3.

In the DDR1-2 mode operation, the mode selection signal PDDR1 has a high level and the mode selection signal PDDR2 has a low level. When the CA0 has a high level, the output of the NAND gate NANDOC8_2 has a high level, and the eighth output ordering control signal generator 719 outputs a high level of control signal to the line FRT3 regardless of the output of the NAND gate NANDOC8_1 to control the output ordering control circuit 726. In the DDR2 mode operation, since the mode selection signal PDDR1 has a low level, the output of the NAND gate NANDOC8_2 has a high level. When the CA0 and the CA1 have high levels in the DDR2 mode operation, the eighth output ordering control signal generator 719 outputs the high level of control signal to the FRT3 line to control the output ordering control circuit 726.

FIG. 11C is a circuit diagram showing the data sense amplifier 720 and the output ordering control circuit 726. Referring to FIG. 11C, the data sense amplifier 720 is coupled to the global data lines GIO_E0 and /GIO_E, and the output ordering control circuit 726.selectively outputs an output of the data sense amplifier 720 to the FDO lines based on the control signals of the lines FRT0, FRT1, FRT2 and FRT3.

The output ordering control circuit 726 includes a first output selecting circuit 721, a second output selecting circuit 723, a third output selecting circuit 725 and a fourth output selecting circuit 727. In addition, the first, second, third and fourth output selecting circuits 721, 723, 725 and 727 are commonly coupled to an output terminal DIN of the data sense amplifier 720.

The first output selecting circuit 721 includes a PMOS transistor PINV1, an NMOS transistor NINV1, a PMOS transistor PCTL1, an NMOS transistor NCTL1, an inverter INVDCS1_1 and an inverter INVDCS1_2. A gate electrode of the PMOS transistor PINV1 is coupled to the output terminal DIN of the data sense amplifier 720. A gate electrode of the NMOS transistor NINV1 is coupled to the output terminal DIN of the data sense amplifier 720, and a drain electrode of the NMOS transistor NINV1 is coupled to a drain electrode of the PMOS transistor PINV1, so that the NMOS transistor NINV1 and the PMOS transistor PINV1 has together an inverter structure. A source electrode of the PMOS transistor PCTL1 is coupled to VDD. A source electrode of the NMOS transistor NCTL1 is coupled to VSS.

The inverter INVDCS1_1 inverts the control signal of the FRT0 to provide the inverted control signal of the FRT0 to the gate electrode of the PMOS transistor PCTL1. The inverter INVDCS1_2 inverts the control signal of the FRT0 to provide the inverted control signal of the FRT0 to the gate electrode of the NMOS transistor NCTL1.

The transistors NCTL1 and PCTL1 have a CMOS inverter structure, are coupled to the output terminal DIN of the data sense amplifier 720, and inverts the output signal of the data sense amplifier 720 to output the inverted output signal of the data sense amplifier 720 to a line DE01.

The second output selecting circuit 723 includes a PMOS transistor PINV2, an NMOS transistor NINV2, a PMOS transistor PCTL2, an NMOS transistor NCTL2, an inverter INVDCS2_1 and an inverter INVDCS2_2. A gate electrode of the PMOS transistor PINV2 is coupled to the output terminal DIN of the data sense amplifier 720. A gate electrode of the NMOS transistor NINV2 is coupled to the output terminal DIN of the data sense amplifier 720, and a drain electrode of the NMOS transistor NINV2 is coupled to a drain electrode of the PMOS transistor PINV2, so that the NMOS transistor NINV2 and the PMOS transistor PINV2 have together an inverter structure. A source electrode of the PMOS transistor PCTL2 is coupled to VDD. A source electrode of the NMOS transistor NCTL2 is coupled to VSS. The inverter INVDCS2_1 inverts the control signal of the FRT1 to provide the inverted control signal of the FRT1 to the gate electrode of the PMOS transistor PCTL2. The inverter INVDCS2_2 inverts the control signal of the FRT1 to provide the inverted control signal of the FRT1 to the gate electrode of the NMOS transistor NCTL2.

The transistors NCTL2 and PCTL2 have a CMOS inverter structure, are coupled to the output terminal DIN of the data sense amplifier 720, and inverts the output signal of the data sense amplifier 720 to output the inverted output signal of the data sense amplifier 720 to a line DE02.

The third output selecting circuit 725 includes a PMOS transistor PINV3, an NMOS transistor NINV3, a PMOS transistor PCTL3, an NMOS transistor NCTL3, an inverter INVDCS3_1 and an inverter INVDCS3_2. A gate electrode of the PMOS transistor PINV3 is coupled to the output terminal DIN of the data sense amplifier 720. A gate electrode of the NMOS transistor NINV3 is coupled to the output terminal DIN of the data sense amplifier 720, and a drain electrode of the NMOS transistor NINV3 is coupled to a drain electrode of the PMOS transistor PINV3, so that the NMOS transistor NINV3 and the PMOS transistor PINV3 have together an inverter structure. A source electrode of the PMOS transistor PCTL3 is coupled to VDD. A source electrode of the NMOS transistor NCTL3 is coupled to VSS. The inverter INVDCS3_1 inverts the control signal of the FRT2 to provide the inverted control signal of the FRT2 to the gate electrode of the PMOS transistor PCTL3. The inverter INVDCS3_2 inverts the control signal of the FRT2 to provide the inverted control signal of the FRT2 to the gate electrode of the NMOS transistor NCTL3.

The transistors NCTL3 and PCTL3 have a CMOS inverter structure, are coupled to the output terminal DIN of the data sense amplifier 720, and inverts the output signal of the data sense amplifier 720 to output the inverted output signal of the data sense amplifier 720 to a line DE03.

The fourth output selecting circuit 727 includes a PMOS transistor PINV4, an NMOS transistor NINV4, a PMOS transistor PCTL4, an NMOS transistor NCTL4, an inverter INVDCS4_1 and an inverter INVDCS4_2. A gate electrode of the PMOS transistor PINV4 is coupled to the output terminal DIN of the data sense amplifier 720. A gate electrode of the NMOS transistor NINV4 is coupled to the output terminal DIN of the data sense amplifier 720, and a drain electrode of the NMOS transistor NINV4 is coupled to a drain electrode of the PMOS transistor PINV4, so that the NMOS transistor NINV4 and the PMOS transistor PINV4 have together an inverter structure. A source electrode of the PMOS transistor PCTL4 is coupled to VDD. A source electrode of the NMOS transistor NCTL4 is coupled to VSS. The inverter INVDCS4_1 inverts the control signal of the FRT3 to provide the inverted control signal of the FRT3 to the gate electrode of the PMOS transistor PCTL4. The inverter INVDCS4_2 inverts the control signal of the FRT3 to provide the inverted control signal of the FRT3 to the gate electrode of the NMOS transistor NCTL4.

The transistors NCTL4 and PCTL4 have a CMOS inverter structure, are coupled to the output terminal DIN of the data sense amplifier 720, and inverts the output signal of the data sense amplifier 720 to output the inverted output signal of the data sense amplifier 720 to a line DE04.

Figure 12A:
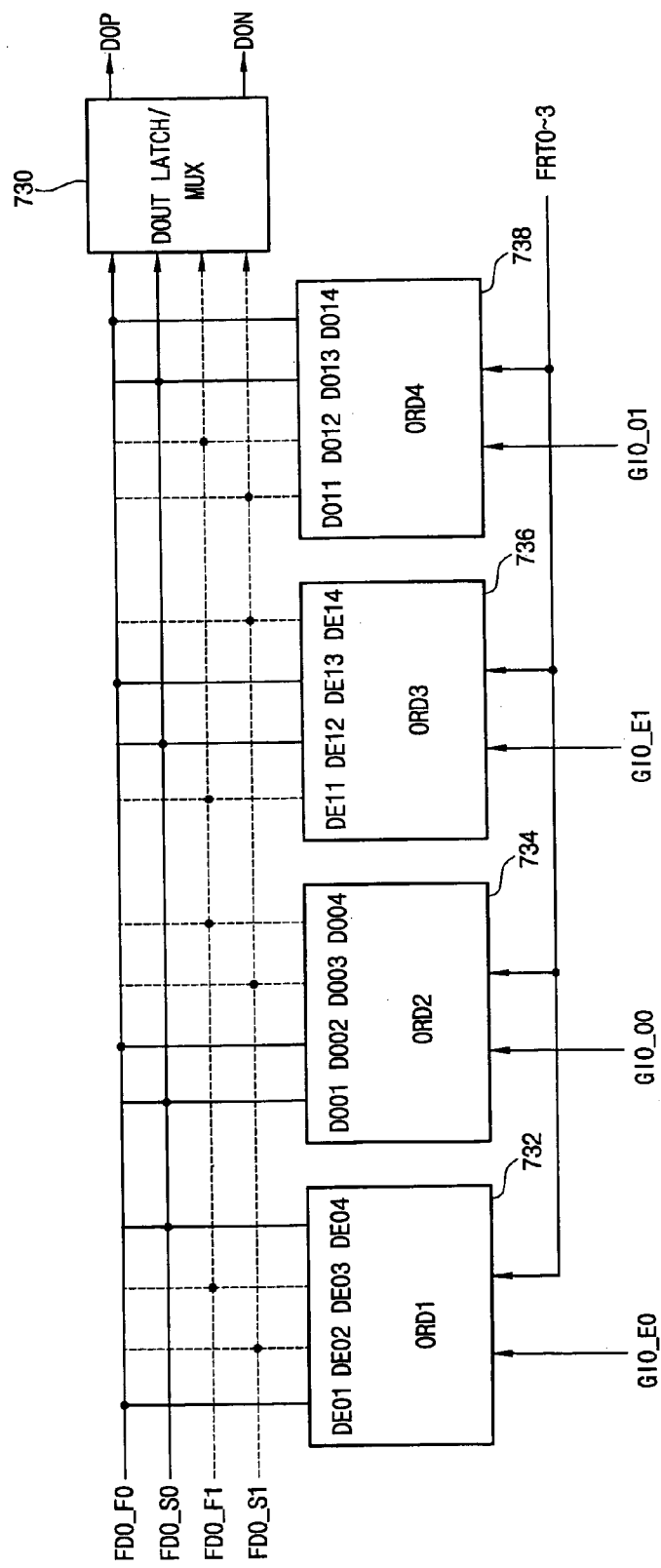
FIGS. 12A and 12B are block diagrams illustrating data output path according to some embodiments of the present invention.
Figure 12B:
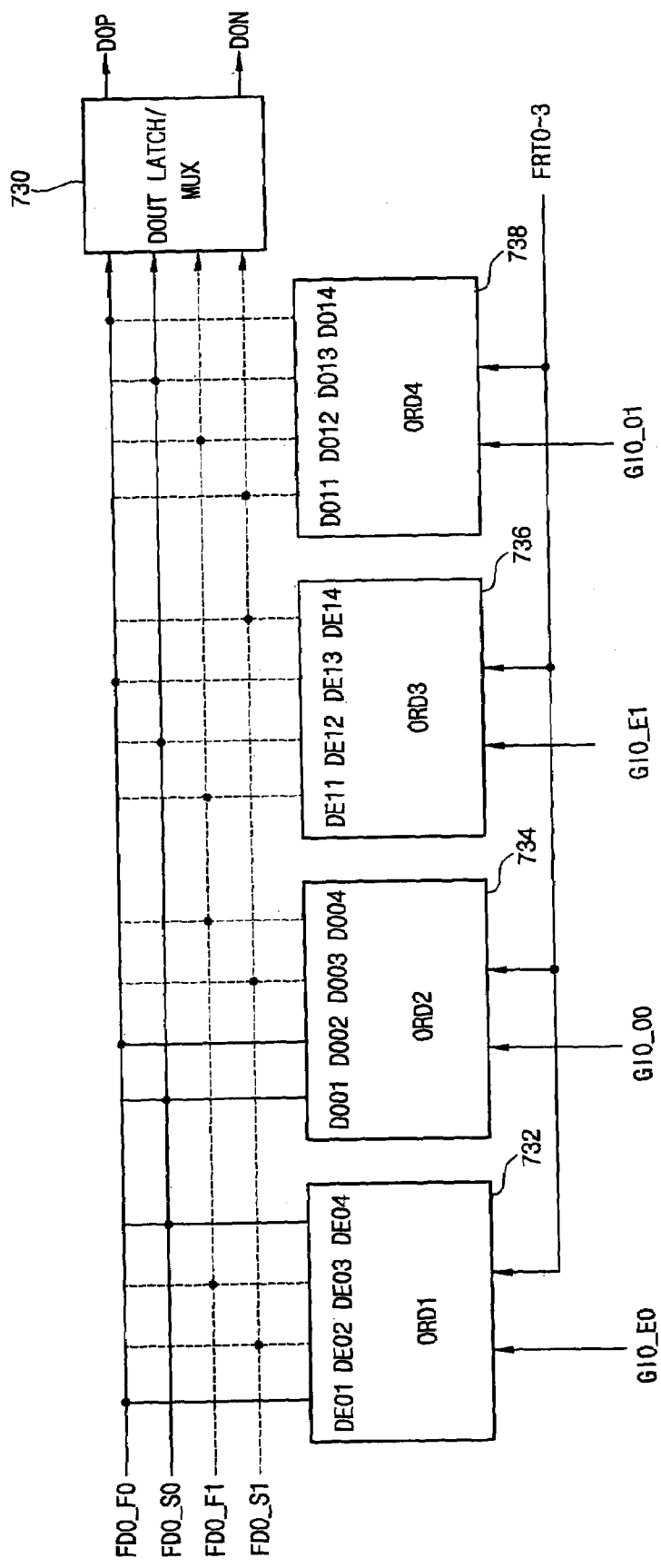

Referring to FIGS. 12A and 12B, the SDRAM having DDR1-2 and DDR2 mode operations includes four output ordering circuits 732, 734, 736 and 738 per a unit data input/output (1DQ). Each of the four output ordering parts 732, 734, 736 and 738 includes a data sense amplifier and an output ordering control circuit.

FIG. 12A is a block diagram illustrating a data output path during the DDR1-1 and DDR2 mode operations. Referring to FIG. 12A, the four output ordering parts 732, 734, 736 and 738 receive the global data lines GIO_E0, GIO_O0, GIO_E1 and GIO_O1 and the control signals of the FRT0, FRT1, FRT2, and FRT3. The output of the output ordering circuit 710 is provided to the output data latch/mux 730 via the FDO lines. The output data latch/mux 730 receives the signals transferred through the FDO lines to output pull-up output data DOP and pull-down output data DON via the terminals DOP or DON.

Data of the global data line GIO_E0, which are inputted to the first output ordering part 732, are amplified by a first data sense amplifier (not shown), and are outputted to the lines FD0_F0, FD0_S0, FD0_F1, and FD0_S1 through the lines DE01, DE02, DE03 and DE04 in response to the control signals of the lines FRT0, FRT1, FRT2 and FRT3. In the DDR1-1 mode operation, the first output ordering part 732 is able to select one of the lines FDO_F0 and FDO_S0. In the DDR2 mode operation, the first output ordering part 732 is able to select one of the lines FDO_F0, FDO_S0, FDO_F1 and FDO_S1.

Data of the global data line GIO_O0, which are inputted to the second output ordering part 734, are amplified by a second data sense amplifier (not shown), and are outputted to the lines FD0_F0, FD0_S0, FD0_F1, and FD0_S1 through the lines DO01, DO02, DO03 and DO04 in response to the control signals of the lines FRT0, FRT1, FRT2 and FRT3. In the DDR1-1 mode operation, the second output ordering part 734 is able to select one of the lines FDO_F0 and FDO_S0. In the DDR2 mode operation, the first output ordering part 732 is able to select one of the lines FDO_F0, FDO_S0, FDO_F1 and FDO_S1.

Data of the global data line GIO_E1, which are inputted to the third output ordering part 736, are amplified by a third data sense amplifier (not shown), and are outputted to the lines FD0_F0, FD0_S0, FD0_F1, and FD0_S1 through the lines DE11, DE12, DE13 and DE14 in response to the control signals of the lines FRT0, FRT1, FRT2 and FRT3. In the DDR1-1 mode operation, the third output ordering part 736 is able to select one of the lines FDO_F0 and FDO_S0.

In the DDR2 mode operation, the third output ordering part 736 is able to select one of the lines FDO_F0, FDO_S0, FDO_F1 and FDO_S1.

Data of the global data line GIO_O1, which are inputted to the fourth output ordering part 738, are amplified by a fourth data sense amplifier (not shown), and are outputted to the lines FD0_F0, FD0_S0, FD0_F1, and FD0_S1 through the lines DO11, DO12, DO13 and DO14 in response to the control signals of the lines FRT0, FRT1, FRT2 and FRT3. In the DDR1-1 mode operation, the fourth output ordering part 738 is able to select one of the lines FDO_F0 and FDO_S0. In the DDR2 mode operation, the fourth output ordering part 738 is able to select one of the lines FDO_F0, FDO_S0, FDO_F1 and FDO_S1.

In the DDR1-1 mode operation, when the CA0 and CA1 have low levels, the first output ordering part 732 outputs the data of the global data line GIO_E0 to the FDO_F0 line via the DE01 line in response to the FRT0 signal, and the second output ordering part 734 outputs the data of the global data line GIO_O0 to the FDO_S0 line via the DO01 line in response to the FRT0 signal. Since the lines FDO_F1 and FDO_S1 are not activated in the DDR1-1 mode operation, when the CA0 and CA1 have low levels, the third and fourth output ordering part 736 and 738 cannot output data to the lines FDO_F1 and FDO_S1, so that the output data latch/mux 730 cannot receive the data through the FDO lines.

In the DDR1-1 mode operation, when the CA0 has a high level and the CA1 have a low level, the second output ordering part 734 outputs the data of the global data line GIO_O0 to the FDO_F0 line via the DO02 line in response to the FRT1 signal, and the third output ordering part 736 outputs the data of the global data line GIO_E1 to the FDO_S0 line via the DE12 line in response to the FRT1 signal. Since the lines FDO_F1 and FDO_S1 are not activated in the DDR1-1 mode operation, when the CA0 has the high level and the CA1 have the low level, the first and fourth output ordering part 732 and 738 cannot output data to the lines FDO_F1 and FDO_S1, so that the output data latch/mux 730 cannot receive the data through the FDO lines.

In the DDR1-1 mode operation, when the CA0 has a low level and the CA1 have a high level, the third output ordering part 736 outputs the data of the global data line GIO_E1 to the FDO_F0 line via the DE13 line in response to the FRT2 signal, and the fourth output ordering part 738 outputs the data of the global data line GIO_O1 to the FDO_S0 line via the DO13 line in response to the FRT2 signal. Since the lines FDO_F1 and FDO_S1 are not activated in the DDR1-1 mode operation, when the CA0 has the low level and the CA1 have the high level, the first and second output ordering part 732 and 734 cannot output data to the lines FDO_F1 and FDO_S1, so that the output data latch/mux 730 cannot receive the data through the FDO lines.

In the DDR1-1 mode operation, when the CA0 has a high level and the CA1 have a high level, the first output ordering part 732 outputs the data of the global data line GIO_E0 to the FDO_S0 line via the DE04 line in response to the FRT3 signal, and the fourth output ordering part 738 outputs the data of the global data line GIO_O1 to the FDO_F0 line via the DO14 line in response to the FRT3 signal. Since the lines FDO_F1 and FDO_S1 are not activated in the DDR1-1 mode operation, when the CA0 has the high level and the CA1 have the high level, the second and third output ordering part 734 and 736 cannot output data to the lines FDO_F1 and FDO_S1, so that the output data latch/mux 730 cannot receive the data through the FDO lines.

In the DDR2 mode operation, all of the lines FDO_F0, FDO_S0, FDO_F1, and FDO_S1 are activated, and are selected by the output ordering parts 732, 734, 736 and 738.

When the CA0 has a low level and the CA1 have a low level, the first output ordering part 732 outputs the data of the global data line GIO_E0 to the FDO_F0 line via the DE01 line in response to the FRT0 signal, and the second output ordering part 734 outputs the data of the global data line GIO_O0 to the FDO_S0 line via the DO01 line in response to the FRT0 signal. In addition, the third output ordering part 736 outputs the data of the global data line GIO_E1 to the FDO_F1 line via the DE11 line in response to the FRT0 signal, and the fourth output ordering part 738 outputs the data of the global data line GIO_O1 to the FDO_S1 line via the DO11 line in response to the FRT0 signal. Thus, when the CA0 has a low level and the CA1 have a low level, the data of the global data line GIO_E0 are amplified to be transferred to the FDO_F0 line, the data of the global data line GIO_O0 are amplified to be transferred to the FDO_S0 line, the data of the global data line GIO_E1 are amplified to be transferred, and the data of the global data line GI_O1 are amplified to be transferred to the FDO_S1 line.

When the CA0 has a high level and the CA1 have a low level in the DDR2 mode operation, the first output ordering part 732 outputs the data of the global data line GIO_E0 to the FDO_S1 line via the DE02 line in response to the FRT1 signal, and the second output ordering part 734 outputs the data of the global data line GIO_O0 to the FDO_F0 line via the DO02 line in response to the FRT1 signal. In addition, the third output ordering part 736 outputs the data of the global data line GIO_E1 to the FDO_S0 line via the DE12 line in response to the FRT1 signal, and the fourth output ordering part 738 outputs the data of the global data line GIO_O1 to the FDO_F1 line via the DO12 line in response to the FRT1 signal. Thus, when the CA0 has a high level and the CA1 have a low level, the data of the global data line GIO_O0 are amplified to be transferred to the FDO_F0 line, the data of the global data line GIO_E1 are amplified to be transferred to the FDO_S0 line, the data of the global data line GIO_O1 are amplified to be transferred to the line FDO_F1, and the data of the global data line GIO_E0 are amplified to be transferred to the FDO_S1 line.

When the CA0 has a low level and the CA1 have a high level in the DDR2 mode operation, the first output ordering part 732 outputs the data of the global data line GIO_E0 to the FDO_F1 line via the DE03 line in response to the FRT2 signal, and the second output ordering part 734 outputs the data of the global data line GIO_O0 to the FDO_S1 line via the DO03 line in response to the FRT2 signal. In addition, the third output ordering part 736 outputs the data of the global data line GIO_E1 to the FDO_F0 line via the DE13 line in response to the FRT2 signal, and the fourth output ordering part 738 outputs the data of the global data line GIO_O1 to the FDO_S0 line via the DO13 line in response to the FRT2 signal. Thus, when the CA0 has a low level and the CA1 have a high level, the data of the global data line GIO_E1 are amplified to be transferred to the FDO_F0 line, the data of the global data line GIO_O1 are amplified to be transferred to the FDO_S0 line, the data of the global data line GIO_E0 are amplified to be transferred to the line FDO_F1, and the data of the global data line GIO_O0 are amplified to be transferred to the FDO_S1 line.

When the CA0 has a high level and the CA1 have a high level in the DDR2 mode operation, the first output ordering part 732 outputs the data of the global data line GIO_E0 to the FDO_S0 line via the DE04 line in response to the FRT3 signal, and the second output ordering part 734 outputs the data of the global data line GIO_O0 to the FDO_F1 line via the DO04 line in response to the FRT3 signal. In addition, the third output ordering part 736 outputs the data of the global data line GIO_E1 to the FDO_S1 line via the DE14 line in response to the FRT3 signal, and the fourth output ordering part 738 outputs the data of the global data line GIO_O1 to the FDO_F0 line via the DO14 line in response to the FRT3 signal. Thus, when the CA0 has a high level and the CA1 have a high level, the data of the global data line GIO_O1 are amplified to be transferred to the FDO_F0 line, the data of the global data line GIO_E0 are amplified to be transferred to the FDO_S0 line, the data of the global data line GIO_O0 are amplified to be transferred to the line FDO_F1, and the data of the global data line GIO_E1 are amplified to be transferred to the FDO_S1 line.

FIG. 12B is a block diagram illustrating a data output path during the DDR1-2 and DDR2 mode operations.

Referring to FIG. 12B, the data output path of FIG. 12B is the same as the data output path of FIG. 12A except that the third and fourth output ordering parts 736 and 738 are not activated during the DDR1-2 mode operation. In other words, in the DDR1-2 mode operation, data are not transferred to the global data lines GIO_E1 and GIO_O1, and the third and fourth output ordering parts 736 and 738 do not operate. Thus, only the first and second output ordering parts 732 and 734 operate in the DDR1-2 mode operation.

When the CA0 has a low level and the CA1 have a low level in the DDR1-2 mode operation, the first output ordering part 732 outputs the data of the global data line GIO_E0 to the FDO_F0 line via the DE01 line in response to the FRT0 signal, and the second output ordering part 734 outputs the data of the global data line GIO_O0 to the FDO_S0 line via the DO01 line in response to the FRT0 signal.

When the CA0 has a high level and the CA1 have a low level in the DDR1-2 mode operation, the first output ordering part 732 is controlled by the FRT1 and FRT3 signals. However, since the data of FDO_F1 and FDO_S1 are not valid, the first output ordering part 732 outputs the data of the global data line GIO_E0 to the FDO_S0 line via the DE04 line in response to the FRT3 signal, and the second output ordering part 734 outputs the data of the global data line GIO_O0 to the FDO_F0 line via the DO02 line in response to the FRT1 signal.

When the CA0 has a low level and the CA1 have a high level in the DDR1-2 mode operation, the first output ordering part 732 is controlled by the FRT0 signal because the seventh output ordering control signal generator 718 and the eighth output ordering control signal generator 719 generate control signals based on the level of the CA0 regardless of the CA1 signal, As shown in FIG. 11B. Thus, the first output ordering part 732 outputs the data of the global data line GIO_E0 to the FDO_F0 line via the DE01 line in response to the FRT0 signal, and the second output ordering part 734 outputs the data of the global data line GIO_O0 to the FDO_S0 line via the DO01 line in response to the FRT0 signal.

When the CA0 has a high level and the CA1 have a high level in the DDR1-2 mode operation, the first output ordering part 732 is controlled by the FRT1 and FRT3 signals. However, since the data of FDO_F1 and FDO_S1 are not valid, the first output ordering part 732 outputs the data of the global data line GIO_E0 to the FDO_S0 line via the DE04 line in response to the FRT3 signal, and the second output ordering part 734 outputs the data of the global data line GIO_O0 to the FDO_F0 line via the DO02 line in response to the FRT1 signal.

Since the operation in the DDR2 mode is the same as that of FIG. 12A, descriptions about the operation in the DDR2 mode will be omitted.

Figure 13:
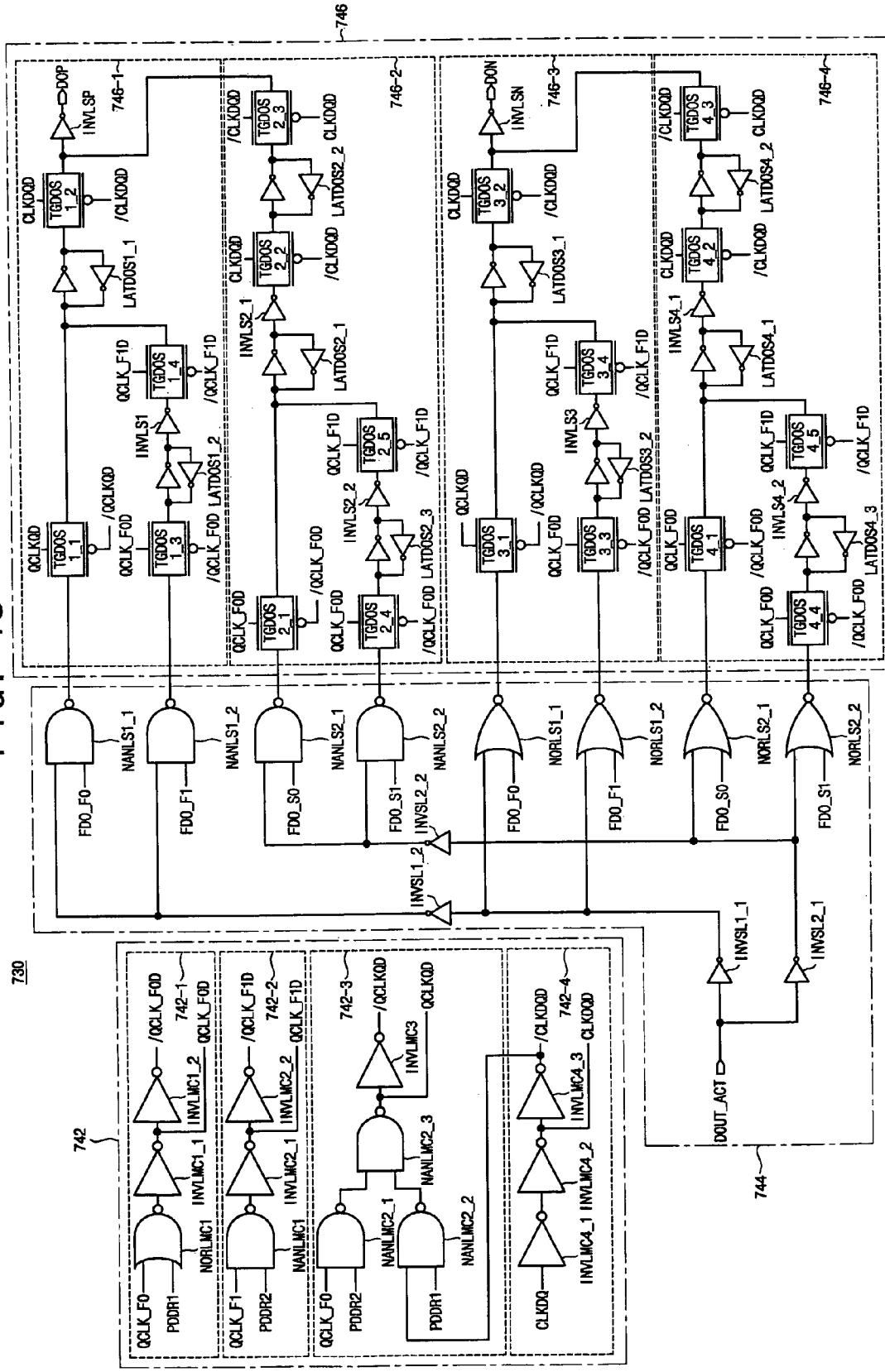
FIG. 13 is a circuit diagram showing an output data latch/mux of FIG. 1 according to some embodiments of the present invention.

FIG. 13 is a circuit diagram showing an output data latch/mux of FIG. 1. Referring to FIG. 13, the output data latch/mux 730 includes an output data control signal generator 742, an output line selecting circuit 744 and a data transfer circuit 746.

The output data control signal generator 742 includes a first latch/mux control signal generator 742-1, a second latch/mux control signal generator 742-2, a third latch/mux control signal generator 742-3, and a fourth latch/mux control signal generator 742-4.

The first latch/mux control signal generator 742-1 includes a NOR gate NORLMC1, an inverter INVLMC1-1, and an inverter INVLMC1_2. The NOR gate NORLMC1 receives an internal clock QCLK_F0 and the mode selection signal PDDR1. The inverter INVLMC1_1 inverts an output of the NOR gate NORLMC1, and the inverter INVLMC1_2 inverts an output of the inverter INVLMC1_1. An output of the inverter INVLMC1_1 is transferred to a QCLK_F0D line, and an output of the inverter INVLMC1_2 is transferred to a /QCLK_F0D line.

In the DDR1 mode operation, since the PDDR1 has a high level, an output of the NOR gate NORLMC1 has a low level regardless of the internal clock QCLK_F0. Thus, the internal clock QCLK_F0 is not transferred, a high level of signal is outputted to the QCLK_F0D line, and a low level of signal is outputted to the /QCLK_F0D line.

In addition, in the DDR2 mode operation, since the PDDR1 has a high level, an output of the NOR gate NORLMC1 corresponds to an inverted QCLK_F0. Thus, in the DDR2 mode operation, the QCLK_F0 signal is outputted to the QCLK_F0D line, and the /QCLK_F0 signal is outputted to the /QCLK_F0D line.

The second latch/mux control signal generator 742-2 includes a NAND gate NANLMC1, an inverter INVLMC2_1, and an inverter INVLMC2_2. The NAND gate NANLMC1 receives an internal clock QCLK_F1 and the mode selection signal PDDR2. The inverter INVLMC2_1 inverts an output of the NAND gate NANLMC1, and the inverter INVLMC2_2 inverts an output of the inverter INVLMC2_1. An output of the inverter INVLMC2_1 is transferred to a QCLK_F1D line, and an output of the inverter INVLMC2_2 is transferred to a /QCLK_F1D line.

In the DDR1 mode operation, since the PDDR2 has a low level, an output of the NAND gate NANLMC1 has a high level regardless of the internal clock QCLK_F1. Thus, the internal clock QCLK_F1 is not transferred, a low level of signal is outputted to the QCLK_F1D line, and a high level of signal is outputted to the /QCLK_F1D line.

In addition, in the DDR2 mode operation, since the PDDR2 has a high level, an output of the NAND gate NANLMC1 corresponds to an inverted QCLK_F1 signal. Thus, in the DDR2 mode operation, the QCLK_F1 signal is outputted to the QCLK_F1D line, and the /QCLK_F1 signal is outputted to the /QCLK_F1D line.

The third latch/mux control signal generator 742-3 includes a NAND gate NANLMC2_1, a NAND gate NANLMC2_2, a NAND gate NANLMC2_3, and an inverter INVLMC3. The NAND gate NANLMC2_1 receives the internal clock QCLK_F0 and the mode selection signal PDDR2. The NAND gate NANLMC2_2 receives an inverted internal clock signal /QCLK_F0 and the mode selection signal PDDR1. The NAND gate NANLMC2_3 receives outputs of the NAND gates NANLMC2_1 and NANLMC2_1. The inverter INVLMC3 inverts an output of the NAND gate NANLMC2_3. An output of the NAND gate NANLMC2_3 is transferred to a QCLKQD line, and an output of the inverter INVLMC3 is transferred to a /QCLKQD line.

In the DDR1 mode operation, since the PDDR1 has a high level, an output of the NAND gate NANLMC2_1 has a high level regardless of the internal clock QCLK_F0. In addition, an output of the NAND gate NANLMC2_2 has an inverted CLKDQ (/CLKDQ) signal. The /CLKDQ signal is received from a /CLKDQD line. Thus, /CLKDQ signal is transferred to the QCLKQD line, and CLKDQ signal is transferred to the /QCLKQD line.

In addition, in the DDR2 mode operation, since the PDDR has a low level and the PDDR2 has a high level, an output of the NAND gate NANLMC2_2 has a high level regardless of the /CLKDQ signal. In addition, an output of the NAND gate NANLMC2_1 corresponds to an inverted QCLK_F0 signal. Thus, in the DDR2 mode operation, the QCLK_F0 signal is outputted to the QCLK_F0D line, and the /QCLK_F0 signal is outputted to the /QCLK_F0D line.

The fourth latch/mux control signal generator 742-4 includes an inverter INVLMC4_1, an inverter INVLMC4_2, and an inverter INVLMC4_3. The inverter INVLMC4_1 receives the internal clock QCLKDQ. The inverter INVLMC4_2 inverts an output of the inverter INVLMC4_1, and the inverter INVLMC4_3 inverts an output of the inverter INVLMC4_2. An output of the inverter INVLMC4_2 is transferred to a CLKDQD line, and an output of the inverter INVLMC4_3 is transferred to the /CLKDQD line.

Thus, the CLKDQ signal is outputted to the CLKDQD line, and the /CLKDQ signal is outputted to the /CLKDQD line regardless of the DDR1 or the DDR2 mode operation.

The output line selecting circuit 744 selects one of the FDO lines based on a DOUT_ACT signal that activates the output data latch/mux 730 to provide the data of the FD0 lines to the data transfer circuit 746. The output line selecting circuit 744 includes inverters INVSL1_1 and INVSL2_1 that invert the DOUT_ACT signal, inverters INVSL1_2 and INVSL2_2 that invert outputs of the inverters INVSL1_1 and INVSL2_1, a plurality of NAND gates NANLS1_1, NANLS1_2, NANLS2_1, NANLS2_1 that select one of the FDO lines based on the outputs of the inverters INVSL1_1 and INVSL2_2, and a plurality of NOR gates NORLS1_1, NORLS1_2, NORLS2_1 and NORLS2_2.

An output of the inverter INVSL1_1 is provided to the NOR gate NORLS1_1 to be used for selecting data of the FDO_F0 line, and is provided to the NOR gate NORLS1_2 to be used for selecting data of the FDO_F1 line.

In addition, the inverter INVSL1_2 inverts an output of the inverter INVSL1_1. An output of the inverter INVSL1_2 is provided to the NAND gate NANLS1_1 to be used for selecting data of the FDO_F0 line, and is provided to the NAND gate NANLS1_2 to be used for selecting data of the FDO_F1 line.

An output of the inverter INVSL2_1 is provided to the NOR gate NORLS2_1 to be used for selecting data of the FDO_S0 line, and is provided to the NOR gate NORLS2_2 to be used for selecting data of the FDO_S1 line.

In addition, the inverter INVSL2_2 inverts an output of the inverter INVSL2_1. An output of the inverter INVSL2_2 is provided to the NAND gate NANLS2_1 to be used for selecting data of the FDO_S0 line, and is provided to the NAND gate NANLS2_2 to be used for selecting data of the FDO_S1 line.

The data transfer circuit 746 includes a first data selecting transfer circuit 746-1, a second data selecting transfer circuit 746-2, a third data selecting transfer circuit 746-3, a fourth data selecting transfer circuit 746-4.

The first data selecting transfer circuit 746-1 includes a transmission gate TGDOS1_1, a latch LATDOS1_L, a transmission gate TGDOS1_2 and an inverter INVLSP. The transmission gate TGDOS1_1 transfers an output of the NAND gate NANLS1_1 based on data of the lines QCLKQD and /QCLKQD. The latch LATDOS1_1 receives an output of the transmission gate TGDOS1_1. The transmission gate TGDOS1_2 transfers an output of the latch LATDOS1_1 based on data of the lines CLKQD and /CLKQD. The inverter INVLSP inverts an output of the transmission gate TGDOS1_2 to output the inverted output of the transmission gate TGDOS1_2 to the DOP terminal. The first data selecting transfer circuit 746-1 further includes a transmission gate TGDOS1_3, a latch LATDOS1_2, an inverter INVLS1, a transmission gate TGDOS1_4. The transmission gate TGDOS1_3 transfers an output of the NAND gate NANLS1_2 based on data of the lines QCLK_F0D and /QCLK_F0D. The latch LATDOS1_2 receives an output of the transmission gate TGDOS1_3. The inverter INVLS1 inverts an output of the latch LATDOS1_2. The transmission gate TGDOS1_4 transfers an output of the latch LATDOS1_1 based on data of the lines QCLK_F1D and /QCLK_F1D.

In the DDR1 mode operation, the first data selecting transfer circuit 746-1 selects the data of the FDO_F0 line to delay the selected data for a predetermined time, and the delayed data are synchronized with the CLKDQ to be outputted to a terminal DOP. In the DDR2 mode operation, the first data selecting transfer circuit 746-1 delays the data of the lines FDO_F0 and FDO_F1, and the delayed data are synchronized with the CLKDQ to be outputted to the terminal DOP.

The second data selecting transfer circuit 746-2 includes a transmission gate TGDOS2_1, a latch LATDOS2_1, an inverter INVLS2_1, a transmission gate TGDOS2_2, a latch LATDOS2_2, and a transmission gate TGDOS2_3. The transmission gate TGDOS2_1 transfers an output of the NAND gate NANLS2_1 based on data of the lines QCLK_F0D and /QCLK_F0D. The latch LATDOS2_1 receives an output of the transmission gate TGDOS2_1. The inverter INVLS2_1 inverts an output of the latch LATDOS2_1. The transmission gate TGDOS2_2 transfers an output of the inverter INVLS2_1 based on data of the lines CLKQD and /CLKQD. The latch LATDOS2_2 receives an output of the transmission gate TGDOS2_2. The transmission gate TGDOS2_3 transfers an output of the latch LATDOS2_2 to the inverter INVLSP based on the data of the lines CLKQD and /CLKDQD. The second data selecting transfer circuit 746-2 further includes a transmission gate TGDOS2_4, a latch LATDOS2_3, an inverter INVLS2_2, and a transmission gate TGDOS2_5. The transmission gate TGDOS2_4 transfers an output of the NAND gate NANLS2_2 based on data of the lines QCLK_F0D and /QCLK_F0D. The latch LATDOS2_3 receives an output of the transmission gate TGDOS2_4. The inverter INVLS2_2 inverts an output of the latch LATDOS2_3. The transmission gate TGDOS2_5 transfers an output of the inverter INVLS2_2 to the latch LATDOS2_1 based on data of the lines QCLK_F1D and /QCLK_F1D.

In the DDR1 mode operation, the second data selecting transfer circuit 746-2 selects the data of the FDO_S0 line to delay the selected data for a predetermined time, and the delayed data are synchronized with the CLKDQ to be outputted to a terminal DOP. In the DDR2 mode operation, the second data selecting transfer circuit 746-2 delays the data of the lines FDO_S0 and FDO_S1, and the delayed data are synchronized with the CLKDQ to be outputted to the terminal DOP.

The third data selecting transfer circuit 746-3 includes a transmission gate TGDOS3_1, a latch LATDOS3_1, a transmission gate TGDOS3_2, an inverter INVLSN. The transmission gate TGDOS3_1 transfers an output of the NOR gate NANLS1_1 based on data of the lines QCLKQD and /QCLKQD. The latch LATDOS2_1 receives an output of the transmission gate TGDOS3_1. The transmission gate TGDOS3_2 transfers an output of the latch LATDOS3_1 based on the data of the lines CLKDQD and /CLKDQD. The inverter INVLSN inverts an output of the transmission gate TGDOS3_2 to output the inverted data to the terminal DON. The third data selecting transfer circuit 746-3 further includes a transmission gate TGDOS3_3, a latch LATDOS3_2, an inverter INVLS3, and a transmission gate TGDOS3_4. The transmission gate TGDOS3_3 transfers an output of the NOR gate NORLS1_2 based on data of the lines QCLK_F0D and /QCLK_F0D. The latch LATDOS3_2 receives an output of the transmission gate TGDOS3_3. The inverter INVLS3 inverts an output of the latch LATDOS3_2. The transmission gate TGDOS3_4 transfers an output of the inverter INVLS3 to the latch LATDOS3_1 based on data of the lines QCLK_F1D and /QCLK_F1D.

In the DDR1 mode operation, the third data selecting transfer circuit 746-3 selects the data of the FDO_F0 line to delay the selected data for a predetermined time, and the delayed data are synchronized with the CLKDQ to be outputted to a terminal DON. In the DDR2 mode operation, the third data selecting transfer circuit 746-3 delays the data of the lines FDO_F0 and FDO_F1, and the delayed data are synchronized with the CLKDQ to be outputted to the terminal DON.

The fourth data selecting transfer circuit 746-4 includes a transmission gate TGDOS4_1, a latch LATDOS4_1, an inverter INVLS4_1, a transmission gate TGDOS4_2, a latch LATDOS4_2, and a transmission gate TGDOS4_3. The transmission gate TGDOS4_1 transfers an output of the NOR gate NORLS2_1 based on data of the lines QCLK_F0D and /QCLK_F0D. The latch LATDOS4_1 receives an output of the transmission gate TGDOS4_1. The inverter INVLS4_1 inverts an output of the latch LATDOS4_1. The transmission gate TGDOS4_2 transfers an output of the inverter INVLS4_1 based on the data of the lines CLKQD and /CLKQD. The latch LATDOS4_2 receives an output of the transmission gate TGDOS4_2. The transmission gate TGDOS4_3 transfers an output of the latch LATDOS4_2 to the inverter INVLSN based on the data of the lines CLKDQD and /CLKDQD. The fourth data selecting transfer circuit 746-4 further includes a transmission gate TGDOS4_4, a latch LATDOS4_3, an inverter INVLS4_2, and a transmission gate TGDOS4_5. The transmission gate TGDOS4_4 transfers an output of the NOR gate NORLS2_2 based on data of the lines QCLK_F0D and /QCLK_F0D. The latch LATDOS4_3 receives an output of the transmission gate TGDOS4_4. The inverter INVLS4_2 inverts an output of the latch LATDOS4_3. The transmission gate TGDOS4_5 transfers an output of the inverter INVLS4_2 to the latch LATDOS4_1 based on data of the lines QCLK_F1D and /QCLK_F1D.

In the DDR1 mode operation, the fourth data selecting transfer circuit 746-4 selects the data of the FDO_S0 line to delay the selected data for a predetermined time, and the delayed data are synchronized with the CLKDQ to be outputted to the terminal DON. In the DDR2 mode operation, the fourth data selecting transfer circuit 746-4 delays the data of the lines FDO_S0 and FDO_S1, and the delayed data are synchronized with the CLKDQ to be outputted to the terminal DON.

Figure 14A:
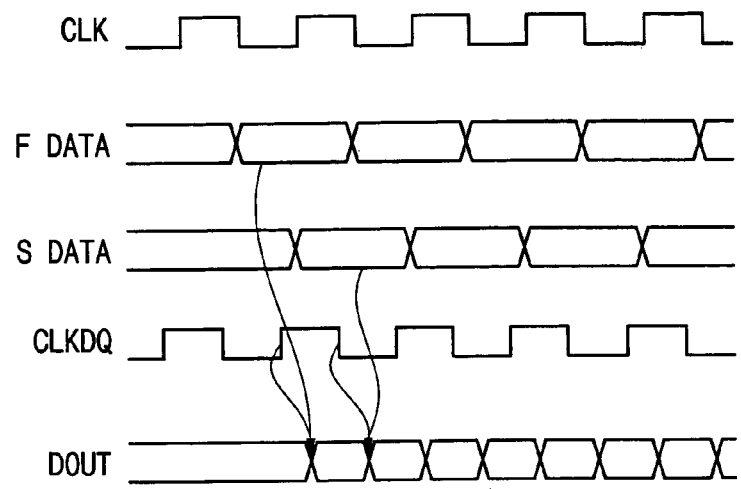
FIGS. 14A and 14B are timing diagrams showing operation of the output data latch/mux of FIG. 13 that selectively operates in DDR 1 mode or DDR2 mode according to some embodiments of the present invention.
Figure 14B:
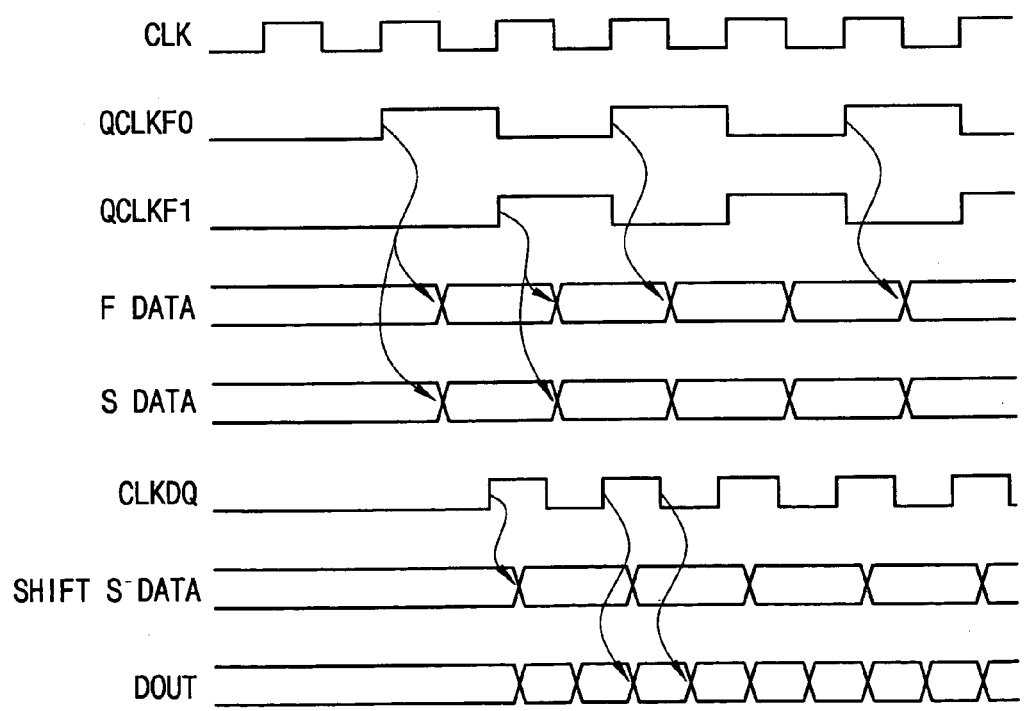

FIGS. 14A and 14B are timing diagrams showing operation of the output data latch/mux of FIG. 13 that selectively operates in DDR1 mode or DDR2 mode. FIG. 14A is a timing diagram showing the operation of the output data latch/mux of FIG. 13 during the DDR 1 mode. Referring to FIG. 14A, since the PDDR1 has a high level and the PDDR2 has a low level in the DDR1 mode operation, a high level signal is outputted to the output line QCLK_F0D of the first latch/mux control signal generator 742-1 regardless of the QCLK_F0, and a low level signal is outputted to the output line QCLK_F1D. In addition, a low level signal is outputted to the output line QCLK_F1D of the second latch/mux control signal generator 742-2, and a high level signal is outputted to the output line QCLK_F1D. The /CLKDQ signal is outputted to the output line QCLKQD of the third latch/mux control signal generator 742-3, and the CLKDQ signal is outputted to the output line /QCLKQD of the third latch/mux control signal generator 742-3. The CLKDQ signal is outputted to the output line CLKDQD of the fourth latch/mux control signal generator 742-4, and the /CLKDQ signal is outputted to the output line /CLKDQD of the fourth latch/mux control signal generator 742-4. The control signals /CLKDQ and CLKDQ control the operation of the transmission gates of the first, second, third and fourth data selecting transfer circuits 746-1, 746-2, 746-3 and 746-4.

The NAND gates NANLS1_1, NANLS1_2, NANLS2_1, NANLS2_2, and the NOR gates NORLS1_1, NORLS1_2, NORLS2_1, NORLS2_2 of the output line selecting circuit 744 select one of the FDO lines based on a DOUT_ACT signal that activates the output data latch/mux 730 to provide the data of the FD0 lines to the data transfer circuit 746.

When data synchronized with an external clock CLK are inputted to the FDO lines, the transmission gate of TGDOS1_1 of the first data selecting transfer circuit 746-1 provide the data of the FDO_F0 line to the latch LATDOS1_1 based on the CLKDQ and /CLKDQ signals so that the latch LATDOS1_1 holds the data of the FDO_F0 line. The data held by the latch LATDOS1_1 are referred to as 'F data'. Since the transmission gate TGDOS1_3 maintains a turn-on state during the DDR1 mode operation and the transmission gate TGDOS1_4 maintains a turn-off state during the DDR2 mode operation, the transfer of the data of FDO_F1 line are prevented.

The transmission gate of TGDOS2_1 of the second data selecting transfer circuit 746-2 maintains a turn-on state and the latch LATDOS2_1 holds the data of the FDO_S0 line. The data held by the latch LATDOS2_1 are referred to as 'S data'. The F data and the S data have a phase difference of ½ CLKDQ with respect to each other due to the sampling by the TGDOS1_1.

The F data are sampled at a rising edge of the CLKDQ signal by the transmission gate TGDOS1_2 to be outputted to the DOP terminal, and the S data are sampled at a rising edge of the CLKDQD signal by the transmission gate TGDOS2_2 and are sampled at a falling edge of the CLKDQ signal by the transmission gate TGDOS2_3 to be outputted to the DOP terminal. Since the F data are sampled at the rising edge of the CLKDQ signal by the transmission gate TGDOS1_2 to be outputted to the DOP terminal and the S data are sampled at the falling edge of the CLKDQ signal by the transmission gate TGDOS2_3 to be outputted to the DOP terminal, the F data and S data are consecutively outputted to the DOP terminal for a period of the clock CLKDQ.

The transmission gate of TGDOS3_1 of the third data selecting transfer circuit 746-3 provide the data of the FDO_F0 line to the latch LATDOS3_1 based on the CLKDQ and /CLKDQ signals so that the latch LATDOS3_1 holds the data of the FDO_F0 line. The data held by the latch LATDOS3_1 are referred to as 'F data'. Since the transmission gate TGDOS3_3 maintains a turn-on state during the DDR1 mode operation and the transmission gate TGDOS3_4 maintains a turn-off state during the DDR1 mode operation, the transfer of the data of FDO_F1 line are prevented.

The transmission gate of TGDOS4_1 of the fourth data selecting transfer circuit 746-4 maintains a turn-on state and the latch LATDOS4_1 holds the data of the FDO_S0 line. The data held by the latch LATDOS4_1 are referred to as 'S data'. The F data and the S data have a phase difference of ½ CLKDQ with respect to each other due to the sampling by the TGDOS4_1.

The F data are sampled at a rising edge of the CLKDQ signal by the transmission gate TGDOS4_2 to be outputted to the DON terminal, and the S data are sampled at a rising edge of the CLKDQD signal by the transmission gate TGDOS4_2 and are sampled at a falling edge of the CLKDQ signal by the transmission gate TGDOS4_3 to be outputted to the DON terminal. Since the F data are sampled at the rising edge of the CLKDQ signal by the transmission gate TGDOS4_2 to be outputted to the DON terminal and the S data are sampled at the falling edge of the CLKDQ signal by the transmission gate TGDOS4_3 to be outputted to the DON terminal, the F data and S data are consecutively outputted to the DON terminal for a period of the clock CLKDQ.

FIG. 14B is a timing diagram showing the operation of the output data latch/mux of FIG. 13 during the DDR2 mode. Referring to FIG. 14B, since the PDDR1 has a low level and the PDDR2 has a high level in the DDR2 mode operation, the QCLK_F0 signal is outputted to the output line QCLK_F0D of the first latch/mux control signal generator 742-1, and the /QCLK_F0 signal is outputted to the output line /QCLK_F0D. In addition, the QCLK_F1 signal is outputted to the output line QCLK_F1D of the second latch/mux control signal generator 742-2, and the /QCLK_F1 signal is outputted to the output line /QCLK_F1D. The QCLK_F0 signal is outputted to the output line QCLKQD of the third latch/mux control signal generator 742-3, and the /QCLK_F0 signal is outputted to the output line /QCLKQD of the third latch/mux control signal generator 742-3. The CLKDQ signal is outputted to the output line CLKDQD of the fourth latch/mux control signal generator 742-4, and the /CLKDQ signal is outputted to the output line /CLKDQD of the fourth latch/mux control signal generator 742-4. The control signals QCLK_F0, /QCLK_F0, QCLK_F1, /QCLK_F1, /CLKDQ and CLKDQ control the operation of the transmission gates of the first, second, third and fourth data selecting transfer circuits 746-1, 746-2, 746-3 and 746-4.

The NAND gates NANLS1_1, NANLS1_2, NANLS2_1, NANLS2_2, and the NOR gates NORLS1_, NORLS1_2, NORLS2_1, NORLS2_2 of the output line selecting circuit 744 select one of the FDO lines based on the DOUT_ACT signal that activates the output data latch/mux 730 to provide the data of the FD0 lines to the data transfer circuit 746.

When the data synchronized with the external clock CLK are inputted to the FDO lines, the transmission gate of TGDOS1_1 of the first data selecting transfer circuit 746-1 provide the data of the FDO_F0 line to the latch LATDOS1_1 based on the QCLK_F0 and /QCLK_F0 signals so that the latch LATDOS1_1 holds the data of the FDO_F0 line. The data held by the latch LATDOS1_1 are referred to as 'F data'. The transmission gate of TGDOS1_3 of the first data selecting transfer circuit 746-1 provide the data of the FDO_F1 line to the latch LATDOS1_2 based on the QCLK_F0 and /QCLK_F0 signals so that the latch LATDOS1_2 holds the data of the FDO_F1 line. The data of the latch LATDOS1_2 is inverted by the inverter INVLS1, then are sampled at a rising edge of the QCLK_F1 by the transmission gate TGDOS1_4, and then are held by the latch LATDOS1_1. Since the transmission gate TGDOS1_1 samples data at the rising edge of the QCLK_F0 signal and the transmission gate TGDOS1_4 samples data at the rising edge of the QCLKF1 signal, the latch LATDOS1_1 alternately holds the data of the line FDO_F0 and the FDO_F1 line for a period of the external clock CLK.

In addition, the transmission gate of TGDOS2_1 of the second data selecting transfer circuit 746-2 provides data of the FDO_S0 line to the latch LATDOS2_1 based on the QCLK_F0 and /QCLK_F0 signals so that the latch LATDOS2_1 holds the data of the FDO_S0 line. The data held by the latch LATDOS2_1 are referred to as 'S data'. At the same time, the transmission gate of TGDOS2_4 of the second data selecting transfer circuit 746-2 provides data of the FDO_S1 line to the latch LATDOS2_3 based on the QCLK_F0 and /QCLK_F0 signals so that the latch LATDOS2_3 holds the data of the FDO_S1 line. The data of the latch LATDOS2_3 are inverted by the inverter INVLS2_2, then are sampled at a rising edge of the QCLK_F1 by the transmission gate TGDOS2_5, and then are held by the latch LATDOS 2_1. Since the transmission gate TGDOS2_1 samples data at the rising edge of the QCLK_F0 signal and the transmission gate TGDOS2_5 samples data at the rising edge of the QCLKF1 signal, the latch LATDOS2_1 alternately holds the data of the line FDO_S0 and the FDO_S1 line for a period of the external clock CLK. The S data latched by the latch LATDOS2_1 are sampled by the rising edge of the clock CLKDQ by the transmission gate TGDOS2_2 to be held by the latch LATDOS2_2. Thus, the S data latched by the latch LATDOS2_2 is delayed compared with the data that are sampled by the rising edge of the clock CLKDQ by the transmission gate TGDOS2_2 to be held by the latch LATDOS2_1.

The F data latched by the latch LATDOS1_1 of the first data selecting transfer circuit 746-1 are sampled by the rising edge of the clock CLKDQ by the transmission gate TGDOS1_2 to be outputted to the terminal DOP terminal via the inverter INVLSP. The S data latched by the latch LATDOS2_2 of the second data selecting transfer circuit 746-2 are sampled by the falling edge of the clock CLKDQ by the transmission gate TGDOS2_3 to be outputted to the terminal DOP terminal via the inverter INVLSP.

The transmission gate of TGDOS3_1 of the third data selecting transfer circuit 746-3 provides data of the FDO_F0 line to the latch LATDOS3_1 based on the QCLK_F0 and /QCLK_F0 signals so that the latch LATDOS3_1 holds the data of the FDO_F0 line. The data held by the latch LATDOS3_1 are referred to as 'F data'. At the same time, the transmission gate of TGDOS3_3 of the third data selecting transfer circuit 746-3 provides data of the FDO_F1 line to the latch LATDOS3_2 based on the QCLK_F0 and /QCLK_F0 signals so that the latch LATDOS3_2 holds the data of the FDO_F1 line. The data of the latch LATDOS3_2 are inverted by the inverter INVLS3, then are sampled at a rising edge of the QCLK_F1 by the transmission gate TGDOS3_4, and then are held by the latch LATDOS 3_1. Since the transmission gate TGDOS3_1 samples data at the rising edge of the QCLK_F0 signal and the transmission gate TGDOS3_4 samples data at the rising edge of the QCLKF1 signal, the latch LATDOS3_1 alternately holds the data of the line FDO_F0 and the FDO_F1 line for a period of the external clock CLK.

In addition, the transmission gate of TGDOS4_1 of the fourth data selecting transfer circuit 746-4 provides data of the FDO_S0 line to the latch LATDOS4_1 based on the QCLK_F0 and /QCLK_F0 signals so that the latch LATDOS4_1 holds the data of the FDO_S0 line. The data held by the latch LATDOS4_1 are referred to as 'S data'. At the same time, the transmission gate of TGDOS4_4 of the fourth data selecting transfer circuit 746-4 provides data of the FDO_S1 line to the latch LATDOS4_3 based on the QCLK_F0 and /QCLK_F0 signals so that the latch LATDOS4_3 holds the data of the FDO_S1 line. The data of the latch LATDOS4_3 are inverted by the inverter INVLS4_2, then are sampled at a rising edge of the QCLK_F1 by the transmission gate TGDOS4_5, and then are held by the latch LATDOS 4_1. Since the transmission gate TGDOS4_1 samples data at the rising edge of the QCLK_F0 signal and the transmission gate TGDOS4_5 samples data at the rising edge of the QCLKF1 signal, the latch LATDOS4_1 alternately holds the data of the line FDO_S0 and the FDO_S1 line for a period of the external clock CLK. The S data latched by the latch LATDOS4_1 are sampled by the rising edge of the clock CLKDQ by the transmission gate TGDOS4_2 to be held by the latch LATDOS4_2. Thus, the S data latched by the latch LATDOS4_2 is delayed compared with the data that are sampled by the rising edge of the clock CLKDQ by the transmission gate TGDOS4_2 to be held by the latch LATDOS4_1.

The F data latched by the latch LATDOS3_1 of the third data selecting transfer circuit 746-3 are sampled by the rising edge of the clock CLKDQ by the transmission gate TGDOS3_2 to be outputted to the terminal DON terminal via the inverter INVLSN. The S data latched by the latch LATDOS4_2 of the fourth data selecting transfer circuit 746-4 are sampled by the falling edge of the clock CLKDQ by the transmission gate TGDOS4_3 to be outputted to the terminal DON terminal via the inverter INVLSN.

The data outputted to the DOP and DON terminals are inputted to an output buffer 750, and the output buffer 750 generates DOUT data based on the data of the DOP and DON terminals (refer to FIG. 1).

Figure 15A:
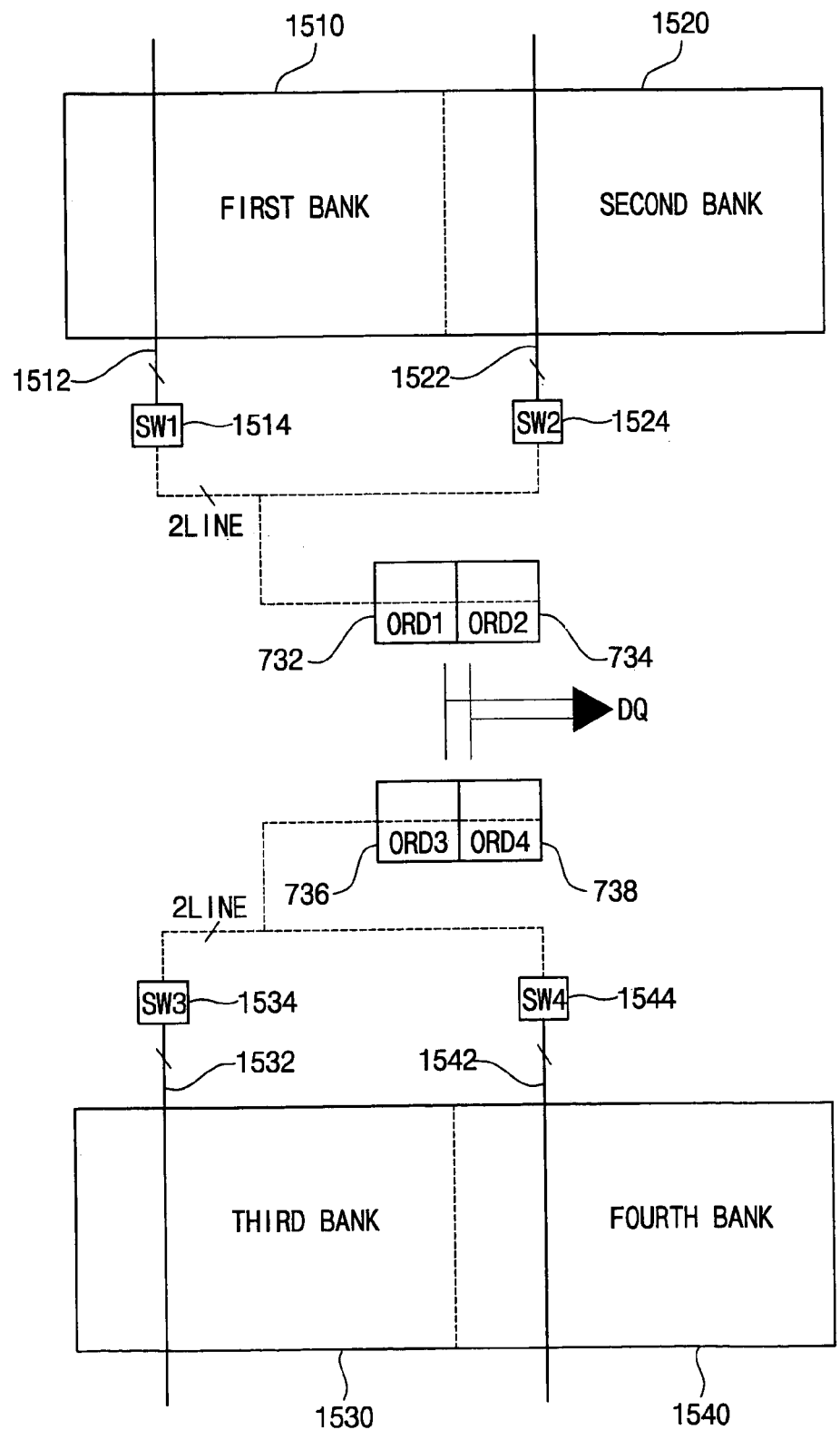
FIGS. 15A and 15B are block diagrams showing arrangement of the output ordering circuit of FIG. 1 according to some embodiments of the present invention.
Figure 15B:
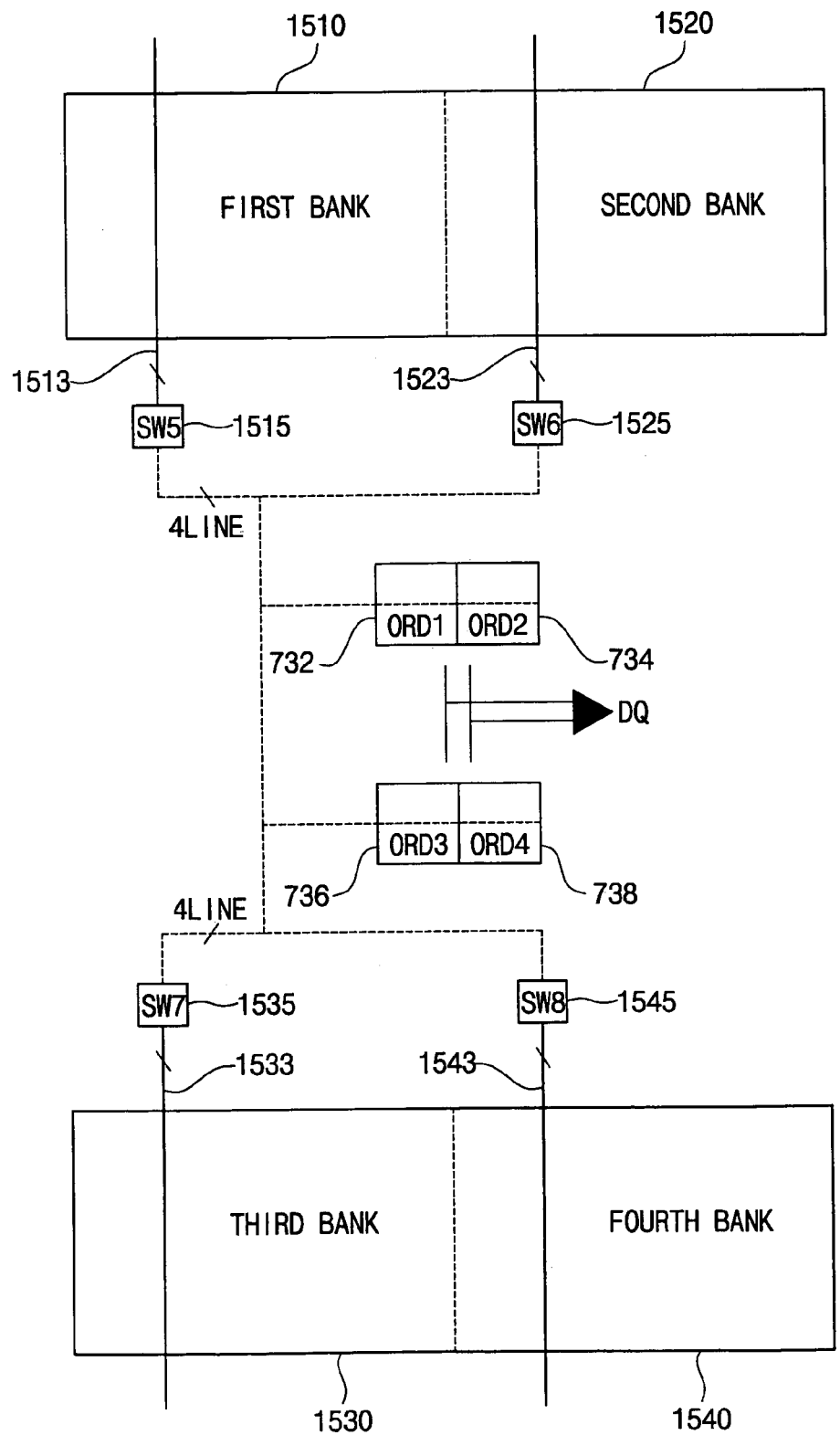

FIGS. 15A and 15B are block diagrams showing arrangement of the output ordering circuit of FIG. 1. FIG. 15A is a block diagram showing arrangement of the output ordering circuit 710 that operates in the DDR1-2 mode. Referring to FIG. 15A, the output ordering circuit 710 includes four banks 1510, 1520, 1530 and 1540, two global data lines coupled to each of the four banks 1510, 1520, 1530 and 1540, and four output ordering parts 732, 734, 736 and 738.

Two global data lines 1512 of the first bank 1510 are coupled to two output ordering parts 732 and 734 via a first switching device 1514, and two global data lines 1522 of the second bank 1520 are coupled to two output ordering parts 732 and 734 via a second switching device 1524.

Two global data lines 1532 of the third bank 1530 are coupled to two output ordering parts 736 and 738 via a third switching device 1534, and two global data lines 1542 of the fourth bank 1540 are coupled to two output ordering parts 736 and 738 via a fourth switching device 1544.

The four switching devices are controlled complementarily based on a bank selection signal. In other words, when the bank selection signal selects the first bank 1510, the global data lines 1512 of the first bank 1510 are coupled to the first and second output ordering parts 732 and 734 by the first switching device 1514, and the other switching devices 1524, 1534 and 1544 prevent the banks 1520, 1530 and 1540 from being coupled to the output ordering parts 732, 734, 736, and 738. Namely, when the first bank 1510 is selected, data of the global data lines of the other banks 1520, 1530 and 1540 are not inputted to the output ordering parts, data of the global data lines of the first bank 1510 are inputted to the first and second output ordering parts 732 and 734. The operation of the first and second output ordering parts 732 and 736 are already described in FIG. 12B.

When the bank selection signal selects the second bank 1520, the global data lines 1522 of the second bank 1520 are coupled to the first and second output ordering parts 732 and 734 by the second switching device 1524. When the bank selection signal selects the third bank 1530, the global data lines 1532 of the third bank 1530 are coupled to the third and fourth output ordering parts 736 and 738 by the third switching device 1534. When the bank selection signal selects the fourth bank 1540, the global data lines 1542 of the fourth bank 1540 are coupled to the third and fourth output ordering parts 736 and 738 by the fourth switching device 1544.

The data of the global data lines of the selected bank are inputted to two output ordering parts. For example, when the first bank 1510 is selected, the data of the global data lines GIO_E0 and GIO_O0 of the first bank 1510 are inputted to the first and second output ordering parts 732 and 734. When the data of the global data line GIO_E0 are inputted to the first output ordering part 732, the data of the global data line GIO_E0 are amplified by a data sense amplifier and are outputted to the output data latch/mux 730 based on the data of the FRT lines. In addition, when the data of the global data line GIO_O0 are inputted to the second output ordering part 734, the data of the global data line GIO_O0 are amplified by a data sense amplifier and are outputted to the output data latch/mux 730 based on the data of the FRT lines. While the data of the global data lines are amplified in case the first bank 1510 is selected, the other banks 1520, 1530 and 1540 are not selected.

Above operations may be applied to the second, third and fourth banks. Namely, when the third bank is selected, the data of the global data lines of the third bank are inputted to the third and fourth output ordering parts 736 and 738, an then are amplified by the data sense amplifier in each of the output ordering parts 736 and 738 to be outputted to the output data latch/mux 730.

In the DDR1-2 mode operation, two output ordering parts are activated for one unit data input/output (1DQ), and two bits prefetch method is used. Namely, two bits of data are processed during a clock cycle. In the multi-bits prefetch DRAM, a reduced number of output ordering parts may be used so as to perform the DDR1 mode operation when the global data lines of each of the banks are coupled to the output ordering parts. In addition, data loading phenomenon may occur according as the frequency of the memory clock increases and the length of the global data lines becomes longer. According to above exemplary embodiments of the present invention, the data loading phenomenon may be prevented using a plurality of switching devices.

FIG. 15B is a block diagram showing arrangement of the output ordering circuit 710 that operates in the DDR 2 mode.

Referring to FIG. 15B, the output ordering circuit 710 includes four banks 1510, 1520, 1530 and 1540, four global data lines coupled to each of the four banks 1510, 1520, 1530 and 1540, and four output ordering parts 732, 734, 736 and 738.

Four global data lines 1513 of the first bank 1510 are coupled to four output ordering parts 732, 734, 736 and 738 via a fifth switching device 1515, and four global data lines 1523 of the second bank 1520 are coupled to four output ordering parts 732, 734, 736 and 738 via a sixth switching device 1525.

Four global data lines 1533 of the third bank 1530 are coupled to four output ordering parts 732, 734, 736 and 738 via a seventh switching device 1535, and four global data lines 1543 of the fourth bank 1540 are coupled to four output ordering parts 732, 734, 736 and 738 via a eighth switching device 1545.

The four switching devices 1515, 1525, 1535 and 1545 are controlled complementarily based on the bank selection signal. In other words, when the bank selection signal selects the first bank 1510, the global data lines 1513 of the first bank 1510 are coupled to the output ordering parts 732, 734, 736 and 738 by the fifth switching device 1515, and the other switching devices 1525, 1535 and 1545 prevent the banks 1520, 1530 and 1540 from being coupled to the output ordering parts 732, 734, 736, and 738. Namely, when the first bank 1510 is selected, data of the global data lines of the other banks 1520, 1530 and 1540 are not inputted to the output ordering parts, the data of the global data lines of the first bank 1510 are inputted to the output ordering parts 732, 734, 736 and 738. The operation of the output ordering parts 732, 734, 736 and 738 are already described in FIG. 12B.

For example, when the first bank 1510 is selected, the data of the global data lines GIO_E0, GIO_O0, GIO_E1, GIO_O1 of the first bank 1510 are inputted to the output ordering parts 732, 734, 736 and 738. When the data of the global data line GIO_E0 are inputted to the first output ordering part 732, the data of the global data line GIO_E0 are amplified by a data sense amplifier and are outputted to the output data latch/mux 730 based on the data of the FRT lines. In addition, when the data of the global data line GIO_O0 are inputted to the second output ordering part 734, the data of the global data line GIO_O0 are amplified by a data sense amplifier and are outputted to the output data latch/mux 730 based on the data of the FRT lines. The data of the global data line GIO_E1 that are inputted to the third output ordering part 736 may be outputted to the output data latch/mux 730 according to above described way. The data of the global data line GIO_O1 that are inputted to the fourth output ordering part 738 may be outputted to the output data latch/mux 730 in the same way. While the data of the global data lines are amplified in case the first bank 1510 is selected, the other banks 1520, 1530 and 1540 are not selected.

Above operations may be applied to the second, third and fourth banks. Namely, when the third bank 1530 is selected, the data of the global data lines of the third bank 1530 are inputted to the output ordering parts 732, 734, 736 and 738, and then are amplified by the data sense amplifier in each of the output ordering parts 732, 734, 736 and 738 to be outputted to the output data latch/mux 730.

In the DDR 2 mode operation, two output ordering parts are activated for one unit data input/output (1DQ), and four bits prefetch method is used. Namely, four bits of data are processed during a clock cycle. In the multi-bits prefetch DRAM, a reduced number of output ordering parts may be used so as to perform the DDR2 mode operation when the global data lines of each of the banks are coupled to the output ordering parts. In addition, the data loading phenomenon may be prevented using a plurality of switching devices.

In addition, a memory device operating in the DDR1-2 mode or a memory device operating in the DDR2 mode may be selected during the process of manufacturing the memory device. In other words, a memory device may be manufactured so as to perform the DDR1-2 mode operation or the DDR2 mode operation.

The operation mode may be selected by the following methods. First, a metal wiring process may be employed so as to select the operation mode. In other words, during a metal wiring process in which metal film is deposited and the metal film is etched, two global data lines per one unit data input/output (1DQ) are formed in each of the banks, and the metal wiring process is performed such that two global data lines are inputted to two output ordering parts. Thus, the memory device may perform the DDR2 mode operation. Alternatively, during the metal wiring process, four global data lines per one unit data input/output (1DQ) are formed in each of the banks, and the metal wiring process is performed such that four global data lines are inputted to four output ordering parts. Thus, the memory device may perform the DDR2 mode operation.

Second, an MRS (Mode Register Set) signal may be used so as to select the operation mode. Particularly, a switching device may be disposed between the global data lines that are coupled to the first and second output ordering parts 1510 and 1520 and the global data lines that are coupled to the third and fourth output ordering parts 1530 and 1540 in FIG. 15A. The switching device is turned on or turned off in response to the MRS signal. Thus, when the switching device is turned on, the global data lines of the selected bank are coupled to four output ordering parts, and thus the memory device may perform the DDR2 mode operation. When the switching device is turned off, the global data lines of the selected bank are coupled to two output ordering parts, and thus the memory device may perform the DDR1-2 mode operation.

Third, a fuse may be used so as to select the operation mode. Particularly, a fuse may be disposed between the global data lines that are coupled to the first and second output ordering parts 1510 and 1520 and the global data lines that are coupled to the third and fourth output ordering parts 1530 and 1540 in FIG. 15A. When the fuse is cut by a laser beam, the memory device may perform the DDR1-2 ode operation. When the fuse is not cut by a laser beam, the global data lines of the selected bank are coupled to four output ordering parts, and thus the memory device may perform the DDR2 ode operation.

Figure 16A:
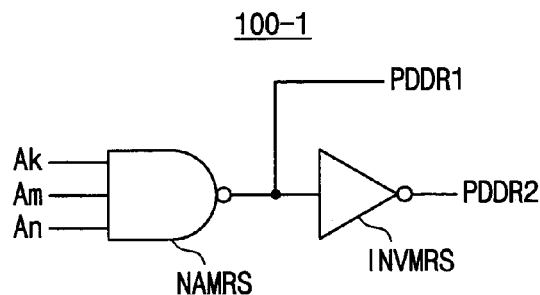
FIGS. 16A, 16B, 16C, 16D and 16E are circuit diagrams showing a mode selection circuit of FIG. 1 according to some embodiments of the present invention.

FIGS. 16A, 16B, 16C, 16D and 16E are circuit diagrams showing a mode selection circuit of FIG. 1. FIG. 16A is a circuit diagram showing a mode selection circuit 100 employing an MRS(Mode Register Set). Referring to FIG. 16A, an NAND gate NAMRS receives addresses $A_k$, $A_m$, and $A_n$ outputted from a mode register, and an output of the NAND gate is coupled to the mode selection signal PDDR1. An inverter INVMRS inverts the mode selection signal PDDR1 to output the mode selection signal PDDR2. The mode register stores the operation mode designated by a CPU. For example, the mode register stores the operation mode information such as predetermined CAS (Column Address Strobe) latency or burst length. The addresses of FIG. 16A may be predetermined depending upon the operation mode.

Figure 16B:
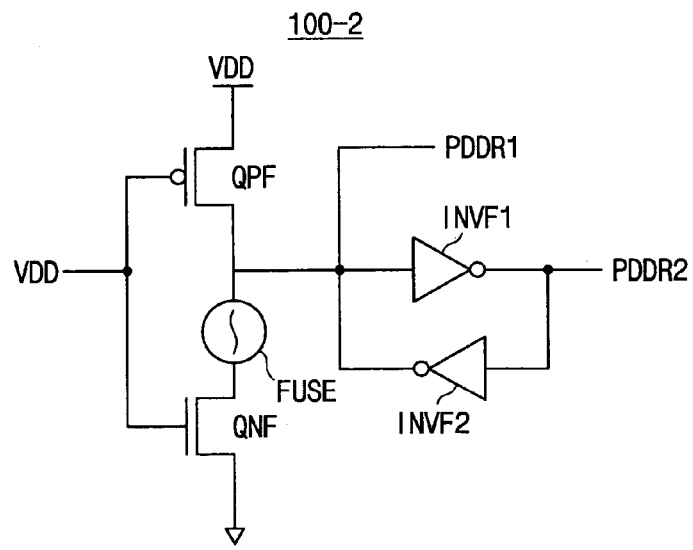

FIG. 16B is a circuit diagram showing a mode selection circuit 100 employing a fuse. Referring to FIG. 16B, the mode selecting circuit 100 includes transistors QPF, QNF, a fuse, inverters INVF1 and INVF2. When the fuse is not cut, the transistors QPF and QNF act like a CMOS transistor. Thus, the mode selection signal PDDR1 has a low level, the mode selection signal PDDR2 has a high level, and thus the SDRAM performs the DDR2 mode operation. When the fuse is cut, the transistors QPF and QNF are electrically insulated each other, the mode selection signal PDDR1 has a high level by the transistor QPF, the mode selection signal PDDR2 has a low level by the inverter INVF1, and thus the SDRAM performs the DDR1 mode operation.

Figure 16C:
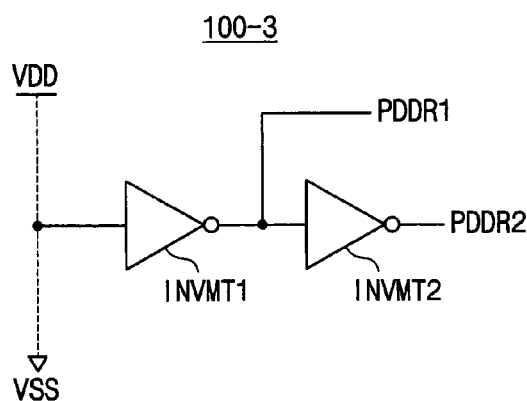

FIG. 16C is a circuit diagram showing a mode selection circuit 100 employing a metal wiring. Referring to FIG. 16C, the mode selecting circuit 100 includes inverters INVMT1 and INVMT2. The inverter INVMT1 may be selectively connected to VDD terminal or VSS terminal. The inverter INVMT2 inverts an output, i.e. the mode selection signal PDDR1, of the inverter INVMT1. During the metal wiring process, when the inverter iNVMT1 is connected to the VDD terminal, the PDDR1 has a low level, the PDDR2 has a high level, and thus the SDRAM performs the DDR1 mode operation.

Figure 16D:
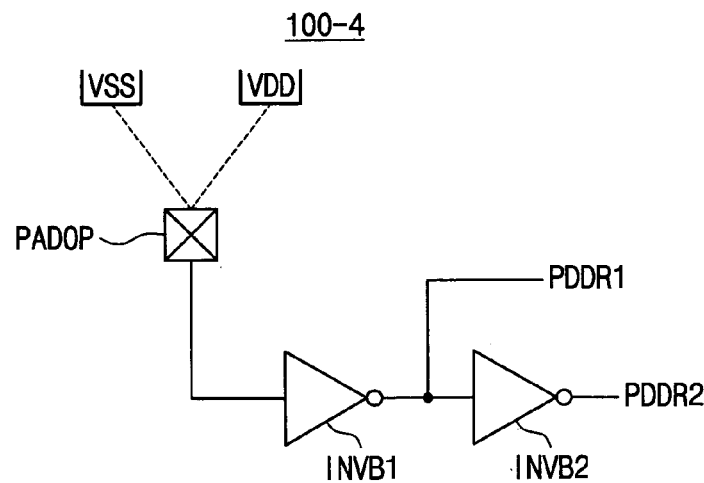

FIG. 16D is a circuit diagram showing a mode selection circuit 100 employing a metal bonding. Referring to FIG. 16D, the mode selecting circuit 100 includes a pad PADOP, and inverters INVB1 and INVB2. The pad PADOP is connected to a VSS pin or a VDD pin by the metal bonding. The inverter INVB1 inverts a signal of the pad PADOP, and the inverter INVB2 inverts an output of the inverter INVB1 to generate the mode selection signal PDDR2.

The metal bonding is one of a package processes that is applied to normal semiconductor devices after an EDS (Electric Die Sorting). In the metal bonding process, pads are connected to pins using metal line. In above embodiments of the present invention, the pads may be connected to pins using other bonding methods such as ball bonding.

Figure 16E:
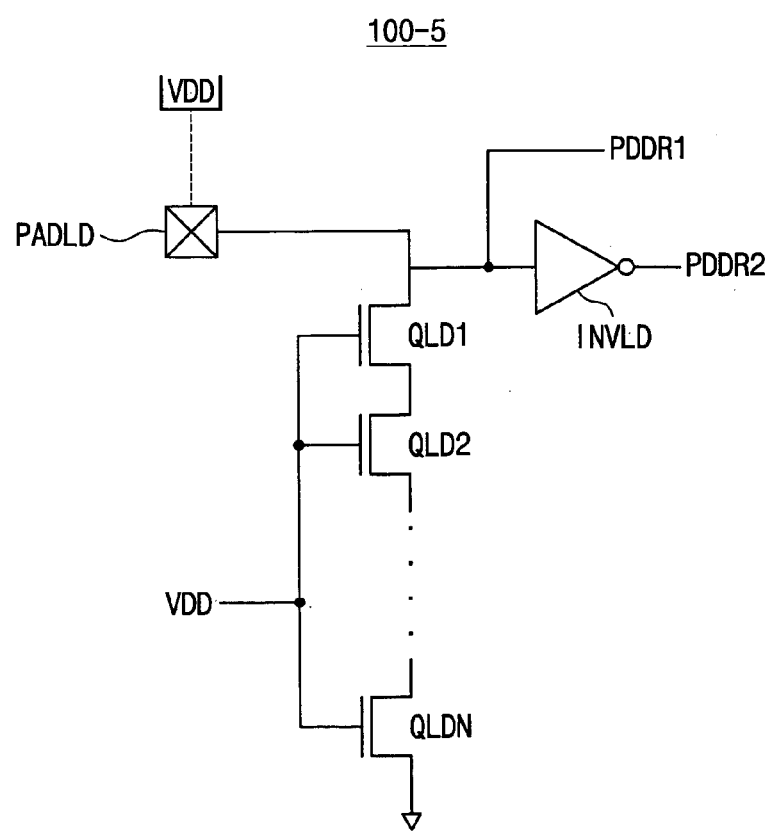

FIG. 16E is a circuit diagram showing a mode selection circuit 100 employing a metal bonding and a load. Referring to FIG. 16E, the mode selecting circuit 100 includes a pad PADLD, an inverter INVLD, and a plurality of serially connected transistors QLD1, QLD2, . . . , and QLDn. The transistors QLD1, QLD2, . . . , and QLDn.may act as the load. When the pad PADLD is connected to VDD pin, the PDDR1 has a high level and the PDDR2 has a low level. The transistors QLD1, QLD2, . . . , and QLDn are turned on in response to VDD that is coupled to gate electrodes of the transistors QLD1, QLD2, . . . , and QLDn. However, the PDDR1 has a high level due to source-drain resistances $R_{DS}$ of the transistors QLD1, QLD2, . . . , and QLDn. Thus, the SDRAM performs in the DDR1 mode operation. When there is no metal bonding between the pad PADLD and the VDD pin, the PDDR1 has a low level due to the turned-on transistors QLD1, QLD2, . . . , and QLDn.

Alternatively, the load may be employed using a transistor that has a large resistor $R_{DS}$. Namely, the load may be employed using a transistor of which channel width W between the source and drain of the transistor is longer than a channel length.

Figure 17:
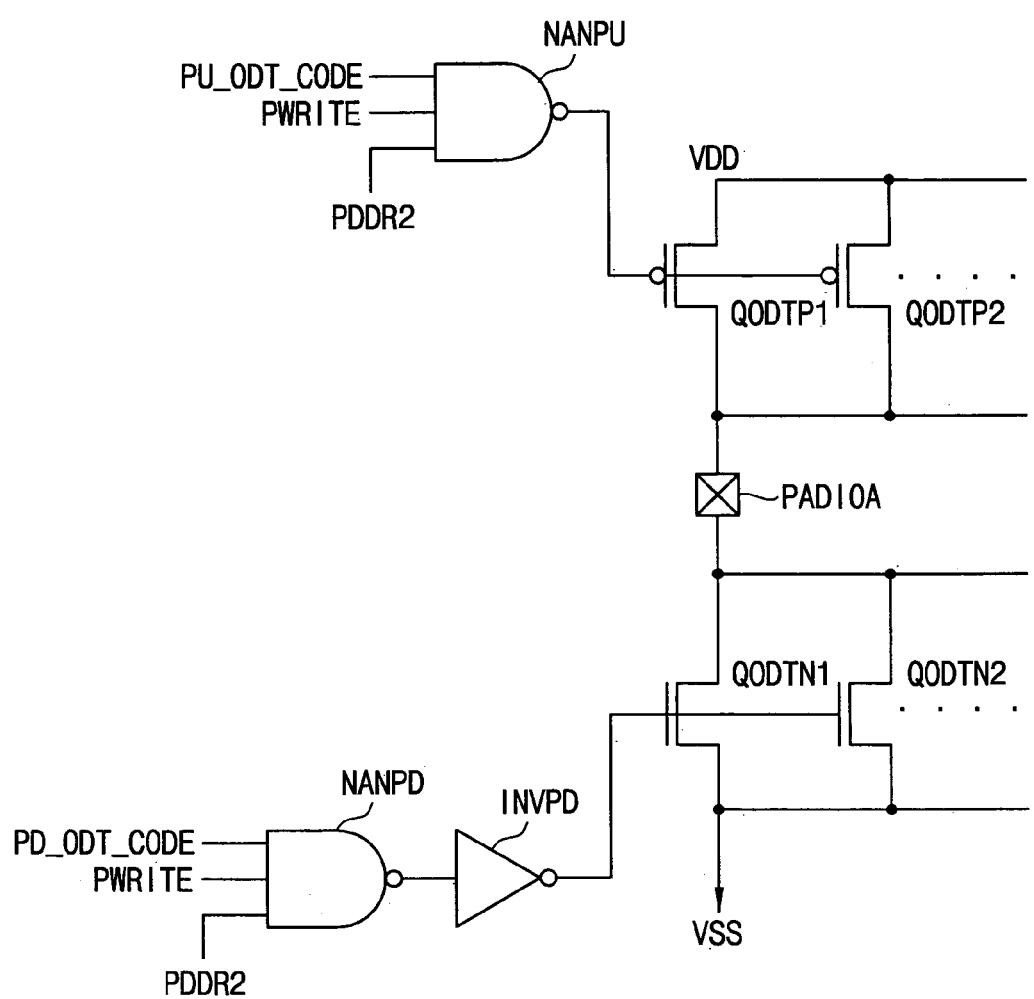
FIG. 17 is a circuit diagram showing an ODT (On Die Termination) circuit of FIG. 1 according to some embodiments of the present invention.

FIG. 17 is a circuit diagram showing an ODT (On Die Termination) circuit of FIG. 1. Referring to FIG. 17, the ODT circuit 793 includes a NAND gate NANPU, a plurality of pull-up transistors QODTP1, QODTP2, . . . , QODTPn, an NAND gate NANPD, an inverter INVPD and a plurality of pull-down transistors QODTN1, QODTN2, QODTN3, and QODTNn. The NAND gate NANPU receives a pull-up ODT code PU_ODT_CODE, an internal write command PWRITE and a mode selection signal PDDR2. The pull-up transistors QODTP1, QODTP2, . . . , QODTPn are commonly coupled between VDD and the pad PADIOA. The NAND gate NANPD receives a pull-down ODT code PD_ODT_CODE, the internal write command PWRITE and the mode selection signal PDDR2. The inverter INVPD inverts an output of the NAND gate NANPD. The pull-down transistors QODTN1, QODTN2,. QODTN3, and QODTNn are commonly coupled between VSS and the pad PADIOA.

In an electronic system employing the SDRAM, the connection line between the SDRAM and other electronic devices may not simply be a conductive line. In a high speed data transmission, a wavelength of a signal, which is transmitted between the SDRAM and other electronic devices, and a length of the connection line needs to be considered since a rising time and a falling time of the signal is very short. Thus, the connection line between the SDRAM and other electronic devices needs to be regarded as a transmission gate. An impedance matching circuit is included in a data input/output pad, an address pad to which address is inputted, a pad to which commands are inputted in order to acquire an impedance matching between the SDRAM and other electronic devices such that reflected waves at the transmission line may be reduced.

In above exemplary embodiments of the present invention, an impedance value of a pad varies depending upon a signal that is inputted to or outputted from the pad. Particularly, when the internal write command PWRITE is activated, the PDDR2 has a high level so that the SDRAM performs the DDR2 mode operation, the pull-up transistors QODTP1, QODTP2, . . . , QODTPn are turned on in response to the ODT code PU_ODT_CODE, and the pull-down transistors QODTN1, QODTN2,. QODTN3, and QODTNn are also turned on in response to the ODT code PD_ODT_CODE, so that the pad PADIDA has an impedance due to the turn-on of the pull-up and pull-down transistors.

In addition, the impedance of the pad PADIDA may be varied depending upon the property of the pad PADIDA. For example, a number of the pull-up transistors and a number of the pull-down transistors may be varied depending upon whether the pad PADIDA receives data, address or command. In the DDR1 mode operation in which the PDDR2 has a low level, the pull-up and pull-down transistors are turned off, so that the ODT circuit 770 does not operate.

According to above described exemplary embodiments of the present invention, the memory device has memory functional blocks that perform both the DDR1 and DDR2 operations, so that one of the DDR1 and DDR2 operations may be selectively activated according to the demands of the memory device's users. In addition, since the DDR1 memory device and DDR2 memory device may be manufactured by the same semiconductor process, the semiconductor processing may be effectively controlled, and the yield of the memory device may be enhanced. While the exemplary embodiments of the present invention and their advantages have been described in detail, it should be understood that various changes, substitutions and alterations may be made herein without departing from the scope of the invention.

What is claimed is:

1. A synchronous dynamic random access memory device for both DDR1 and DDR2 mode operations, comprising:

a mode selection circuit configured to generate a first mode selection signal that activates a DDR1 mode operation and a second mode selection signal that activates a DDR2 mode operation;

a row decoder configure to decode a row address;

a column decoder configured to select two global data lines for one unit data input/output in response to the first mode selection signal, and configured to select four global data lines for said one unit data input/output in response to the second mode selection signal;

a core section configured to receive data from the two global data lines arid output the data to the two global data lines in response to the first mode selection signal, and configured to receive the data from the four global data lines and output the data to the four global data lines in response to the second mode selection signal; and an input and output control circuit configured to prefetch two bits data in response to the first mode selection signal to provide the two bits data to the core section, configure to output the two bits data received from the core section in response to the first mode selection signal, configured to prefetch four bits data in response to the second mode selection signal to provide the four bits data to the core section, and configured to output the four bits data received from the core section in response to the second mode selection signal.

2. A dual data rate dynamic random access memory (DDR DRAM) device comprising:

a mode selection circuit configured to enable a Dual Data Rate (DDR) 1 mode of operation for the DDR DRAM or a DDR2 mode of operation for the DDR DRAM.

3. A device according to claim 2 further comprising:

a column decoder configured to select two global data lines in the DDR1 mode responsive to a column address applied thereto and configured to select four global data lines in the DDR2 mode responsive to the column address applied thereto.

4. A device according to claim 2 further comprising:

a core section configured to send/receive data to/from the two selected global data lines in DDR1 mode and configured to send/receive data to/from the four selected global data lines in DDR2 mode.

5. A device according to claim 3 wherein the column decoder is configured to disregard one column address bit to enable two column select signals therefrom in DDR1 mode and is configured to disregard two column address bits to enable four column select signals therefrom in DDR2 mode.

6. A device according to claim 2 further comprising:

an input latch configured to prefetch two data bits in DDR1 mode and configured to prefetch four data bits in DDR2 mode.

7. A device according to claim 6 wherein the input latch comprises:

first and second serially coupled latches, wherein, if the DDR2 mode is active, the input latch receives first, second, third and fourth data, the third and fourth data are latched by the first latch to be provided to an output of the input latch and the first and second data are by first and second latch to be provided to the output of the input Latch, and wherein, if the DDR1 mode is active, the input latch receives fifth and sixth data, the fifth and sixth data are latched by the first latch to be provided to the output of the input latch.

8. A device according to claim 7 wherein the input latch is configured to provide the prefetched two bits to the output of the latch on the same clock edge in DDR1 mode and configured to provide the prefetched four bits to the output of the latch on the same clock edge in DDR2 mode.

9. A device according to claim 3 further comprising:

an input ordering circuit configured to order prefetched two or four bits on outputs of the input ordering circuit based on values of the column address and the DDR1 and DDR2 mode.

10. A device according to claim 9 wherein the input ordering circuit is configured to reverse the order of the prefetched two bits in DDR1 mode based on the column address; and wherein the input ordering circuit is configured to reverse the order of the prefetched four bits in DDR2 mode based on the column address.

11. A device according to claim 10 further comprising:

a connector circuit configured to couple ordered data provided from the input ordering circuit to global data I/O lines based on the DDR mode.

12. A device according to claim 3 further comprising:

an output ordering circuit configured to order prefetched two or four bits output from the core section based on values of the column address and the DDR1 and DDR2 mode.

13. A device according to claim 12 wherein the output ordering circuit is configured to reverse the order of the prefetched two bits in DDR1 mode based on the column address; and wherein the input ordering circuit is configured to reverse the order of the prefetched four bits in DDR2 mode based on the column address.

14. A device according to claim 2 wherein the DDR1 mode or the DDR2 mode is selected via metal wiring, an MRS mode bit, and/or a fuse.

15. A method of operating a dual mode DDR DRAM device comprising:

operating in a DDR1 mode responsive to a first mode selection signal; and operating in a DDR2 mode of operation responsive to a second mode selection signal.

* * * * *